United States Patent
Kao et al.

(10) Patent No.: US 11,908,878 B2
(45) Date of Patent: Feb. 20, 2024

(54) IMAGE SENSOR AND MANUFACTURING METHOD THEREOF

(71) Applicant: Taiwan Semiconductor Manufacturing Co., Ltd., Hsinchu (TW)

(72) Inventors: Min-Feng Kao, Chiayi (TW);
Dun-Nian Yaung, Taipei (TW);
Jen-Cheng Liu, Hsin-Chu (TW);
Wen-Chang Kuo, Tainan (TW);
Sheng-Chau Chen, Tainan (TW);
Feng-Chi Hung, Chu-Bei (TW);
Sheng-Chan Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 247 days.

(21) Appl. No.: 17/327,996

(22) Filed: May 24, 2021

(65) Prior Publication Data
US 2022/0231058 A1   Jul. 21, 2022

Related U.S. Application Data

(60) Provisional application No. 63/137,871, filed on Jan. 15, 2021.

(51) Int. Cl.
H01L 27/146 (2006.01)

(52) U.S. Cl.
CPC ...... *H01L 27/1463* (2013.01); *H01L 27/1464* (2013.01); *H01L 27/14623* (2013.01); *H01L 27/14636* (2013.01); *H01L 27/14685* (2013.01)

(58) Field of Classification Search
CPC .......... H01L 27/1463; H01L 27/14623; H01L 27/14636
See application file for complete search history.

(56) References Cited

U.S. PATENT DOCUMENTS

| | | | |
|---|---|---|---|
| 9,595,557 B2* | 3/2017 | Yanagita | H01L 27/14612 |
| 9,673,235 B2* | 6/2017 | Yanagita | H01L 27/14614 |
| 9,923,010 B2* | 3/2018 | Yanagita | H01L 27/1462 |
| 11,152,415 B2* | 10/2021 | Lim | H01L 27/1464 |
| 11,552,119 B2* | 1/2023 | Kobayashi | H01L 27/14623 |
| 11,587,968 B2* | 2/2023 | Ohura | H01L 27/14647 |
| 2014/0054662 A1* | 2/2014 | Yanagita | H01L 27/1462 438/73 |

(Continued)

FOREIGN PATENT DOCUMENTS

| | | |
|---|---|---|
| JP | 2017120851 A | 7/2017 |
| KR | 20200045327 A | 5/2020 |

(Continued)

*Primary Examiner* — Mounir S Amer
*Assistant Examiner* — Alexander Belousov
(74) *Attorney, Agent, or Firm* — Eschweiler & Potashnik, LLC

(57) ABSTRACT

An image sensor includes a pixel and an isolation structure. The pixel includes a photosensitive region and a circuitry region next to the photosensitive region. The isolation structure is located over the pixel, where the isolation structure includes a conductive grid and a dielectric structure covering a sidewall of the conductive grid, and the isolation structure includes an opening or recess overlapping the photosensitive region. The isolation structure surrounds a peripheral region of the photosensitive region.

20 Claims, 80 Drawing Sheets

(56) References Cited

U.S. PATENT DOCUMENTS

| | | | |
|---|---|---|---|
| 2015/0255495 A1* | 9/2015 | Park | H01L 27/14621 |
| | | | 257/446 |
| 2016/0211288 A1* | 7/2016 | Yanagita | H01L 27/14643 |
| 2016/0307952 A1 | 10/2016 | Huang et al. | |
| 2016/0336372 A1* | 11/2016 | Yanagita | H01L 27/1464 |
| 2017/0133414 A1* | 5/2017 | Chiang | H01L 27/14689 |
| 2017/0170217 A1* | 6/2017 | Yanagita | H01L 27/146 |
| 2017/0170229 A1* | 6/2017 | Oh | H01L 27/14621 |
| 2017/0271384 A1 | 9/2017 | Zheng et al. | |
| 2017/0271385 A1* | 9/2017 | Yanagita | H01L 27/1463 |
| 2017/0301709 A1* | 10/2017 | Chiang | H01L 27/14621 |
| 2018/0151615 A1 | 5/2018 | Wen et al. | |
| 2018/0366508 A1 | 12/2018 | Goto et al. | |
| 2019/0027520 A1* | 1/2019 | Yanagita | H01L 27/14643 |
| 2019/0131327 A1 | 5/2019 | Chou et al. | |
| 2019/0172868 A1 | 6/2019 | Chen et al. | |
| 2019/0206911 A1* | 7/2019 | Yanagita | H01L 27/1464 |
| 2020/0111822 A1* | 4/2020 | Chou | H01L 27/1463 |
| 2020/0127025 A1* | 4/2020 | Lim | H01L 27/1464 |
| 2022/0231058 A1* | 7/2022 | Kao | H01L 27/14685 |
| 2022/0320163 A1* | 10/2022 | Mun | H01L 27/14623 |
| 2022/0344383 A1* | 10/2022 | Kao | H01L 27/14621 |

FOREIGN PATENT DOCUMENTS

| | | |
|---|---|---|
| TW | 201314872 A | 4/2013 |
| TW | 202017161 A | 10/2018 |

\* cited by examiner

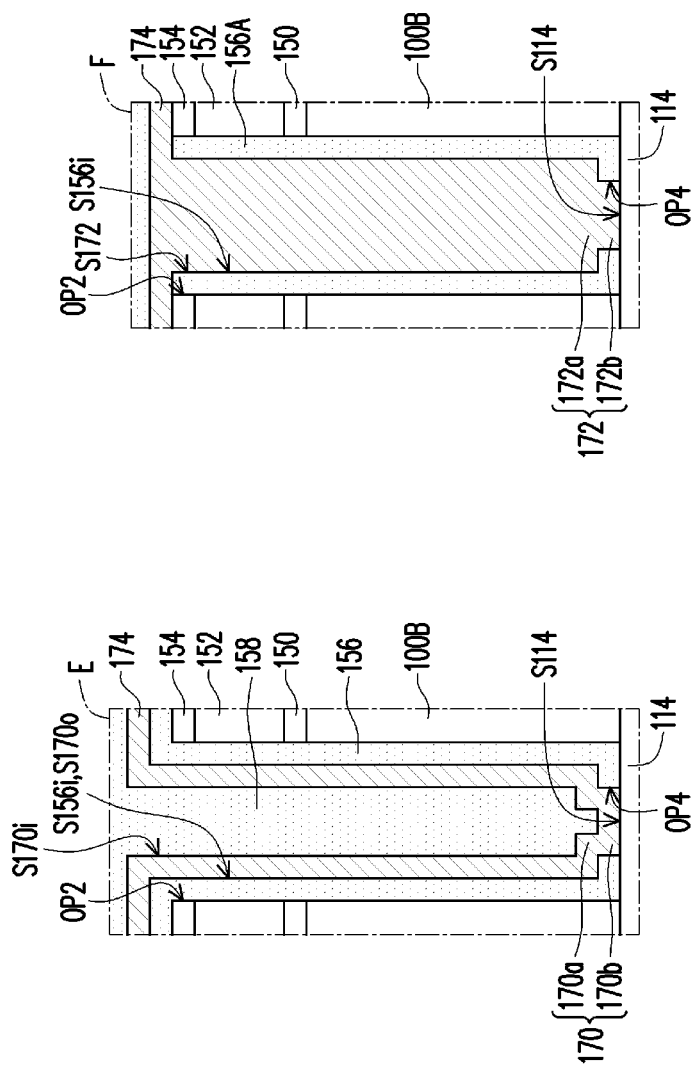

IMAGE SENSOR AND MANUFACTURING METHOD THEREOF

REFERENCE TO RELATED APPLICATION

This application claims the benefit of U.S. Provisional Application No. 63/137,871, filed on Jan. 15, 2021, the contents of which are hereby incorporated by reference in their entirety.

BACKGROUND

Semiconductor image sensors are used to sense radiation such as light. Complementary metal-oxide-semiconductor (CMOS) image sensors and charge-coupled device (CCD) sensors are widely used in various applications such as digital still camera or mobile phone camera applications. These sensors utilize an array of pixels in a substrate, including photodiodes and transistors that can absorb radiation projected toward the substrate and convert the sensed radiation into electrical signals.

As technologies evolve, CMOS image sensors (CIS) are gaining in popularity over CCDs due to certain advantages inherent in the CMOS image sensors. In particular, a CMOS image sensor may have a high image acquisition rate, a lower operating voltage, lower power consumption and higher noise immunity, and allow random access. In addition, CMOS image sensors may be fabricated on the same high volume wafer processing lines as logic and memory devices.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 59 through FIG. 62 are schematic enlarged and schematic vertical (or cross-sectional) views showing various embodiments of a bonding between a conductive structure and a doping region of an image sensor in dashed areas C, D, E and F outlined in FIG. 49, FIG. 51, FIG. 52, FIG. 54 and FIG. 55 through FIG. 58.

DETAILED DESCRIPTION

Figure 1:
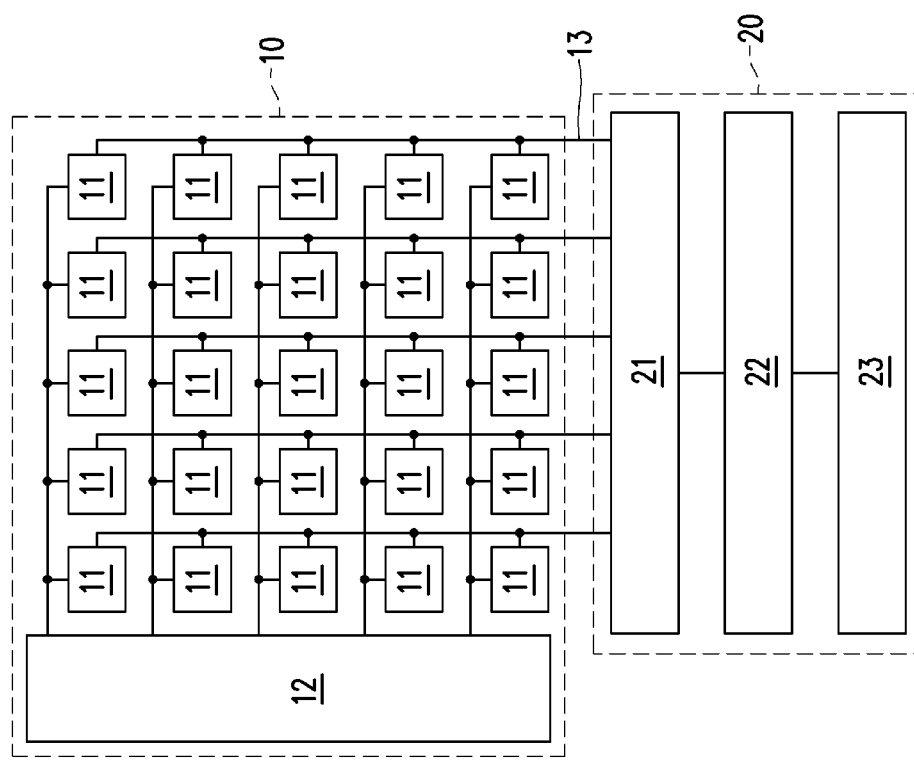
FIG. 1 is a block diagram of a semiconductor structure having an image sensor containing columns of pixels connected with a circuitry, in a (semiconductor) image sensor die in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

A CMOS image sensor includes an array of light sensitive picture elements (pixels), each of which may include transistors, capacitors, and a photo-sensitive element. A CMOS image sensor utilizes light-sensitive CMOS circuitry to convert photons into electrons. The light-sensitive CMOS circuitry includes a photodiode formed in a substrate. As the photodiode is exposed to light, electrical charges are induced in the photodiode. Each pixel may generate electrons according to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene. As a result, a CMOS image sensor device (e.g. a semiconductor chip or die equipped with CMOS image sensor(s)) may comprise both image sensors and any necessary logic, such as amplifiers, A/D converters, or the like.

A CMOS image sensor may include a plurality of additional layers, such as dielectric layers and interconnect metal layers, formed on top of the substrate, wherein the interconnect metal layers are used to couple the photodiode with peripheral circuitry. The side having additional layers of the CMOS image sensor is commonly referred to as a front side, while the side having the substrate is referred to as a backside. Depending on the light path difference, CMOS image sensors can be further divided into two major categories, namely front side illuminated (FSI) image sensors and backside illuminated (BSI) image sensors.

In view of the foregoing, an image sensor and a method of manufacturing thereof are provided in accordance with various exemplary embodiments. Before addressing the illustrated embodiments specifically, certain advantageous features and aspects of the present disclosed embodiments will be addressed generally. The image sensor is equipped with an isolation structure having a conductive grid which may be adopted for boosting quantum efficiency (QE) and suppressing cross-talk (Xtalk) for improving the performance of the image sensor. Described below is an image sensor with an integrated circuit having a semiconductor substrate along with an interconnect overlying thereto, photodiodes located therein and an isolation structure having a conductive grid overlying the substrate and surrounding the photodiodes, where the conductive grid and the interconnect are disposed on two opposite sides of the semiconductor substrate and are electrically connected to each other. Besides, color filters and micro lenses are further disposed over the conductive grid and overlapped with the photodiodes. The conductive grid is capable of reflecting light to ensure the incident light entered into one pixel being free from other pixels adjacent thereto, so that isolations among the adjacent pixels is provided, which suppresses potential cross-talks therebetween. In addition, due to the conductive grid has high reflective index, an amount of the light that falls on the pixels when the light is incident on the pixel may be enhanced by reflecting the light (which strikes the conductive grid) back to the pixel, which increases the quantum efficiency of the pixels. With such conductive grid, the performance of the image sensor is improved. The intermediate stages of forming the image sensor with the conductive grid are illustrated in accordance with some embodiments. Some variations of some embodiments are discussed. Throughout the various views and illustrative embodiments, like reference numbers are used to designate like elements.

FIG. 1 is a block diagram of a semiconductor structure (such as a (semiconductor) image sensor device, die, or chip) having an image sensor containing columns of pixels connected with a circuitry, in a (semiconductor) image sensor die in accordance with some embodiments of the disclosure.

Referring to FIG. 1, in some embodiments, an exemplary function of an image sensor die including an image sensor 10 and an integrated circuit 20 is illustrated. In some embodiments, the image sensor 10 includes a grid or array of pixels 11. The pixels 11 may be arranged in a matrix form, such as the N×N or N×M arrays (N, M>0, N may or may not be equal to M). The size of the array for the pixels 11 can be designated and selected based on the demand, and is not limited to the disclosure. For example, the pixels 11 are arranged into a 5×5 array depicted in FIG. 1. The pixels 11 may be referred to as sensor elements, in the disclosure. Each column of the pixels 11 in the image sensor 10 may share an interconnection or an inter metal line 13 electrically connected to the integrated circuit 20, so to transfer pixel outputs to the integrated circuit 20. For example, the image sensor 10 generates a voltage signal in each pixel 11, which is further transformed into a digital signal to be processed by the integrated circuit 20.

In some embodiments, the integrated circuit 20 includes a readout circuitry component 21, a signal processing circuitry component 22, and an output circuitry component 23. The signals out from the array of the pixels 11 will be read by the readout circuitry component 21. The readout signals from the readout circuitry component 21 will be processed by a signal processing circuitry component 22. The processed signals from the signal processing circuitry component 22 generate the output for the image sensor application, done by the output circuitry component 23. Additional or less circuitry components may be included in the integrated circuit 20 based on the demand and layout design, the disclosure is not limited thereto.

In some embodiment, other circuits such as the access circuitry 12 is formed on the image sensor 10 as well to enable the pixels during the operation. For example, the access circuitry 12 includes a rolling shutter circuitry or a global shutter circuitry. In alternative embodiments, the access circuitry 12 may be integrated into each of the pixels 11.

Figure 2:
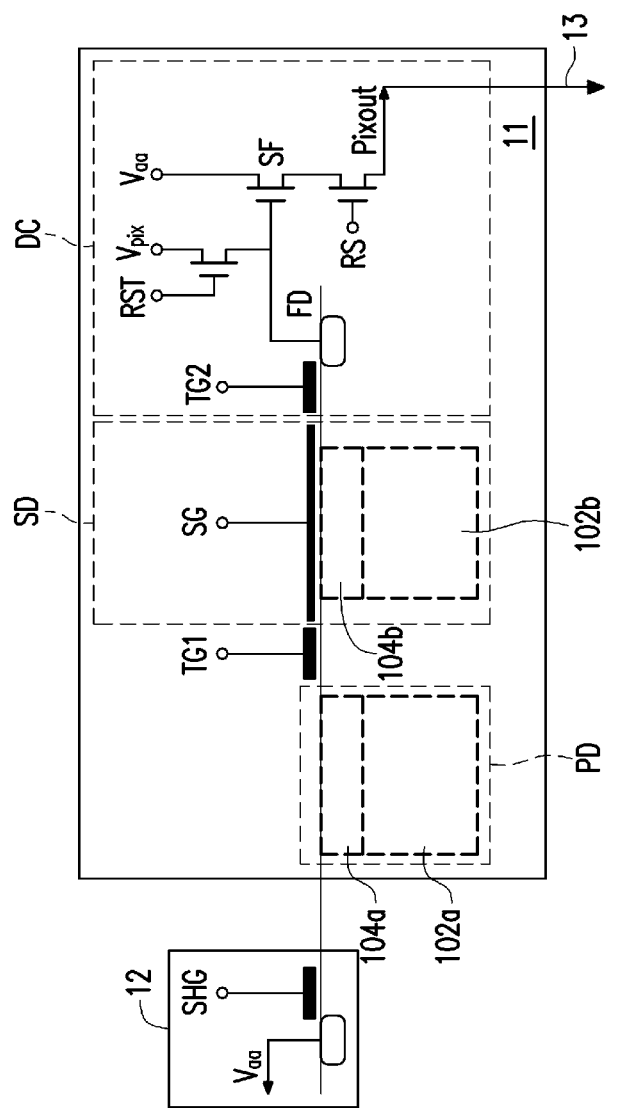
FIG. 2 through FIG. 3 are schematic diagrams illustrating an image sensor containing columns of pixels connected with a circuitry, in a (semiconductor) image sensor die in accordance with some embodiments of the disclosure.
Figure 3:
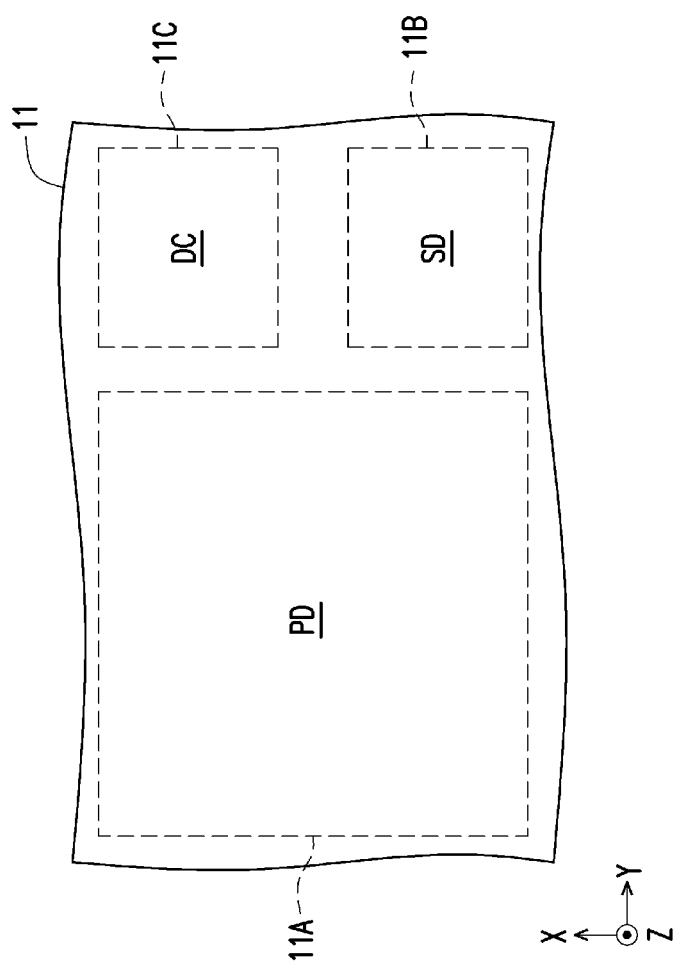

FIG. 2 through FIG. 3 are schematic views illustrating an image sensor containing columns of pixels connected with a circuitry, in a (semiconductor) image sensor die in accordance with some embodiments of the disclosure. In FIG. 2 and FIG. 3, for simplicity, only one of the pixels 11 included in the image sensor 10 is illustrated for representation. Referring to FIG. 2, in some embodiments, the pixel 11 includes a photosensitive device PD, a first transfer gate transistor TG1, a storage device SD and a driving circuit DC, and is electrically connected to a shutter gate transistor SHG included in the access circuitry 12.

In some embodiments, the photosensitive device PD is constituted by a P-N junction formed by a first doped region 102a and a second doped region 104a. In some embodiments, the first doped region 102a is doped with n-type dopants while the second doped region 104a is doped with p-type dopants. However, it construes no limitation in the disclosure. Depending on the conductivity type of a semiconductor substrate for constructing the image sensor 10, the dopants in the first doped region 102a and the second doped region 104a may be interchanged. Upon irradiation of an incident light, the photosensitive device PD is able to accumulate image charges in response to the incident light. For example, the photosensitive device PD includes a photodiode. It should be noted that photodiode merely serves as an exemplary illustration of the photosensitive device PD, and the disclosure is not limited thereto. Other suitable photosensitive devices may be adapted as long as such device is able to accumulate image charges upon irradiation of incident light. For example, the photosensitive device PD may include a memory device with a charge storage.

In some embodiments, the shutter gate transistor SHG is coupled to the photosensitive device PD. For example, a source or a drain of the shutter gate transistor SHG is coupled to voltage $V_{aa}$ to selectively deplete the image charges accumulated in the photosensitive device PD. In some embodiments, the first transfer gate transistor TG1 is located between the photosensitive device PD and the storage device SD. In some embodiments, the first transfer gate transistor TG1 is able to control the transfer of the image charges accumulated in the photosensitive device PD to the storage device SD. For example, during operation of the image sensor 10, the first transfer gate transistor TG1 is able to receive a transfer signal and performs transfer of the image charges accumulated in the photosensitive device PD to the storage device SD based on the transfer signal.

In some embodiments, the storage device SD is coupled to the first transfer gate transistor TG1 and the photosensitive device PD to receive the image charges accumulated in the photosensitive device PD and to store the received image charges in the depletion region. As illustrated in FIG. 2, the storage device SD may be adjacent to the photosensitive device PD. In some embodiments, the storage device SD includes a first doped region 102b, a second doped region 104b, and a storage gate electrode SG. In some embodiments, the image charges are stored in the first doped region 102b, the second doped region 104b, and the semiconductor substrate (for example, a semiconductor substrate 100a/100 illustrated in FIG. 4 through FIG. 24) underneath the second doped region 104b. The first doped region 102b of the storage device SD and the first doped region 102a of the photosensitive device PD may be formed simultaneously by the same step. Similarly, the second doped region 104b of the storage device SD and the second doped region 104a of the photosensitive device PD may also be formed simultaneously by the same step. However, the disclosure is not limited thereto. In some alternative embodiments, the first doped regions 102a, 102b and the second doped regions 104a, 104b may be individually formed by different steps. The structure of the photosensitive device PD will be discussed in greater detail later in conjunction with FIG. 4 through FIG. 24.

In some embodiments, the driving circuit DC is disposed adjacent to the storage device SD. The driving circuit DC includes a second transfer gate transistor TG2, a floating diffusion FD, a reset transistor RST, a source follower transistor SF, and a row select transistor RS. In some embodiments, the second transfer gate transistor TG2 is coupled to an output of the storage device SD. Similar to the first transfer gate transistor TG1, the second transfer gate transistor TG2 also provides the function of selectively transferring the image charges accumulated in the storage device SD to the floating diffusion FD. In some embodiments, the second transfer gate transistor TG2 and the storage gate electrode SG may work together to transfer the image charges stored in the storage device SD to the floating diffusion FD. For example, a bias may be applied to the storage gate electrode SG and a gate of the second transfer gate transistor TG2 to generate an electrical field such that a channel for movement of the charges is created. In some embodiments, due to the electrical field generated, the charges stored in the first doped region 102b, the second doped region 104b, and the semiconductor substrate underneath the second doped region 104b are pulled out from the first doped region 102b and the second doped region 104b to enter a channel of the second transfer gate transistor TG2 adjacent to the storage device SD. Thereafter, these charges may travel through the channel of the second transfer gate transistor TG2 to arrive at the floating diffusion FD. In some embodiments, a drain of the second transfer gate transistor TG2 may serve as a drain for the storage device SD.

In some embodiments, the floating diffusion FD is referred to as a readout node. The floating diffusion FD is, for example, a lightly doped n-type region formed at least partially within a p-well. In some embodiments, the floating diffusion FD may serve as a capacitor for storing the image charges.

As illustrated in FIG. 2, in some embodiments, the reset transistor RST is coupled to the floating diffusion FD and voltage $V_{pix}$ to selectively reset the image charges in the floating diffusion FD. For example, the reset transistor RST may discharge or charge the floating diffusion FD to a preset voltage in response to a reset signal. In some embodiments, the source follower transistor SF is coupled to the floating diffusion FD and voltage $V_{aa}$. For example, the source follower transistor SF is able to provide high impedance output. The source follower transistor SF may be an amplifier transistor which can amplify the signal of the floating diffusion FD for readout operation. In some embodiments, the row select transistor RS is coupled to the source follower transistor SF. In some embodiments, another end of the row select transistor RS is coupled to a readout column line (e.g. the interconnection or an inter metal line 13) to selectively output the image data Pixout.

In some embodiments, since the driving circuit DC performs the readout function, the driving circuit DC is referred to as a readout circuit in addition to the readout circuitry 21 included in the integrated circuit 20. Moreover, the schematic view (or diagram) of the image sensor 10 illustrated in FIG. 2 is merely an example, and the disclosure is not limited thereto. In some alternative embodiments, the image sensor 10 may have different circuit designs. For example, the first transfer gate transistor TG1 may be omitted. In some alternative embodiments, the layout of the components in the driving circuit DC may be altered depending on the circuit requirements. For example, the driving circuit DC is depicted as a four transistor (4T) circuitry in FIG. 2. Nevertheless, in some alternative embodiments, the driving circuit DC may be a 3T circuitry, a 5T circuitry, or any other suitable circuitry.

However, the disclosure is not limited thereto. In further alternative embodiments, the first transfer gate transistor TG1 is incorporated into the photosensitive device PD, and the second transfer gate transistor TG2 is incorporated into the storage device SD, such that the driving circuit DC is a three transistor (3T) circuitry including the reset transistor RST, the source follower transistor SF and the row select transistor RS.

The operation of the image sensor 10 will be briefly described below. In order to prevent the signals to be received from mixing with the signals previously received, a reset process is first performed. During the reset process, a reference voltage $V_{cc}$ is applied onto the reset transistor RST to turn on the reset transistor RST and the voltage $V_{pix}$ is changed to the reference voltage $V_{cc}$. In some embodiments, the reference voltage $V_{cc}$ may be 3.3V. Thereafter, the electrical potential of the floating diffusion FD is pulled to the reference voltage $V_{cc}$ by the reset transistor RST and the voltage $V_{pix}$. Meanwhile, the storage gate electrode SG and the second transfer gate transistor TG2 are turned on such that the high reference voltage $V_{cc}$ is able to deplete the charges previously stored in the storage device SD, thereby resetting the storage device SD. In some embodiments, the photosensitive device PD is depleted in conjunction with the storage device SD. For example, the voltage $V_{aa}$ may be set to the reference voltage $V_{cc}$, and the shutter gate transistor SHG may be turned on to deplete the charges previously accumulated in the photosensitive device PD. It should be noted that during this stage, the first transfer gate transistor TG1 is off. After ensuring the storage device SD is being reset and the photosensitive device PD is being depleted, the shutter gate transistor SHG, the first transfer gate transistor TG1 and the second transfer gate transistor TG2 are turned off. Upon irradiation of incident light, the image charges are trapped in the photosensitive device PD. In order to access the image charges accumulated in the photosensitive device PD, the first transfer gate transistor TG1 and the storage gate electrode SG are turned on such that the image charges accumulated in the photosensitive device PD are transferred into the storage device SD. In order to access the image charges stored in the storage device SD, the storage gate electrode SG and the second transfer gate transistor TG2 are turned on to transfer the image charges from the depletion region of the storage device SD into the floating diffusion FD. Subsequently, the source follower transistor SF is turned on to amplify the signal of the floating diffusion FD for readout operation and the row select transistor RS is turned on to selectively output the image data Pixout.

In some embodiments, as shown in FIG. 3, an arrangement of certain features in one pixel 11 for the image sensor 10 depicted in FIG. 1 and FIG. 2 is stressed for illustration purposes. For example, positioning locations (or regions) of the photosensitive device PD, the storage device SD and the driving circuit DC are shown in FIG. 3 for easy illustration. For instance, the photosensitive device PD is positioned in a photosensitive region 11A, the storage device SD is positioned in a storage device region 11B and the driving circuit DC is positioned in a circuitry region 11C, as shown in FIG. 3. In some embodiments, the storage device SD and the driving circuit DC are arranged next to each other along a direction X to facilitate an electrical couple of the storage device SD and the driving circuit DC, and the storage device SD and the driving circuit DC are arranged next to the photosensitive device PD along a direction Y to facilitate an electrical couple of the storage device SD and the photosensitive device PD, where the direction X is different from the direction Y. The direction X may be perpendicular to the direction Y. However, the disclosure is not limited thereto. Other suitable arrangement may be adapted as long as these above electrical couples can be achieved with an acceptable loss in the image charges during the transfer of image charges. For example, the components of the photosensitive device PD, the storage device SD and the driving circuit DC can be formed on and/or in the semiconductor substrate, without distinct positioning locations (or regions) with clear boundaries.

FIG. 4 through FIG. 24 are schematic vertical and horizontal views showing a method of manufacturing an image sensor included in an semiconductor structure (e.g. a (semi-conductor) image sensor device 1000a) in accordance with some embodiments of the disclosure, where FIG. 4, FIG. 6, FIG. 7, FIG. 9, FIG. 11, FIG. 13, FIG. 15, FIG. 17, FIG. 19, FIG. 21, FIG. 23 and FIG. 24 are the cross-sectional views taken along lines A-A and B-B depicted in FIG. 5, FIG. 8, FIG. 10, FIG. 12, FIG. 14, FIG. 16, FIG. 18, FIG. 20 and FIG. 22. In embodiments, the manufacturing method is part of a wafer level process. It is to be noted that the process steps described herein cover a portion of the manufacturing processes used to fabricate a semiconductor structure involving an image sensor equipped with an isolation structure having a conductive grid. Such semiconductor structure may be referred to as an (semiconductor) image sensor die or chip or an (semiconductor) image sensor device. The embodiments are intended to provide further explanations but are not used to limit the scope of the disclosure. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases. In some embodiments, the (semiconductor) image sensor device 1000a is a BSI image sensor device, where the radiation of an incident light (denoted as "L" depicted in FIG. 24) is projected toward a backside of the semiconductor substrate 100 into the photosensitive devices PD.

Figure 4:
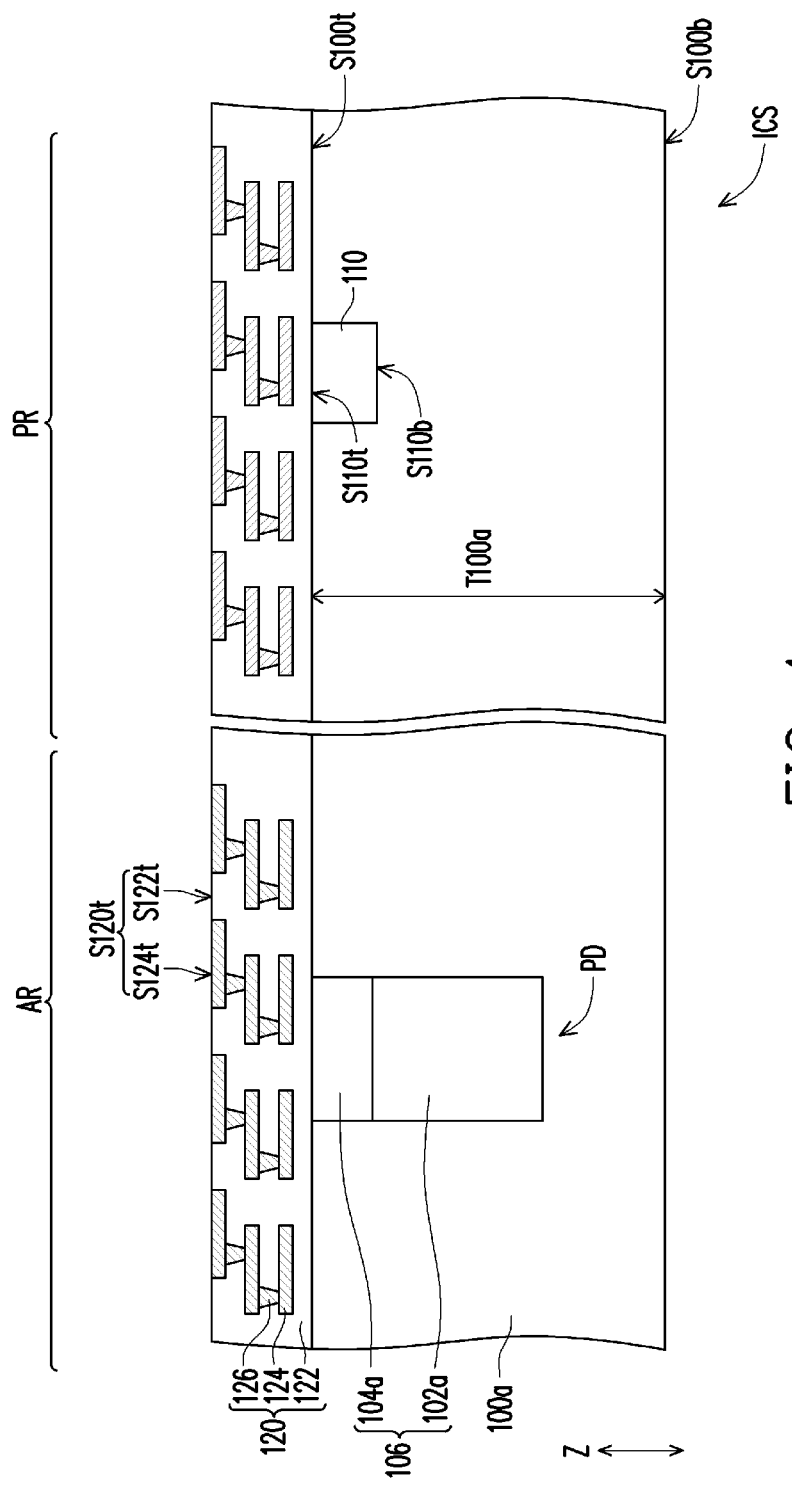
FIG. 4, FIG. 6, FIG. 7, FIG. 9, FIG. 11, FIG. 13, FIG. 15, FIG. 17, FIG. 19, FIG. 21, FIG. 23 and FIG. 24 are schematic vertical (or cross-sectional) views showing a method of manufacturing an image sensor, in a (semiconductor) image sensor die in accordance with some embodiments of the disclosure.
Figure 5:
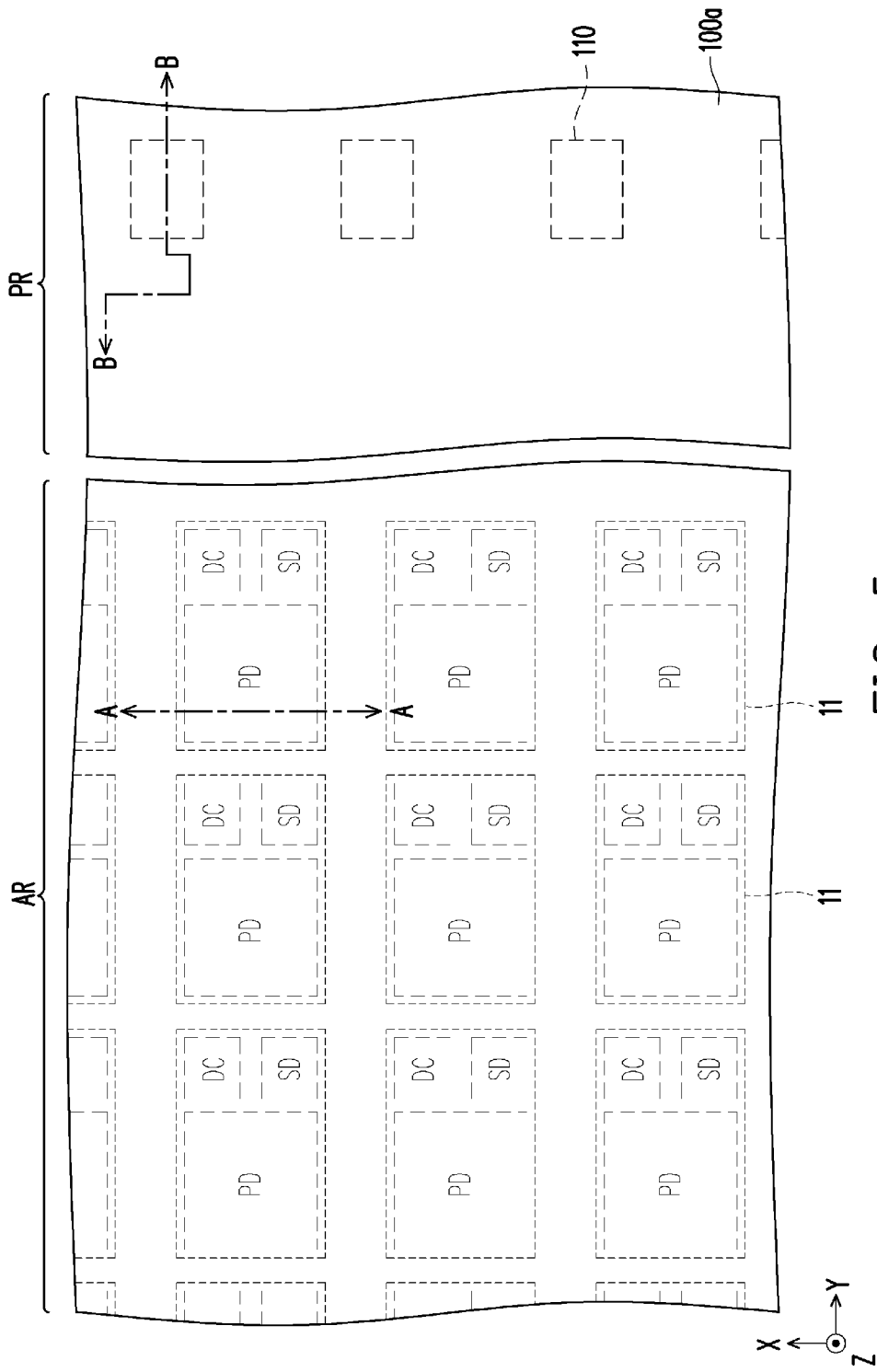
FIG. 5, FIG. 8, FIG. 10, FIG. 12, FIG. 14, FIG. 16, FIG. 18, FIG. 20 and FIG. 22 are schematic horizontal (or plane) views illustrating a relative position of components included in the image sensor depicted in FIG. 4, FIG. 7, FIG. 9, FIG. 11, FIG. 13, FIG. 15, FIG. 17, FIG. 19 and FIG. 21.

Referring to FIG. 4 and FIG. 5 together, in some embodiments, an initial integrated circuit structure ICS is provided, where the initial integrated circuit structure ICS includes a semiconductor substrate 100a, a device region (not shown) and an interconnect 120. In some embodiments, the initial integrated circuit structure ICS includes an active region AR1 (e.g., a location for the pixels 11, in FIG. 2 and FIG. 3) and a peripherical (or peripheral) region PR (e.g., a location for the circuitries in FIG. 1). The initial integrated circuit structure ICS may include other regions for accommodating other components of the image sensor device 1000a, if need. As shown in FIG. 5, for example, the peripherical region PR is located at a side of the active region AR. However, the disclosure is not limited thereto; the peripherical region PR may be located at one, more than one, or all sides of the active region AR.

In FIG. 4, the semiconductor substrate 100a is, for example, a silicon substrate doped with a p-type dopant such as boron and thus is a p-type substrate. Alternatively, the semiconductor substrate 100a could be another suitable semiconductor material. For example, the semiconductor substrate 100a may be a silicon substrate doped with an n-type dopant such as phosphorous or arsenic and thus is an n-type substrate. The semiconductor substrate 100a may include various doped regions depending on design requirements (e.g., p-type wells or n-type wells). In some embodiments, the doped regions are doped with p-type dopants, such as boron or $BF_2$, and/or n-type dopants, such as phosphorus or arsenic. Moreover, the doped regions may be formed directly on the semiconductor substrate 100a, in a P-well structure, in an N-well structure, in a dual-well structure, or using a raised structure. In alternative embodiments, the semiconductor substrate 100a may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the semiconductor substrate 100a could include an epitaxial layer (epi layer), may be strained for performance enhancement. Alternatively, the semiconductor substrate 100a may be a semiconductor on insulator such as silicon on insulator (SOI) or silicon on sapphire.

As illustrated in FIG. 4, for example, the semiconductor substrate 100a has a top surface S100t and a bottom surface S100b opposite to the top surface S100t along a direction Z. The direction Z may be perpendicular to the X-Y plane, e.g. the direction X and the direction Y. In some embodiments, a thickness T100a of the semiconductor substrate 100a is approximately ranging from 500 μm to 900 μm.

In some embodiments, the semiconductor substrate 100a also includes a plurality of first isolations (not shown) in the active region AR and a plurality of second isolations 110 in the peripherical region PR, which are formed to isolate different devices, such the photosensitive devices PD, the storage devices SD, the transistor(s) (such as RST, SF, RS, TG1, and/or TG2) in the driving circuit DC and/or components of the circuitries (e.g. 12, 21, 22, 23). The first isolations and the second isolations 110 each may utilize isolation technology, such as local oxidation of silicon (LOCOS) or shallow trench isolation (STI) to electrically isolate the various regions. If the first isolations and the second isolations 110 are made of STIs, the STIs may include silicon oxide, silicon nitride, silicon oxynitride, other suitable materials, or a combination thereof. In some examples, the filled trench has a multi-layer structure such as a thermal oxide liner layer filled with silicon nitride or silicon oxide. In one embodiment, the first isolations are the same as the second isolations 110. In an alternative embodiment, the first isolations are different from the second isolations 110. For example, as shown in FIG. 4, the second isolations 110 are STIs embedded inside the semiconductor substrate 100a, where a top surface S110t of each of the second isolations 110 is substantially coplanar with the top surface S100t of the semiconductor substrate 100a, and a bottom surface S110b of each of the second isolations 110 is covered (e.g. not accessibly revealed) by the bottom surface S100b of the semiconductor substrate 100a.

Back to FIG. 4, in some embodiments, the first doped region 102a and the second doped region 104a are formed in the semiconductor substrate 100a within the active region AR to form a photodiode 106. For example, one photodiode 106 and an interface region between the photodiode 106 (e.g. the first doped region 102a) and the semiconductor substrate 100a/100 surrounding thereto together constitute one photosensitive device PD. It should be noted that a configuration of the photodiode 106 illustrated in the disclosure merely serves as an exemplary illustration of the photosensitive device PD, and the disclosure is not limited thereto. Alternatively, the photosensitive device PD may be a photodiode including only the first doped region 102a (being disposed closely proximate to the top surface S100t of the semiconductor substrate 100a) and an interface region between the photodiode 106 and the semiconductor substrate 100a surrounding thereto. As shown in FIG. 4, the photodiode 106 has an illustrated top surface (not labeled) and an illustrated bottom surface (not labeled) opposite thereto along the direction Z, where the illustrated top surface is substantially coplanar to the top surface S110t of the semiconductor substrate 100a and the illustrated bottom surface is covered by the bottom surface S110b of the semiconductor substrate 100a, for example. In alternative embodiments, the illustrated top surface of the photodiode 106 is closely proximate to top surface S110t of the semiconductor substrate 100a, but not being coplanar thereto.

The first doped region 102a may be formed by doping the semiconductor substrate 100a with dopants of a first type, and the second doped region 104a may be formed by doping the semiconductor substrate 100a above the first doped region 102a with dopants of a second type. The dopants of the first type are different from the dopants of the second type, in some embodiments. For example, when the semiconductor substrate 100a is a p-type substrate, the first doped region 102a may be doped with n-type dopants (such as phosphorous or arsenic) and the second doped region 104a may be doped with p-type dopants (such as boron or $BF_2$) to form a P-N junction between the first doped region 102a and the second doped region 104a. That is, the semiconductor substrate 100a and the second doped region 104a have the same conductivity type (e.g. the second type) different from the conductivity type (e.g. the first type) of the first doped region 102a.

Alternatively, when the semiconductor substrate 100a is an n-type substrate, the first doped region 102a may be doped with p-type dopants and the second doped region 104a may be doped with n-type dopants to form the P-N junction therebetween. In some embodiments, the dopants may be doped into the first doped region 102a and the second doped region 104a through an ion implantation process.

As mentioned above, the first doped region 102b and the second doped region 104b of the storage device SD may be formed by a similar manner as that of the first doped region 102a and the second doped region 104a. Therefore, although not illustrated, it should be understood that the storage device SD is located within the semiconductor substrate 100a.

In some embodiments, the device region is arranged along the top surface S100t of the semiconductor substrate 100a, and extends into the semiconductor substrate 100a. The device region includes a plurality of devices (such as the photosensitive device PD (including the photodiode 106), the storage device SD (including the first doped region 102b and the second doped region 104b) and the driving circuit DC (including the transistors RST, SF, RS, TG1, or TG2) corresponding to each pixel 11; logic devices (such as the transistors SHG) corresponding to the access circuitry 12 for enabling the pixels 11; and active devices and passive devices corresponding to the readout circuitry component 21, the signal processing circuitry component 22 and the output circuitry component 23 for readout of the photosensitive device PD). The photosensitive device PD are arranged in rows and columns within the semiconductor substrate 100a, and configured to accumulate charge from photons incident on the photodiodes 106. Further, the photodiodes 106 are optically isolated from each other by the first isolations (not shown, such as STI or LOCOS) in the semiconductor substrate 100a, thereby reducing cross talk among the neighboring pixels 11.

In some embodiments, the device region is formed in a front-end-of-line (FEOL) process. The devices in the device region include integrated circuits devices. The devices are, for example, transistors, capacitors, resistors, diodes, photodiode, fuse devices, or other similar devices. In an embodiment, the device region includes a gate structure and source and drain regions. In the device region, various N-type metal-oxide semiconductor (NMOS) and/or P-type metal-oxide semiconductor (PMOS) devices, such as transistors or memories and the like, may be formed and interconnected to perform one or more functions. The functions of the devices may include memory, processors, sensors, amplifiers, power distribution, input/output circuitry, or the like.

Continued on FIG. 4, in some embodiments, the interconnect 120 is formed on the semiconductor substrate 100a along the top surface S100t of the semiconductor substrate 100a. In some embodiments, the interconnect 120 is formed in a back-end-of-line (BEOL) process. The interconnect 120 is atop of the device region and electrically connected to the devices of the device region for providing routing function to the device region. In some embodiments, the interconnect 120 includes at least one patterned dielectric layer and at least one conductive layer that provides interconnections (e.g., wiring) between the various doped features, circuitry, and input/output of the device region formed on and/or in the semiconductor substrate 100a. The interconnect 120 is considered as a redistribution circuit structure or an interconnecting structure of the device region, for example.

For example, the interconnect 120 includes a multilayer interconnect (MLI) structure, where the MLI structure includes a dielectric layer (or a dielectric structure with multiple dielectric layers) 122, a plurality of conductive lines 124 and a plurality of vias/contacts 126. For purposes of illustration, it is understood that the dielectric layer 122, the conductive lines 124 and vias/contacts 126 illustrated in FIG. 4 are merely exemplary, and the actual positioning, layer count, and configuration of the dielectric layer 122, the conductive lines 124 and the vias/contacts 126 may vary depending on design needs and manufacturing concerns.

The dielectric layer 122 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layer 122 is formed by suitable fabrication techniques such as spin-on coating, chemical vapor deposition (CVD), plasma-enhanced chemical vapor deposition (PECVD) or the like.

The conductive lines 124 and the vias/contacts 126 may be made of conductive materials formed by electroplating or deposition, such as copper, copper alloy, aluminum, aluminum alloy, or combinations thereof, which may be patterned using a photolithography and etching process. In some embodiments, the conductive lines 124 may be metal lines, metal pads, metal traces, etc. For example, the vias/contacts 126 may be metal vias, etc. For example, the conductive lines 124 and the vias/contacts 126 are patterned copper layers/vias. In some embodiments, the conductive lines 124 and the vias/contacts 126 are formed by a dual damascene process. That is, the conductive lines 124 and the vias/contacts 126 may be formed simultaneously. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the conductive lines 124 and the vias/contacts 126 together are referred to as metallization layers. The interconnect 120 may be referred to as a BEOL metallization stack. As shown in FIG. 4, for example, a topmost layer (e.g. 124) of the metallization layers of the interconnect 120 is exposed by a top surface S122t of the dielectric layer 122. In other words, top surfaces S124t of the topmost layer (e.g. 124) of the metallization layers of the interconnect 120 are substantially coplanar with the top surface S122t of the dielectric layer 122. The top surface S122t of the dielectric layer 122 and the top surfaces S124t exposed by the top surface S122t of the dielectric layer 122 are together referred to as a top surface S120t of the interconnect 120, in some embodiments, as shown in FIG. 4.

In some embodiments, after forming the device region and prior to forming the interconnect 120, an etching stop layer (not shown) is conformally formed over the device region and covering the devices thereof, and an interlayer dielectric (ILD) layer (not shown) is formed over the etching stop layer until obtaining a topmost surface having a high degree of planarity and flatness, which is beneficial for the later-formed layers/elements (e.g. the interconnect 120). For example, a bottommost layer (e.g. 126) of the metallization layers of the interconnect 120 penetrates through the ILD layer and the etching stop layer to be electrically connected to the devices of the device regions. In some embodiments, the etching stop layer provides protections to the device region during establishing the electrical connections between the device region and the interconnect 120. The etching stop layer may be referred to as a contact etching stop layer (CESL).

The etch stop layer may include silicon nitride, carbon-doped silicon nitride, or a combination thereof, which may be deposited by using processes such as CVD (e.g. high-density plasma CVD (HDPCVD), sub-atmospheric CVD (SACVD)), molecular layer deposition (MLD), or other suitable methods. In some embodiments, before the etch stop layer is formed, a buffer layer (not shown) is further formed over the semiconductor substrate 100a and on the device region. In an embodiment, the buffer layer is an oxide such as silicon oxide; however, the disclosure is not limited thereto, other composition may be utilized. In some embodiments, the buffer layer is deposited by processes such as CVD (e.g. HDPCVD, SACVD), MLD, or other suitable methods.

The ILD layer may include silicon oxide, silicon nitride, silicon oxynitride, silicon carbonitride, silicon carbide oxynitride, spin-on glass (SOG), PSG, BPSG, FSG, carbon doped silicon oxide (e.g., SiOC(—H)), polyimide, and/or a combination thereof. In some alternative embodiments, the ILD layer may include low-K dielectric materials. Examples of low-K dielectric materials include Xerogel, Aerogel, amorphous fluorinated carbon, Parylene, BCB, hydrogen silsesquioxane (HSQ) or fluorinated silicon oxide (SiOF), and/or a combination thereof. It is understood that the ILD layer may include one or more dielectric materials. In some embodiments, the ILD layer is formed to a suitable thickness by CVD (e.g. flowable chemical vapor deposition (FCVD), HDPCVD, SACVD), spin-on coating, sputtering, or other suitable methods.

Figure 6:
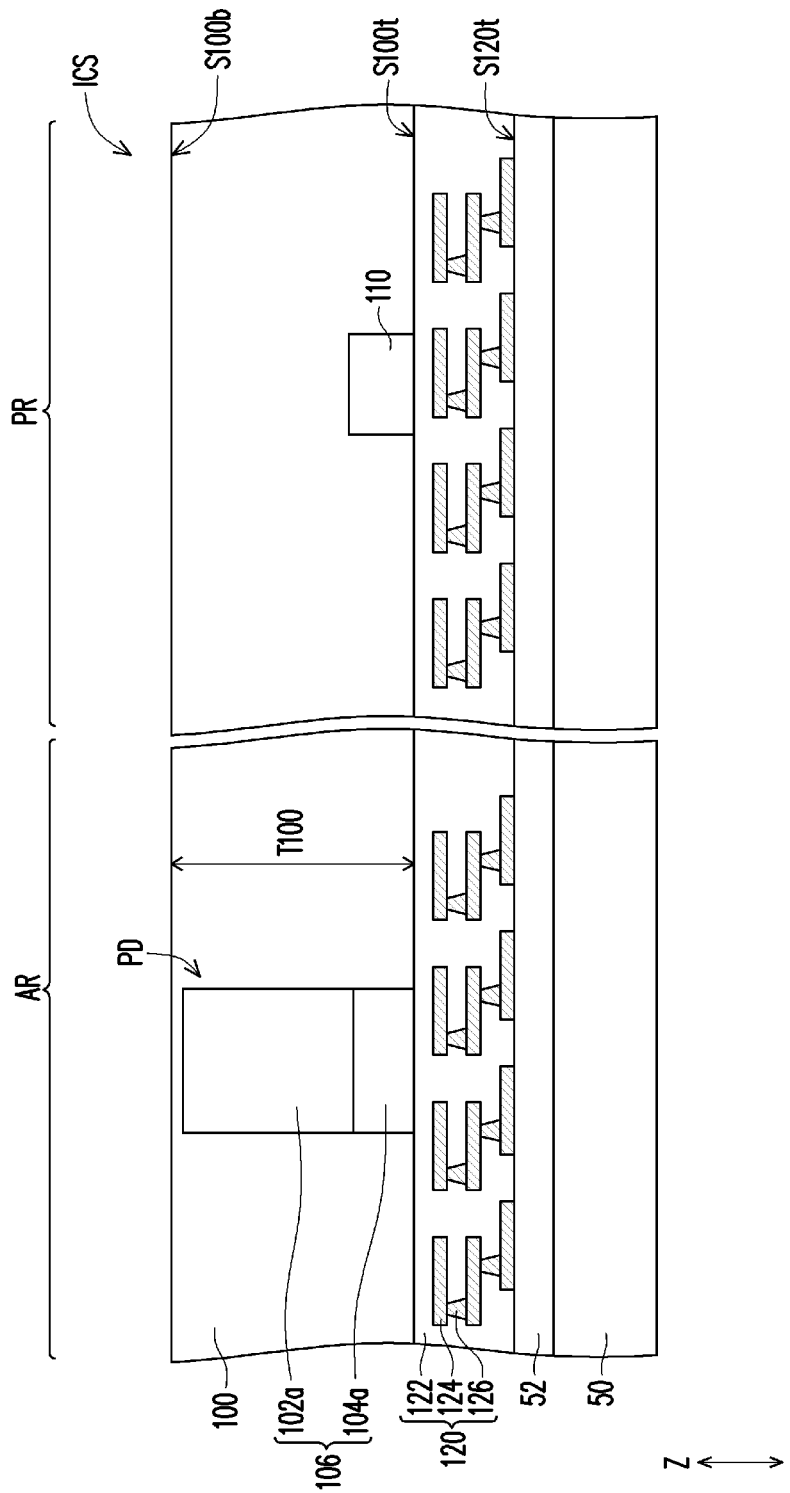

Referring to FIG. 6, in some embodiments, the initial integrated circuit structure ICS is placed onto a carrier 50 by a debond layer 52. For example, the top surface S120t of the interconnect 120 is in contact with the debond layer 52, where the debond layer 52 is located between the carrier 50 and the initial integrated circuit structure ICS. A material of the carrier 50 may include glass, metal, ceramic, silicon, plastic, combinations thereof, multi-layers thereof, or other suitable material that can provide structural support for the initial integrated circuit structure ICS in subsequent processing. In some embodiments, the carrier 50 is made of glass, and the debond layer 52 used to adhere the initial integrated circuit structure ICS to the carrier 50. The material of the debond layer 52 may be any material suitable for bonding and debonding the carrier 50 from the above layer(s) (e.g. the interconnect 120) or any wafer(s) (e.g. the initial integrated circuit structure ICS) disposed thereon. In some embodiments, the debond layer 52 may include a release layer (such as a light-to-heat conversion ("LTHC") layer) or an adhesive layer (such as an ultra-violet curable adhesive or a heat curable adhesive layer). Other suitable temporary adhesives may be used for the debond layer 52.

Thereafter, in some embodiments, a planarizing process is performed on the bottom surface S100b of the semiconductor substrate 100a to form a (thinned) semiconductor substrate 100. In some embodiments, a thickness T100 of the semiconductor substrate 100 is approximately ranging from 1.5 μm to 21 μm. The thickness T100 of the thinned semiconductor substrate 100 is less than the thickness T100a of the semiconductor substrate 100a, for example. In other words, the planarizing process is applied to the bottom surface S100b the semiconductor substrate 100a until the thinned semiconductor substrate 100 having a desired thickness is achieved. Such thinned semiconductor substrate 100 reduces a gap (or distance) between the bottom surface of the photodiode 106 and the bottom surface S100b the semiconductor substrate 100, which allows light to pass through the semiconductor substrate 100 and hit the photodiodes 106 of the photosensitive device PD embedded in the semiconductor substrate 100 without being absorbed by the semiconductor substrate 100. For example, as shown in FIG. 6, the photosensitive devices PD, the first isolations and the second isolations 110 are not accessibly revealed by the bottom surface S100b of the semiconductor substrate 100.

In some embodiments, the planarizing process may include a grinding process, a chemical-mechanical polishing (CMP) process, an etching process, or combinations thereof. The etching process may include anisotropic etching or isotropic etching. After planarizing, a cleaning process may be optionally performed, for example to clean and remove the residue generated from the planarizing process. However, the disclosure is not limited thereto, and the planarizing process may be performed through any other suitable method.

Figure 7:
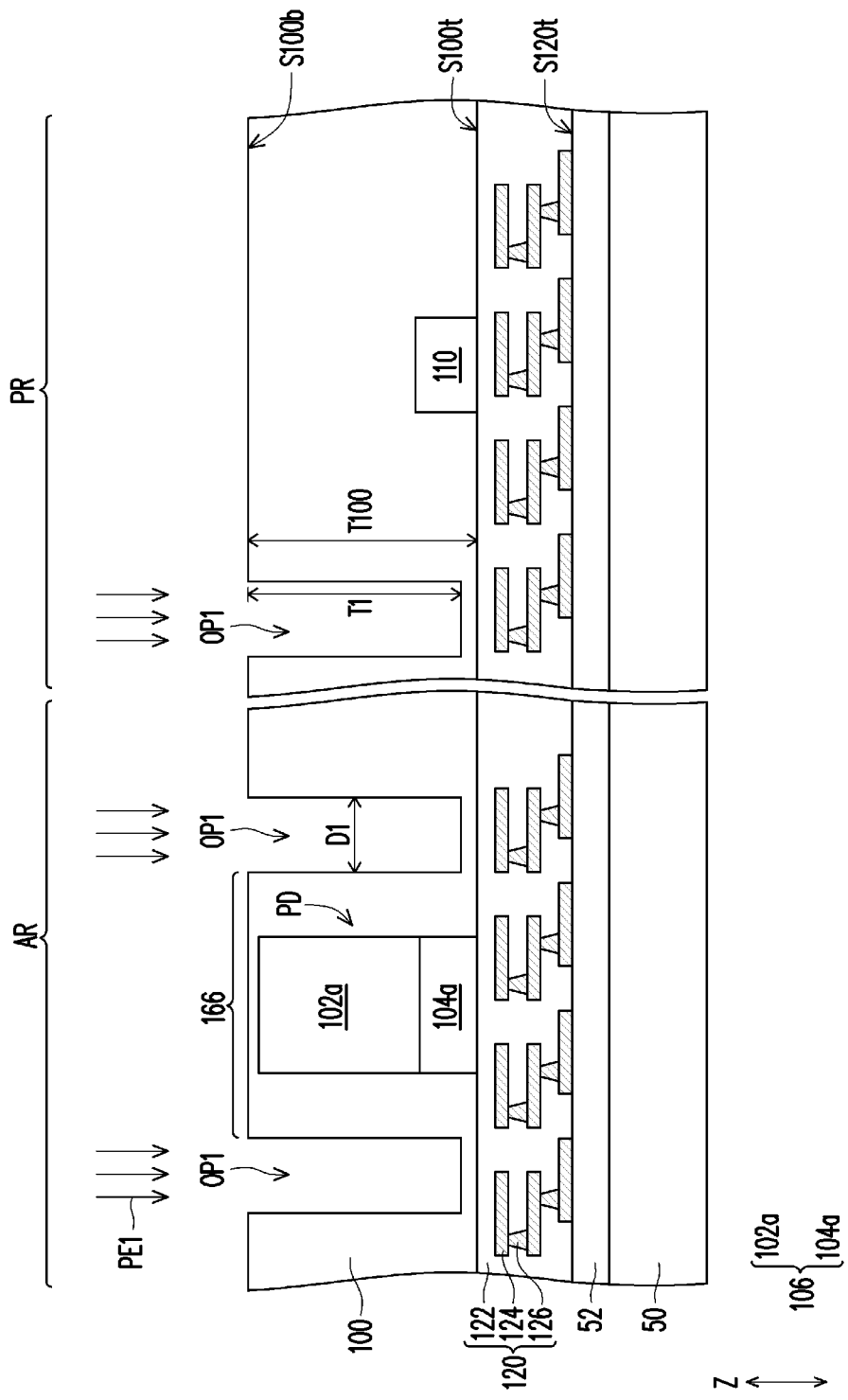
Figure 8:
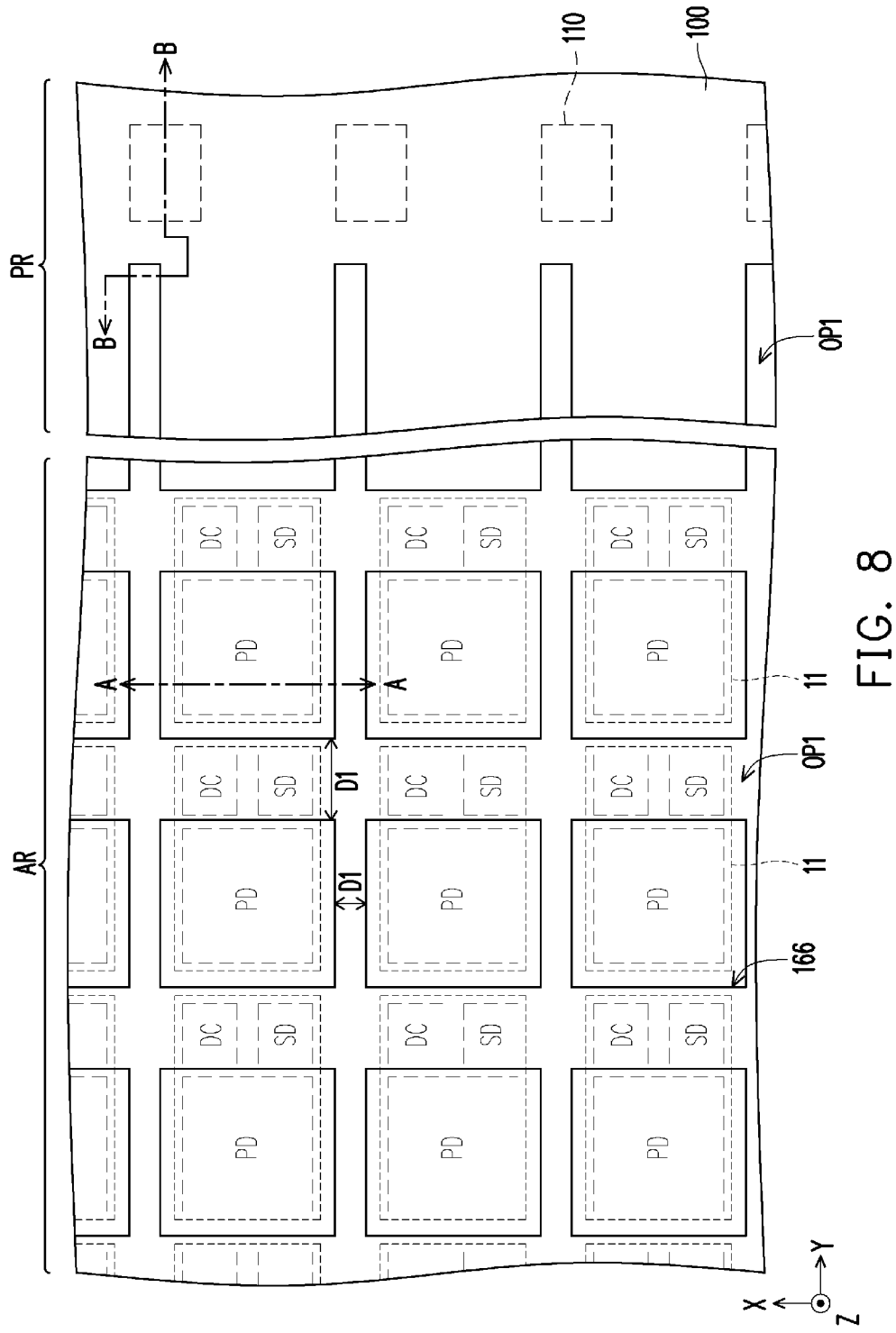

Referring to FIG. 7 and FIG. 8, in some embodiments, a patterning process PE1 is performed to form a plurality of trenches OP1 in the semiconductor substrate 100. The trenches OP1 may include partially deep trenches (PDT). As shown in FIG. 8, for example, the trenches OP1 are located within the active region AR, where the trenches OP1 surrounds the photodiode 106 of the photosensitive device PD of each pixel 11. In other words, the trenches OP1 are spatially connected to each other and continuously extend around the photosensitive device PD. As shown in FIG. 7 and FIG. 8, for example, the photosensitive devices PD are positioned in a plurality of regions 166 confined by the trenches OP1. In some embodiments, as shown in FIG. 8, in a vertical projection on the semiconductor substrate 100 along the direction Z, the trenches OP1 are not overlapped with the photosensitive device PD. For example, the trenches OP1 may be continuous trenches and may be configured as a grid shape (e.g. a form of grid mesh). That is, the trenches OP1 may together be referred to as a grid (mesh) cavity formed in the semiconductor substrate 100. In some embodiments, at least some of the trenches OP1 further extends to the periphery region PR, as shown in FIG. 8. For example, a height T1 of the trenches OP1 is approximately ranging from 0.3 μm to 20 μm. In one embodiment, the height T1 of the trenches OP1 is less than the thickness T100 of the semiconductor substrate 100, where a portion of the semiconductor substrate 100 under the trenches OP1 has a sufficient thickness allowing other devices such as the storage device SD and the driving circuit DC being formed underneath the trenches OP1. For example, a width D1 of the trenches OP1 is approximately ranging from 0.01 μm to 5 μm, where the width D1 is measured along a direction perpendicular to an extending direction of the trenches OP1, as shown in FIG. 7 and FIG. 8.

However, the disclosure is not limited thereto; alternatively, the height T1 of the trenches OP1 may be substantially equal to the thickness T100 of the semiconductor substrate 100, where the trenches OP1 are not overlapped with the storage device SD and the driving circuit DC. In the embodiments of which the height T1 of the trenches OP1 being substantially equal to the thickness T100 of the semiconductor substrate 100 the trenches OP1 include fully deep trenches (FDT), where the storage device SD and the driving circuit DC are located next to the trenches OP1.

The patterning process PE1 may include photolithography and etching processes. For example, a patterned mask layer (not shown) is formed on the bottom surface S100b of the semiconductor substrate 100. The patterned mask layer may include a photoresist and/or one or more hard mask layer. The patterned mask layer has openings (not shown) exposing portions of the semiconductor substrate 100 having no photosensitive device PD and covering portions of the semiconductor substrate 100 having the photosensitive devices PD. Thereafter, an etching process using the patterned mask layer as an etching mask is performed to remove at least portions of the semiconductor substrate 100 exposed by the patterned mask layer, so as to form the trenches OP1. For illustrative purposes, the number of the trenches OP1 shown in FIG. 8 does not limit the disclosure, and may be designated and selected based on the demand and layout design (e.g. the positions of the pixels 11).

Figure 9:
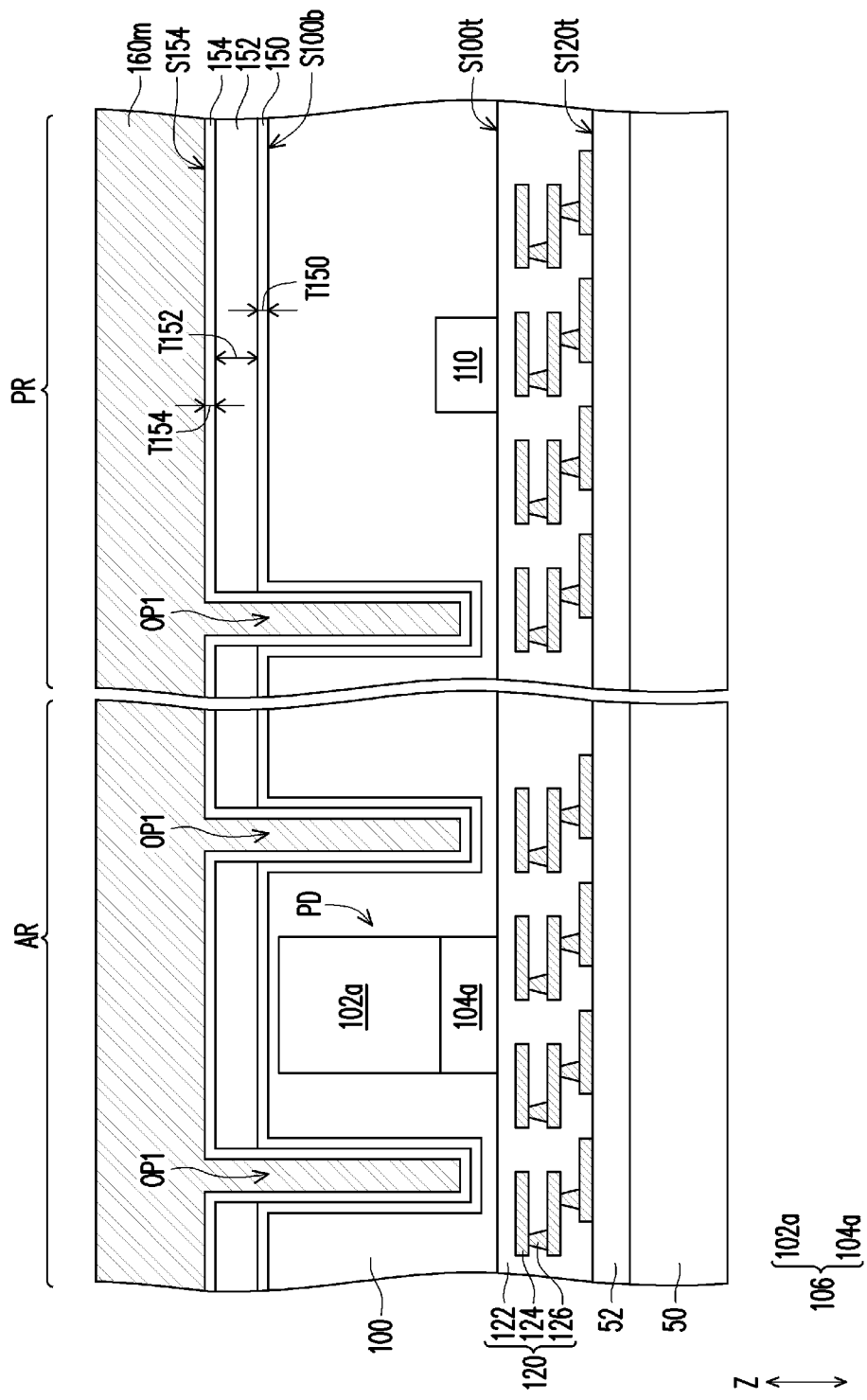
Figure 10:
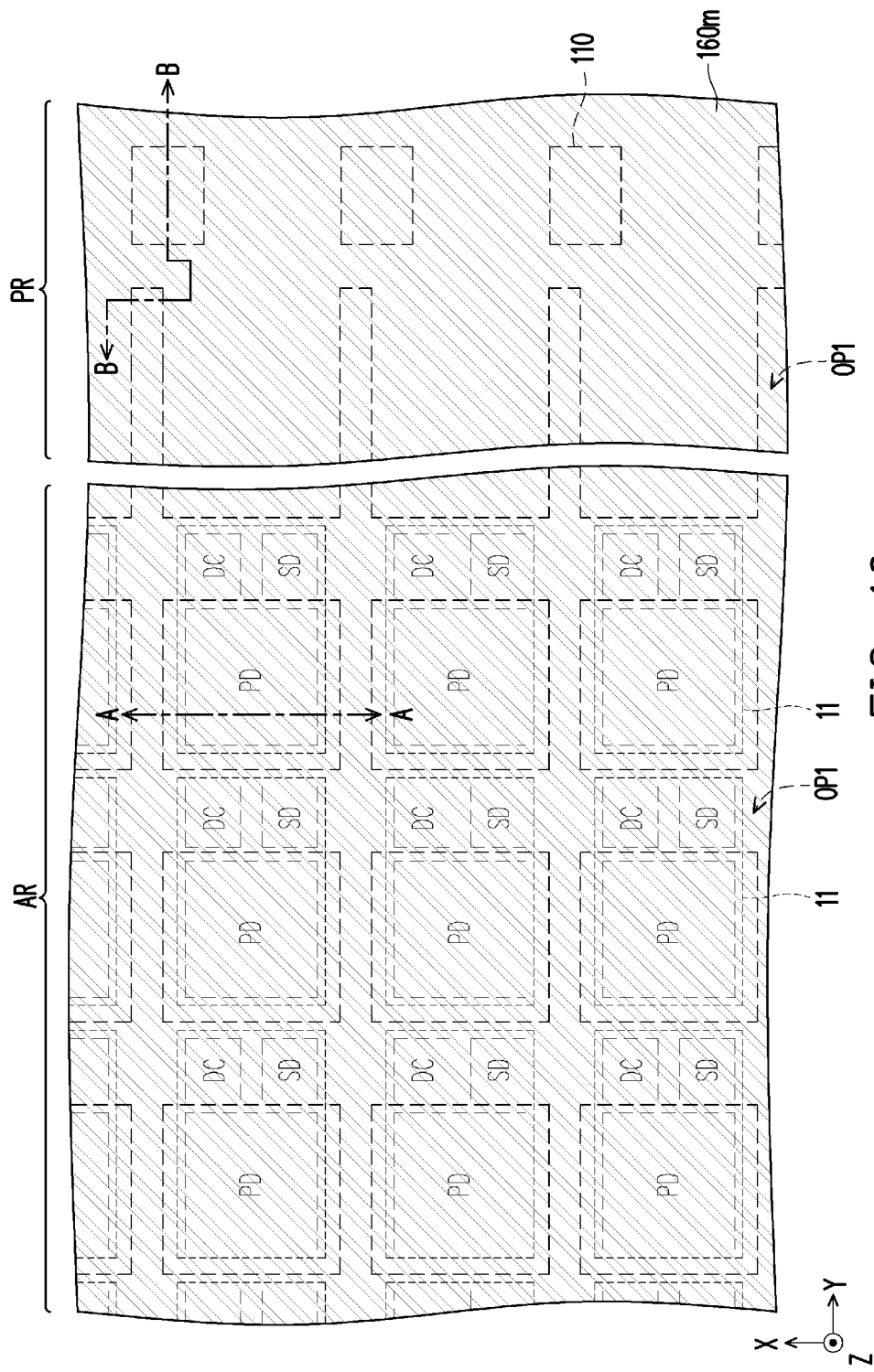

Referring to FIG. 9 and FIG. 10, in some embodiments, a dielectric layer 150, a dielectric layer 152, a dielectric layer 154 and a conductive material layer 160m are formed over the semiconductor substrate 100 along the bottom surface S100b. In some embodiments, the dielectric layer 150 is formed on the semiconductor substrate 100 and extended into the trenches OP1. The dielectric layer 150 is conformally formed over the bottom surface S100b of the semiconductor substrate 100, and further covers sidewalls (not labeled) and bottom surfaces (not labeled) of the trenches OP1. The dielectric layer 150 may also be referred to as a dielectric liner (of the trenches OP1). The dielectric layer 150 may include a suitable dielectric material, such as silicon oxide, silicon nitride, silicon oxynitride, or a high-k dielectric material. It should be noted that the high-k dielectric material may include a dielectric material having a dielectric constant greater than about 4, or even greater than about 10. The high-k dielectric material may include metal oxides. Examples of metal oxides used for the high-k dielectric material include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, Ta, and/or a combination thereof. For example, the dielectric layer 150 includes aluminum oxide (AlO), hafnium oxide (HfO), hafnium silicon oxide (HfSiO), hafnium aluminum oxide (HfAlO), or hafnium tantalum oxide (HfTaO), or the like, for example. In some embodiments, a thickness T150 of the dielectric layer 150 is approximately ranging from 5 Å (angstrom) to 1000 Å. The dielectric layer 150 may be formed using a suitable process having good gap-filling ability, such as atomic layer deposition (ALD). Herein, when a layer is described as conformal or conformally formed, it indicates that the layer has a substantially equal thickness extending along the region on which the layer is formed.

In one embodiment, the dielectric layer 150 includes a single-layer structure. In an alternative embodiment, the dielectric layer 150 includes a multilayer structure of two or more different materials. In a further alternative embodiment, the dielectric layer 150 includes a multilayer structure of a same material. The disclosure is not limited thereto.

Thereafter, the dielectric layer 152 is formed on the dielectric layer 150 located on the bottom surface S100b of the semiconductor substrate 100, in some embodiments. As shown in FIG. 9, the dielectric layer 152 is not extended into the trenches OP1, for example. In other words, the dielectric layer 152 is a patterned dielectric layer with a plurality of holes (not labeled) corresponding to (e.g. exposing) the trenches OP1, in some embodiments. The dielectric layer 152 may include a suitable dielectric material, such as silicon oxide, silicon nitride, silicon oxynitride, or the high-k dielectric material as described above. The dielectric layer 152 may include a single-layer structure, or a multi-layer structure. In some embodiments, the dielectric layer 152 may include a first dielectric layer and a second dielectric layer on the first dielectric layer. The first dielectric layer may include an oxide (such as silicon oxide), and the second dielectric layer may include a nitride (such as silicon nitride). In some embodiments, a thickness T152 of the dielectric layer 152 is approximately ranging from 50A to 6000A. The dielectric layer 152 may be formed using a suitable process having poor gap-filling ability so that the dielectric layer 152 is not formed inside the trenches OP1. The deposition process may include CVD (such as PECVD), physical vapor deposition (PVD), thermal oxidation, UV-ozone oxidation, or a combination thereof. The top openings of the trenches OP1 may be or may not be covered by the dielectric layer 152. If considering the top openings of the trenches OP1 being covered by the dielectric layer 152, an etching process is further adopted to accessibly reveal the trenches OP1 and the dielectric layer 150 formed therein. The etching process may be anisotropic etching. In one embodiment, the material of the dielectric layer 150 is different from the material of the dielectric layer 152, where an interface exists between the dielectric layers 150 and 152. Alternatively, the material of the dielectric layer 150 may be the same as the material of the dielectric layer 152, where there is no distinct interface between the dielectric layers 150 and 152.

Then, the dielectric layer 154 is formed on the dielectric layer 152 and the dielectric layer 150 and further extended into the trenches OP1. The dielectric layer 154 is conformally formed over the bottom surface S100b of the semiconductor substrate 100, and further covers the dielectric layers 152 and 150. The dielectric layer 154 may also be referred to as a dielectric liner (of the trenches OP1). The dielectric layer 154 may include a suitable dielectric material, such as silicon oxide, silicon nitride, or silicon oxynitride. In some embodiments, a thickness T154 of the dielectric layer 154 is approximately ranging from 50A to 5000A. The dielectric layer 154 may be formed using a suitable process having good gap-filling ability, such as atomic layer deposition ALD. As shown in FIG. 9, the thickness T150 of the dielectric layer 150 and the thickness T154 of the dielectric layer 154 are less than the thickness T152 of the dielectric layer 152, for example.

After the formation of the dielectric layer 154, the conductive material layer 160m is formed over the semiconductor substrate 100 to cover up a top surface S154 of the dielectric layer 154 and fill into the trenches OP1 and the holes of the dielectric layer 152, in some embodiments. In some embodiments, a material of the conductive material layer 160m includes a suitable conductive material, such as metal and/or metal alloy. For example, the conductive material layer 160m can be aluminum (Al), aluminum alloys, tungsten (W), copper (Cu), copper alloys, or combinations thereof (e.g. AlCu), the like, or combinations thereof. In certain embodiments, the material of the conductive material layer 160m includes a suitable conductive material having a reflectance of 80% or more, of 95% or more, or 99% or more, in a wavelength range from about 400 nm to about 5 μm. In other words, the material of the conductive material layer 160m is capable of reflecting 80% or more, of 95% or more, or 99% or more of the amount of an incident light having a wavelength ranging from about 400 nm to about 5 μm. For example, the conductive material layer 160m is Al, as shown FIG. 9. In some embodiments, the formation of the conductive material layer 160m may include a deposition process such as CVD, PVD, or the like; a plating process, or combination thereof.

Figure 11:
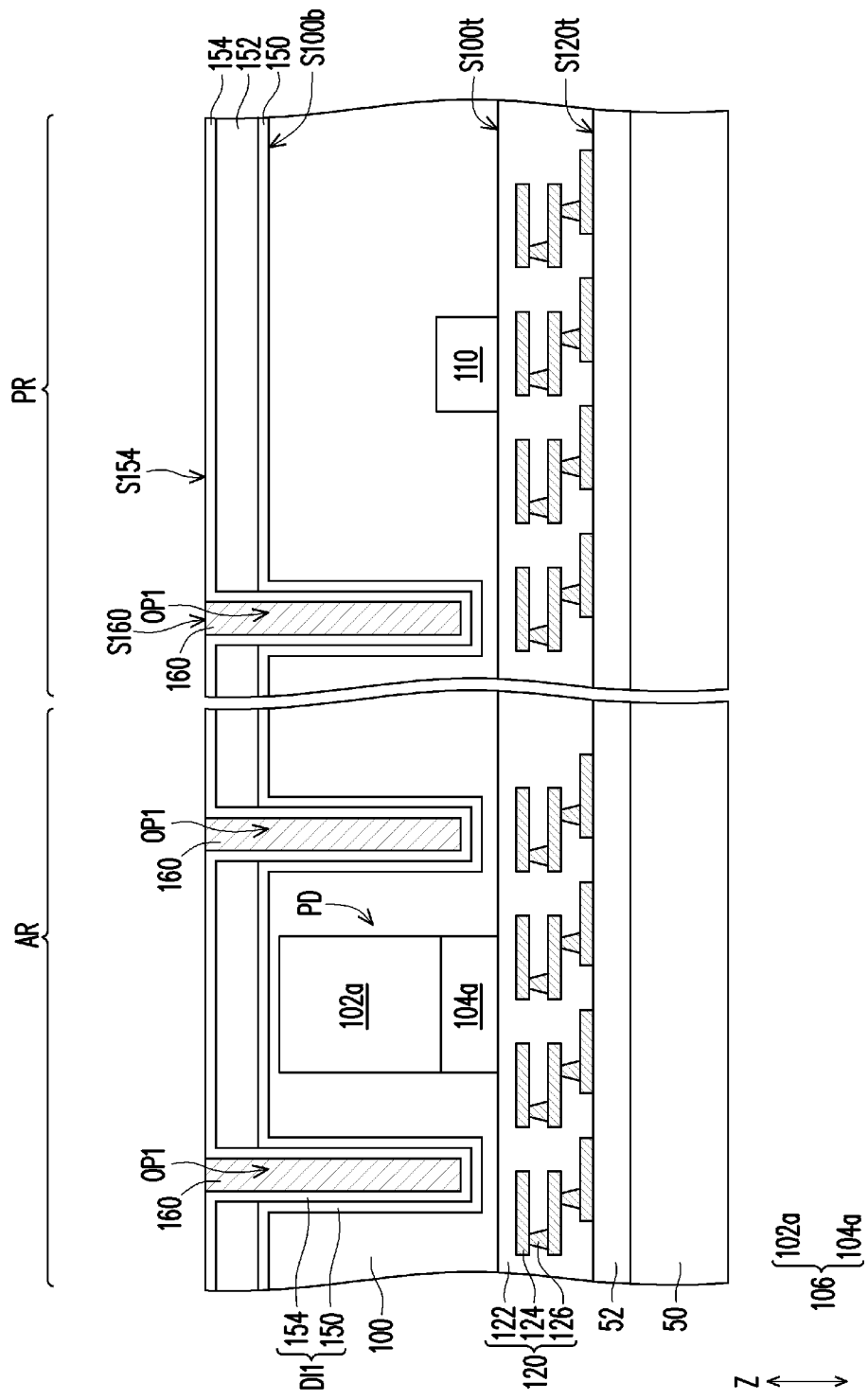
Figure 12:
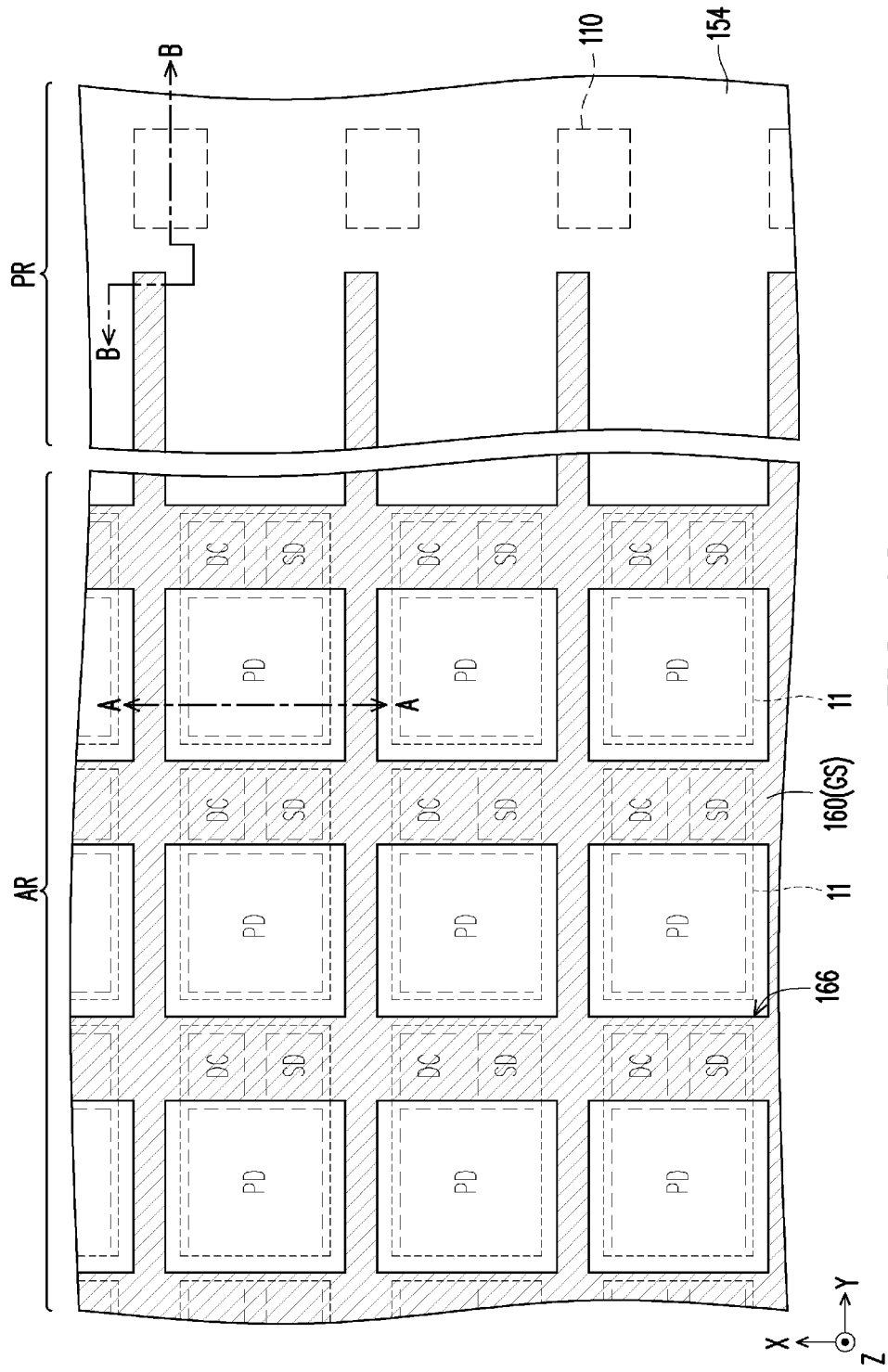

Referring to FIG. 11 and FIG. 12, in some embodiments, a planarizing process is performed on the conductive material layer 160m to form a conductive feature 160 inside the trenches OP1. In the disclosure, for example, the conductive feature 160 is referred to as a conductive grid (or a metal grid, a metallization grid) 160 which is formed inside the grid mesh cavity (constituted by the trenches OP1). As shown in FIG. 11, for example, a top surface S160 of the conductive grid 160 are substantially coplanar to and leveled with the top surface S154 of the dielectric layer 154. For example, the conductive grid 160, the dielectric layer 150 (serving as the dielectric liners) in the trenches OP1 and the dielectric layer 154 (serving as the dielectric liners) in the trenches OP1 are referred to as an isolation structure GS of a grid mesh form, in the disclosure. In some embodiments, a portion of the dielectric layer 150 and a portion of the dielectric layer 154 located within the trenches OP1 are together referred to as a dielectric structure DI1 of the isolation structure GS. One advantageous feature of having such isolation structure GS is that, a bias (e.g. a negative bias Nb in FIG. 24) is applied to the conductive grid 160, which would generate hole accumulations along sidewalls of the isolation structure GS and prevent electrons from being trapped near the isolation structure GS so as to reduce leakage current as well as cross talk between neighboring pixels 11 in the image sensor 10. And thus, the performance of the image sensor 10 is improved. As shown in FIG. 11 and FIG. 12, the isolation structure GS within the active region AR covers the driving circuits DC and the storage devices SD of the pixels 11 and aside of the photosensitive device PD positioned in the regions 166. The regions 166 may be referred to as openings 166 of the isolation structure GS surrounding and exposing the photosensitive device PD. In the alternative embodiment of which the trenches OP1 are FDT, the isolation structure GS within the active region AR aside of the driving circuits DC, the storage devices SD and the photosensitive device PD.

The planarization process may include a grinding process, a CMP process, an etching process, the like, or combinations thereof. During the planarizing process, the dielectric layer 154 may also be planarized. After planarizing, a cleaning process may be optionally performed, for example to clean and remove the residue generated from the planarizing process. However, the disclosure is not limited thereto, and the planarizing process may be performed through any other suitable method.

Figure 13:
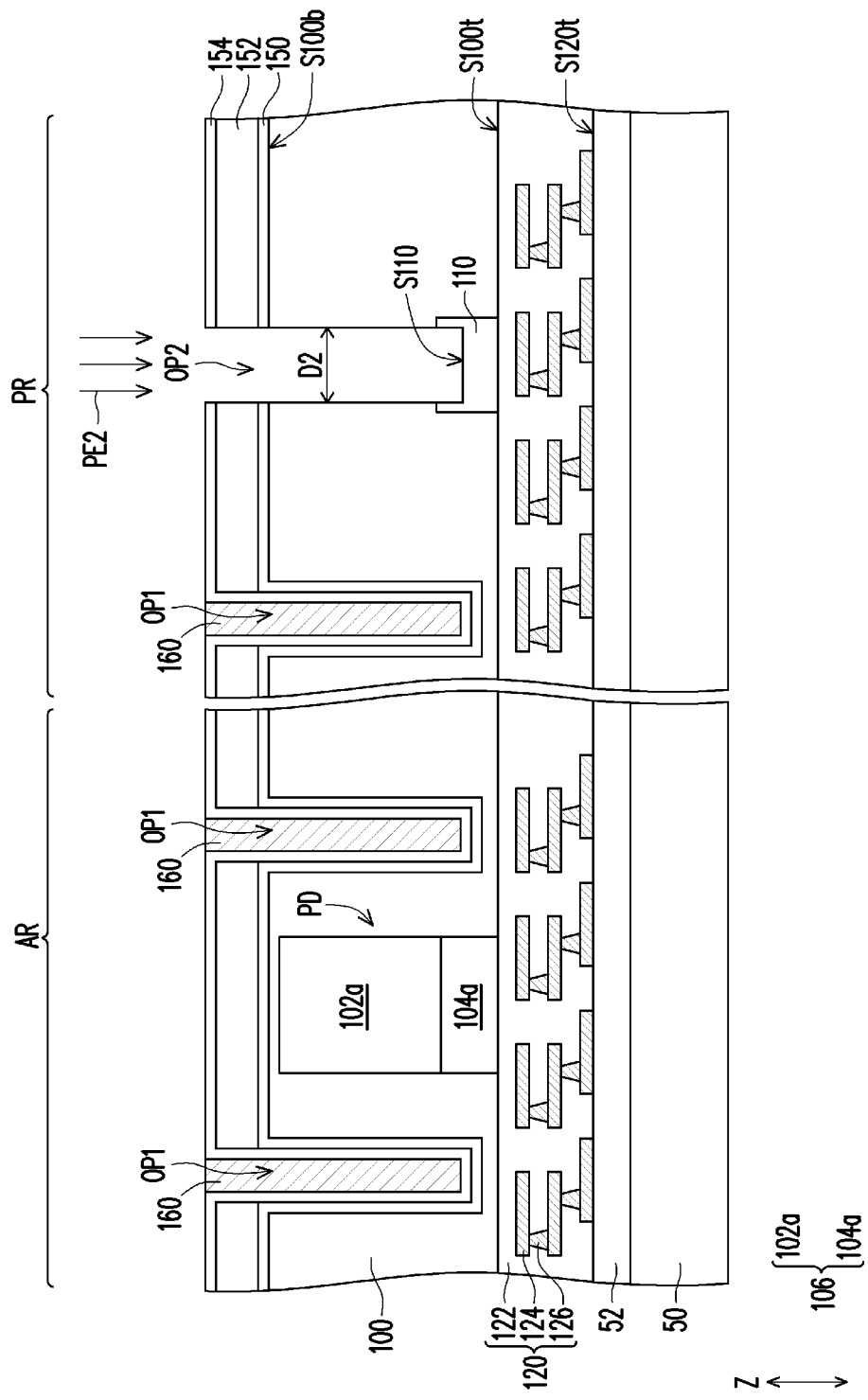
Figure 14:
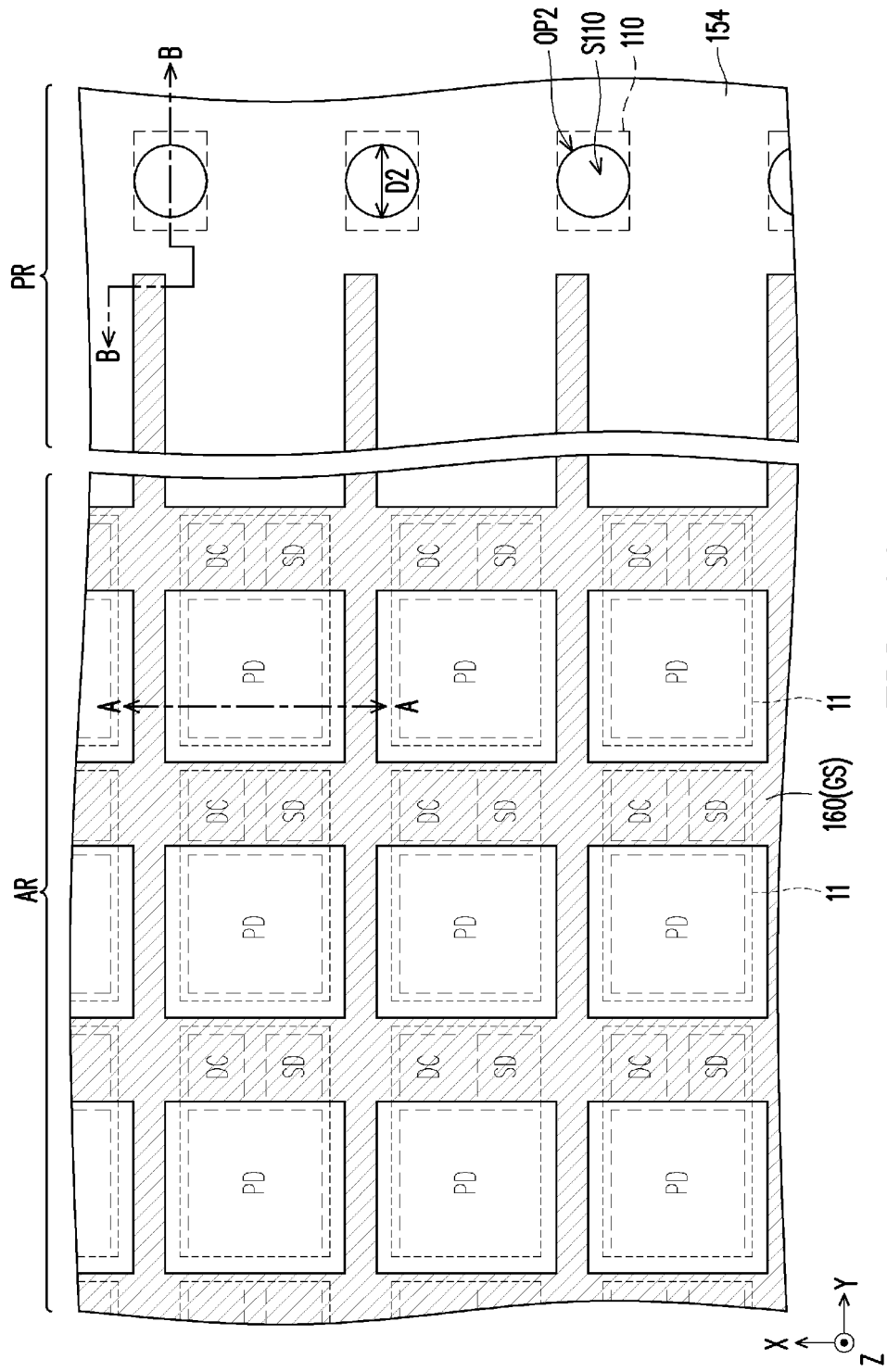

Referring to FIG. 13 and FIG. 14, in some embodiments, a patterning process PE2 is performed to form a plurality of openings OP2 in the semiconductor substrate 100. For example, the openings OP2 are located within the peripherical region PR, where the openings OP2 are at least formed at a side of the conductive grid 160 and are separated from each other. In other words, the openings OP2 are distant away from the conductive grid 160. Alternatively, the openings OP2 may be formed at two or more than two side of the conductive grid 160, the disclosure is not limited thereto. In some embodiments, in the vertical projection on the semiconductor substrate 100 along the direction Z, the openings OP2 are corresponding to (e.g. overlapped with) the second isolations 110. For example, the openings OP2 further extend into a portion of the second isolations 110 and accessibly reveal surfaces S110 of the second isolations 110. If considering a plane view (e.g. the X-Y plane) of the openings OP2, the shape of the openings OP2 may include a circular shape. However, the disclosure is not limited thereto; in an alternative embodiment, the shape of the openings OP2 on the plane view is, for example, rectangular, elliptical, oval, tetragonal, octagonal or any suitable polygonal shape.

In some embodiments, a height of the openings OP2 is less than the thickness T100 of the semiconductor substrate 100. In some embodiments, a width D2 of the openings OP2 is approximately ranging from 0.1 μm to 154 μm, where the width D2 is measured along a direction perpendicular to an extending direction of the openings OP2, as shown in FIG. 13. The patterning process PE2 may be the same or identical to the patterning process PE1 as described in FIG. 7 and FIG. 8 but using a different patterned mask layer, and thus is not repeated herein for brevity. For illustrative purposes, the number of the openings OP2 shown in FIG. 14 does not limit the disclosure, and may be designated and selected based on the demand and layout design.

Figure 15:
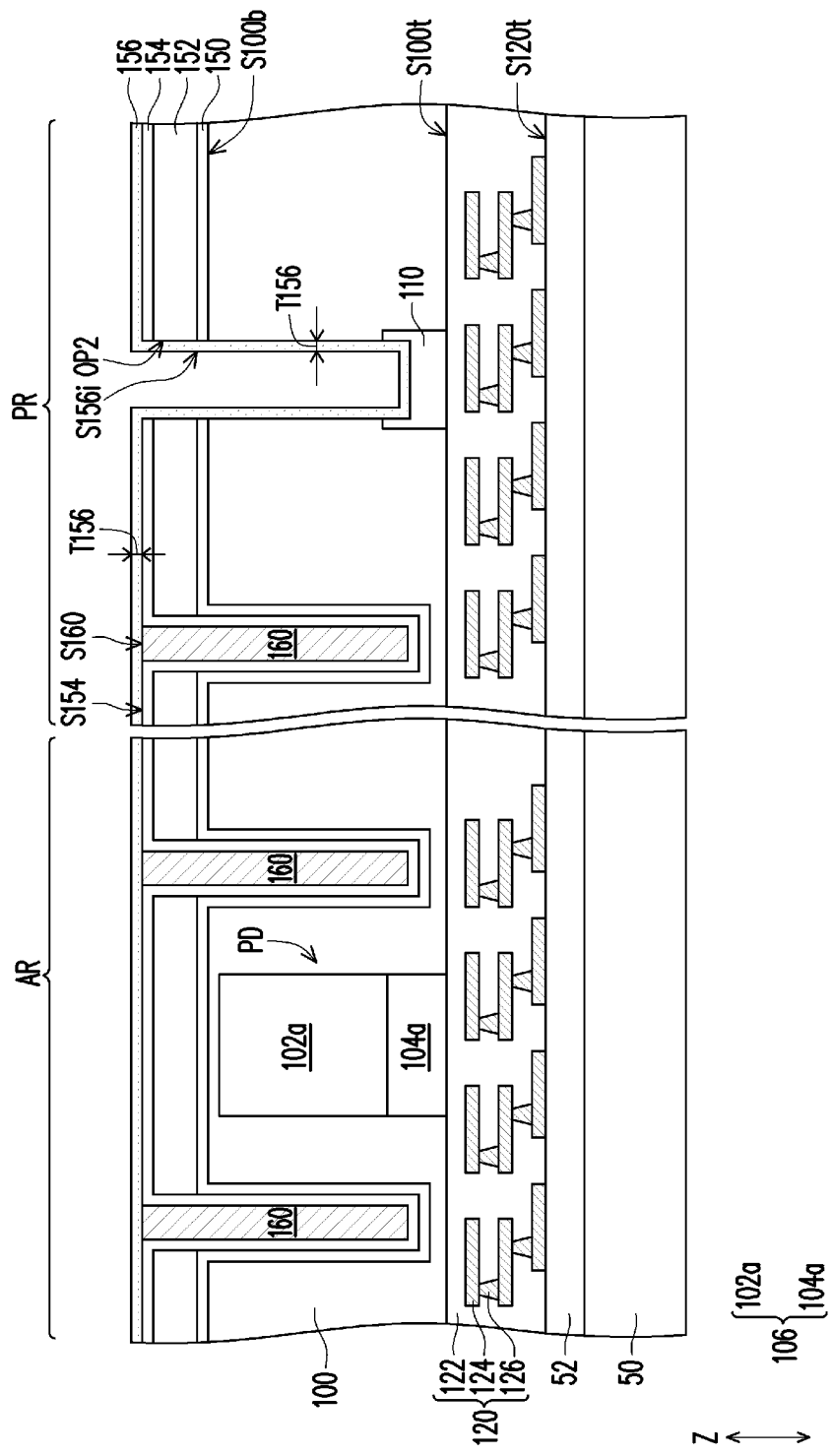
Figure 16:
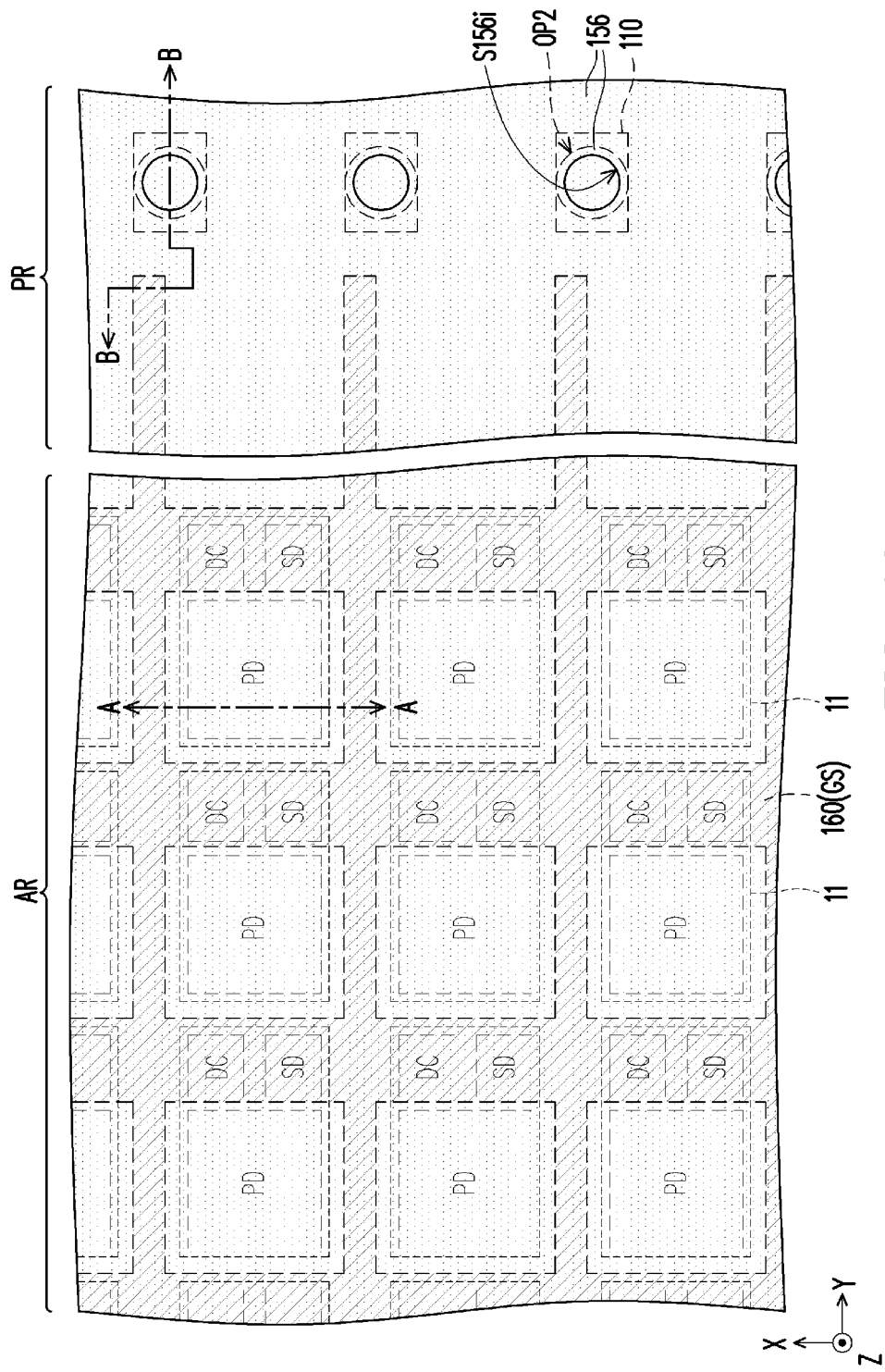

Referring to FIG. 15 and FIG. 16, in some embodiments, a dielectric layer 156 is formed on the dielectric layer 154 and the conductive grid 160, and further extended into the openings OP2. The dielectric layer 156 is conformally formed over the bottom surface S100b of the semiconductor substrate 100, and covers sidewalls (not labeled) and bottom surfaces (not labeled) of the openings OP2, the top surface S154 of the dielectric layer 154 and the top surface S160 of the conductive grid 160. The dielectric layer 156 may also be referred to as a dielectric liner (of the openings OP2). The dielectric layer 156 may include a suitable dielectric material, such as silicon oxide, silicon nitride, or silicon oxynitride. In some embodiments, a thickness T156 of the dielectric layer 156 is approximately ranging from 50A to 5000A. The dielectric layer 156 may be formed using a suitable process having good gap-filling ability, such as atomic layer deposition ALD. As shown in FIG. 15, the thickness T156 of the dielectric layer 156 are less than the thickness T152 of the dielectric layer 152, for example.

Figure 17:
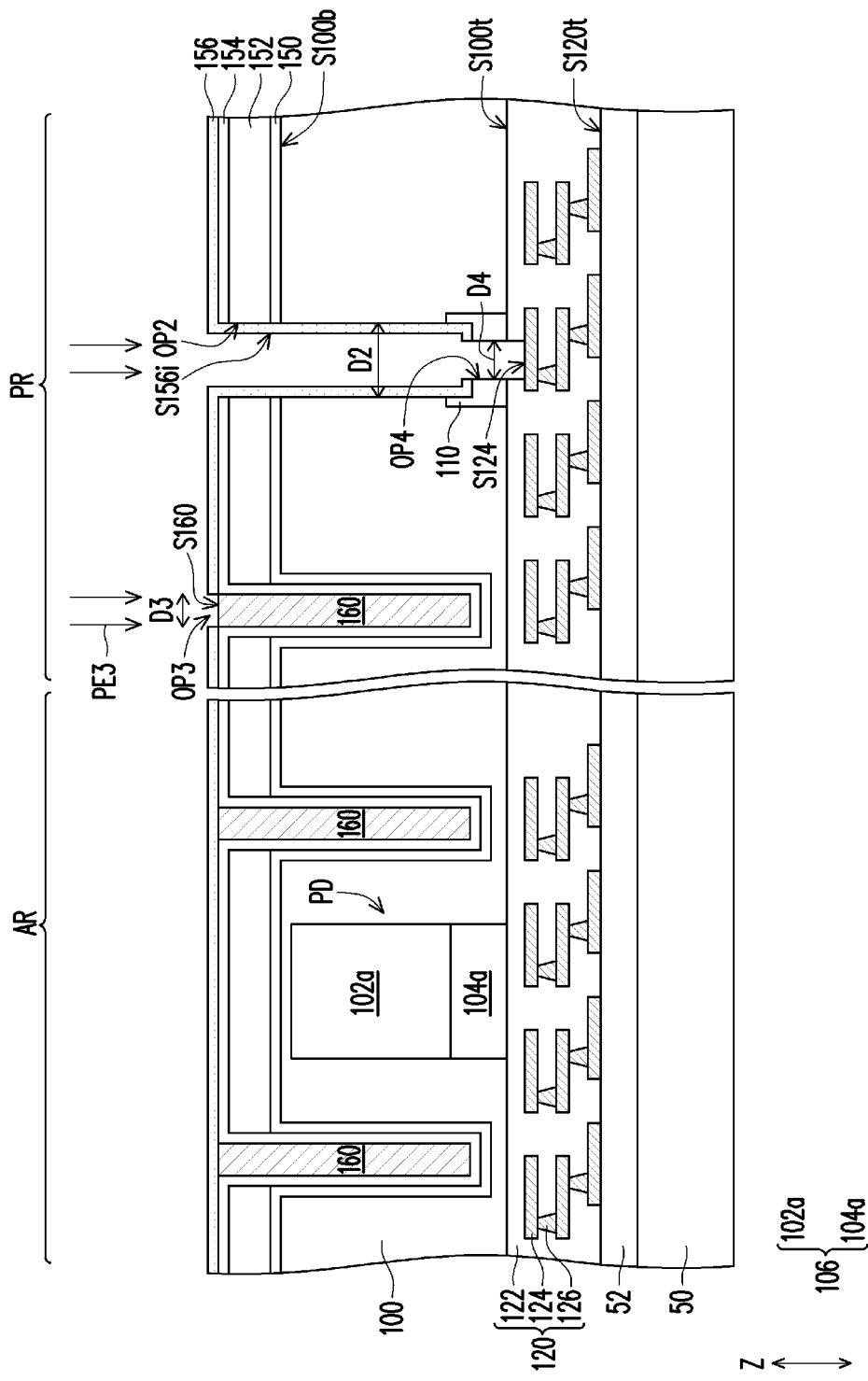
Figure 18:
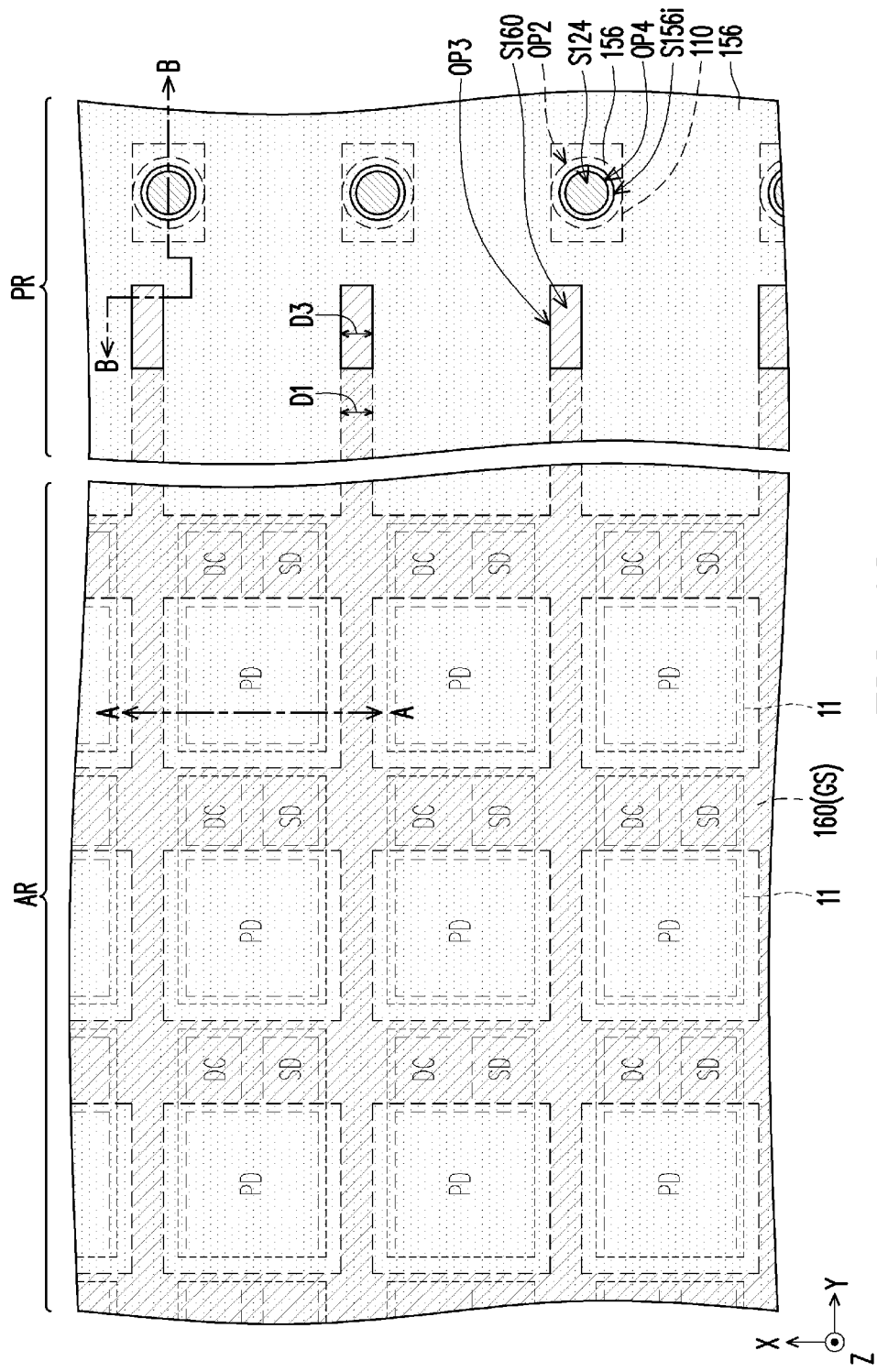

Referring to FIG. 17 and FIG. 18, in some embodiments, a patterning process PE3 is performed to form a plurality of openings OP3 and a plurality of openings OP4 within the peripherical region PR. The patterning process PE3 may be the same or identical to the patterning process PE1 as described in FIG. 7 and FIG. 8 but using a different patterned mask layer, and thus is not repeated herein for brevity.

In some embodiments, the openings OP3 are formed to penetrate the dielectric layer 156 so to accessibly reveal portions of the conductive grid 160 within the peripherical region PR. That is, for example, as shown in FIG. 18, in a vertical projection on the semiconductor substrate 100 along the direction Z, the openings OP3 are overlapped with the conductive grid 160 and expose the top surface S160 of the conductive grid 160. For example, a width D3 of the openings OP3 is approximately ranging from 0.01 μm to 5 μm. Alternatively, the openings OP3 may not extend into the dielectric layer 154. In some embodiments, the width D3 of the openings OP3 is substantially equal to the width D1 of the trenches OP1, as shown in FIG. 18. Alternatively, the width D3 of the openings OP3 may be greater than the width D1 of the trenches OP1, or the width D3 of the openings OP3 may be less than the width D1 of the trenches OP1; as long as an electrical connection between the conductive grid 160 and a later-formed component (e.g. 170 and/or 174 of FIG. 19) is properly established.

On the other hand, the openings OP4 are formed in the openings OP2 to penetrate through the dielectric layer 156 (which overlies on the bottom surface of the openings OP2) and the rest of the second isolation 110, so to expose a layer (e.g. a conductive line 124 being most distant from the top surface S120t) of the metallization layers of the interconnect 120. In other words, a surface S124 of the conductive line 124 is accessibly revealed by the openings OP4. One of the openings OP2 is spatially communicated to a respective one of the openings OP4. For example, a width D4 of the openings OP4 is approximately ranging from 0.08 μm to 14.8 μm, where the width D4 is measured along a direction perpendicular to an extending direction of the openings OP4, as shown in FIG. 17.

If considering a plane view (e.g. the X-Y plane) of the openings OP3 and OP4, the shape of the openings OP3 may include a rectangular shape and the shape of the openings OP4 may include a circular shape. However, the disclosure is not limited thereto; in an alternative embodiment, the shape of the openings OP3 and OP4 on the plane view is, for example, circular, rectangular, elliptical, oval, tetragonal, octagonal or any suitable polygonal shape based on the demand and layout design. For illustrative purposes, the numbers of the openings OP3 and OP4 shown in FIG. 17 does not limit the disclosure, and may be designated and selected based on the demand and layout design. For example, the numbers of the openings OP3 and OP4 may independently be one or more than one.

Figure 19:
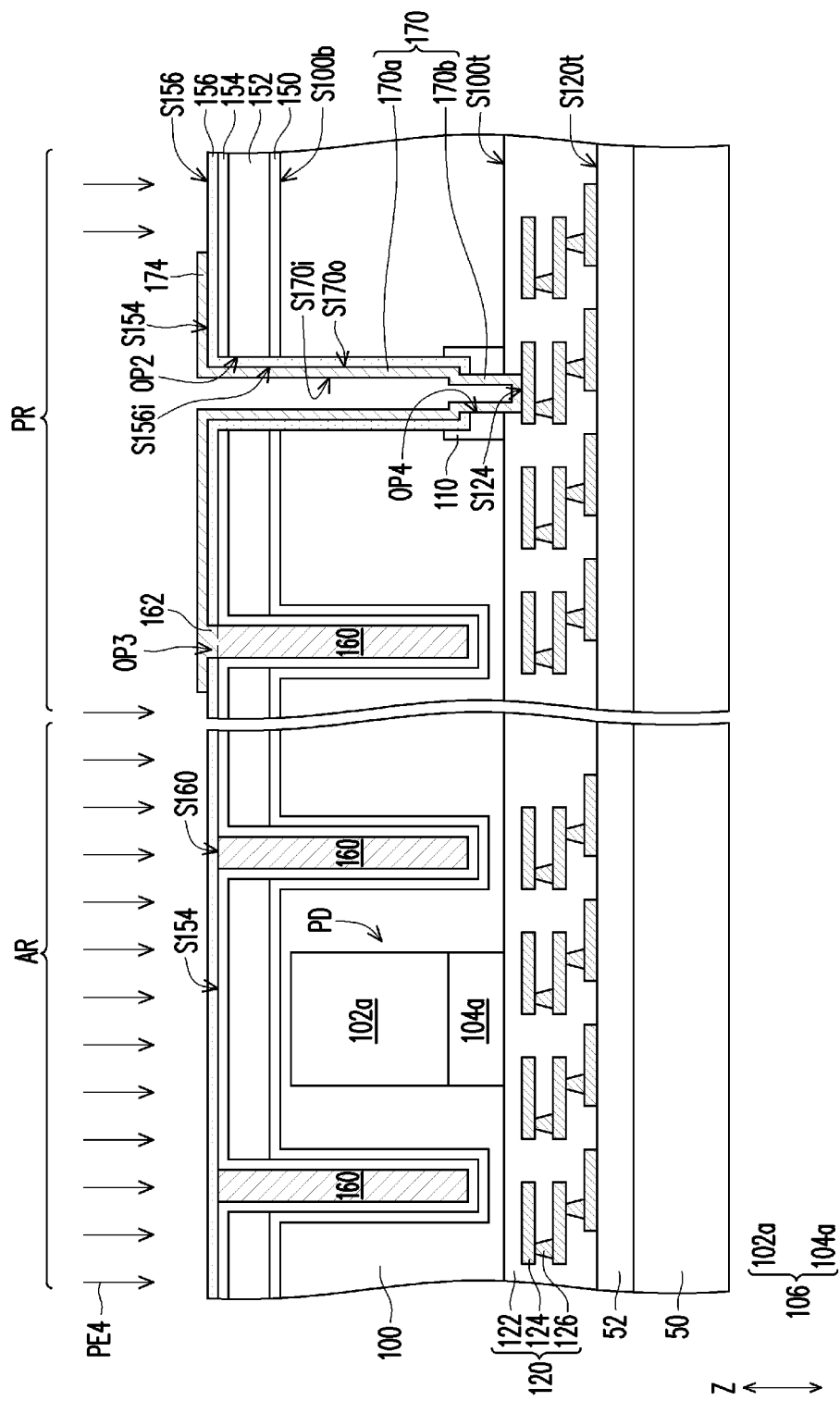
Figure 20:
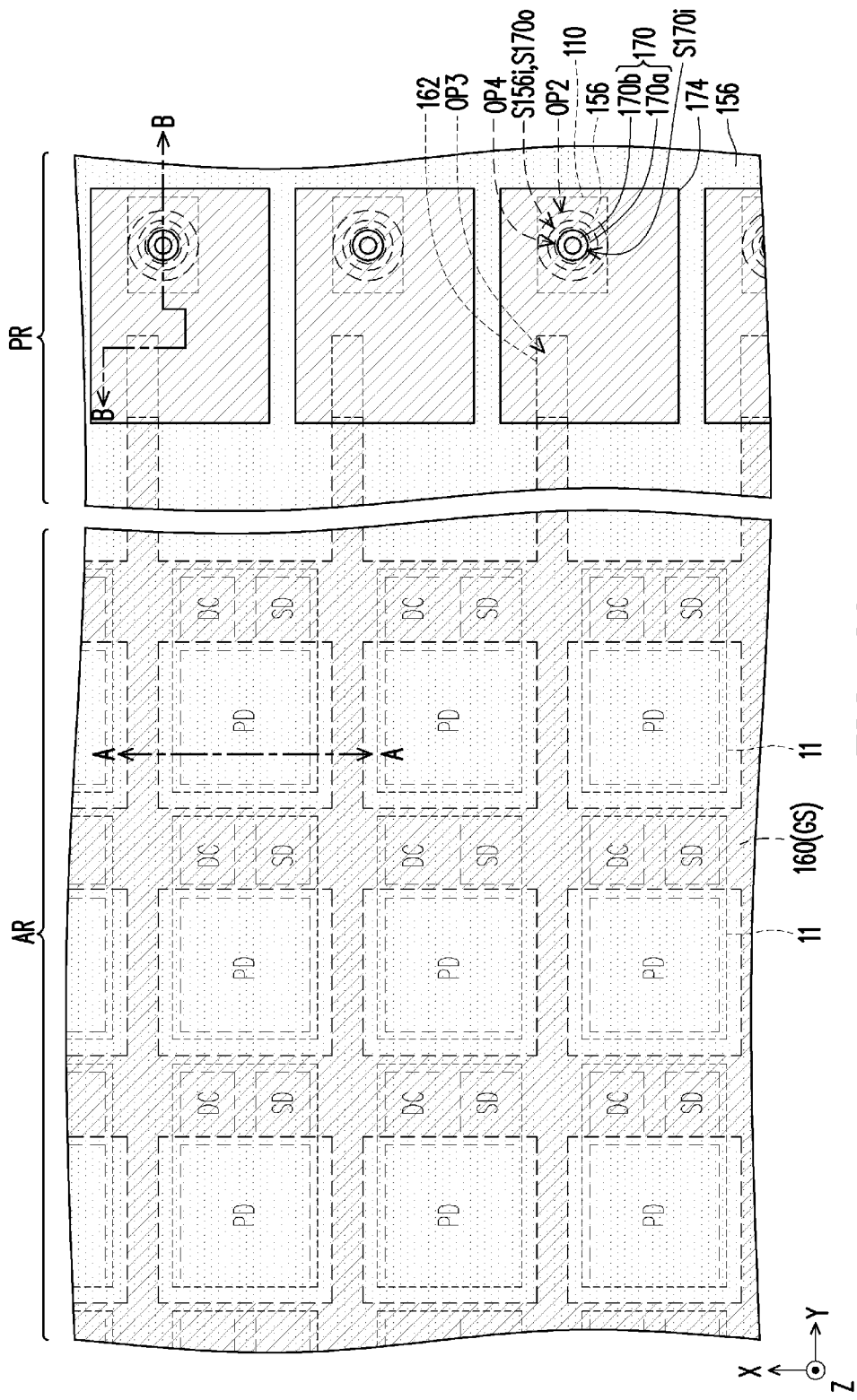

Referring to FIG. 19 and FIG. 20, in some embodiments, a conductive feature including a plurality of conductive features 162, a plurality of conductive features 170 and a plurality of conductive features 174 is formed on the dielectric layer 156 within the peripherical region PR. In some embodiments, the conductive features 162 are electrically connected to the conductive features 170 through the conductive features 174, where the conductive features 162, 170 and 174 are formed integrally.

In some embodiments, the conductive features 162 are formed in the openings OP3 to be in contact with the conductive grid 160, so that the conductive features 162 are electrically connected to the conductive grid 160. For example, as shown in FIG. 19, the conductive features 162 are filled in the openings OP3. For example, illustrated top surfaces (not labeled) of the conductive features 162 are considered as surfaces being substantially coplanar to a top surface S156 of the dielectric layer 156, and illustrated bottom surfaces (not labeled) of the conductive features 162 are considered as surfaces being substantially coplanar to the top surface S160 of the conductive grid 160. However, the disclosure is not limited thereto; alternatively, the conductive features 162 may be formed in a form of conductive liners of the openings OP3.

In some embodiments, the conductive features 170 are formed in the openings OP2 and openings OP4 to be in contact with the exposed layer of the metallization layers of the interconnect 120, so that the conductive features 170 are electrically connected to the interconnect 120. For example, as shown in FIG. 19, the conductive features 170 are formed in a form of conductive liners covering inner sidewalls S156i of the dielectric layer 156 located at the sidewalls of the openings OP2, and further extend into the openings OP4 to cover sidewalls (not labeled) and bottom surfaces (not labeled) of the openings OP4. For example, illustrated top surfaces (not labeled) of the conductive features 170 are considered as surfaces being substantially coplanar to the top surface S156 of the dielectric layer 156. In some embodiments, the conductive features 170 each includes a first portion 170a in the opening OP2 and a second portion 170b in the opening OP4. For example, as shown in FIG. 19, the conductive features 170 are electrically connected to the interconnect 120 by physically and electrically connecting the second portions 170b and the exposed layer of the metallization layers of the interconnect 120, and the conductive features 170 are electrically connected to the conductive features 174 by physically and electrically connecting the first portions 170a and the conductive features 174. The conductive features 170 may be referred to as conductive structures 170, where each first portion 170a may be referred to as a conductive body and each second portion 170b may be referred to a conductive via of the conductive body. As shown in FIG. 19, the conductive structures 170 each have a step-form contour (or profile), where the inner sidewalls S170i and the outer sidewalls S170o of the conductive structure 170 in the cross-sectional view each are a curved line (e.g. not a straight line), for example.

In some embodiments, the conductive features 174 are formed on the top surface S156 of the dielectric layer 156 to be in contact with the conductive features 170 and the conductive features 162, so that the conductive features 174 are electrically connected to the conductive features 162 and 170. In other words, the conductive features 174 are patterned conductive layers extending between the conductive features 162 and the conductive features 170 to provide a proper electrical connection therebetween. For example, illustrated bottom surfaces (not labeled) of the conductive features 174 are considered as surfaces being substantially coplanar to the top surface S156 of the dielectric layer 156. The conductive features 174 may be referred to as conductive patterns 174.

The formation of the conductive feature including the conductive features 162, 170 and 174 may be formed by, but not limited to, forming a conductive material layer (not shown) over the semiconductor substrate 100 along the bottom surface S100b to cover the structure depicted in FIG. 17 and FIG. 18, where the conductive material layer extends into the openings OP2, OP3 and OP4; and a patterning process PE4 is performed on the conductive material layer to simultaneously form the conductive features 162, the conductive features 170 and the conductive features 174. The patterning process PE4 may be the same or identical to the patterning process PE1 as described in FIG. 7 and FIG. 8 but using a different patterned mask layer, and thus is not repeated herein for brevity. The conductive material layer may be the same as or similar to the material of the conductive material layer 160m as described in FIG. 9 and FIG. 10, and thus is not repeated herein for brevity. For an example, the conductive grid 160 is made of Al, and the conductive features 162, 170 and 174 are also made of Al. For another example, the conductive grid 160 is made of Al, and the conductive features 162, 170 and 174 are made of W. As shown in FIG. 19, the conductive grid 160 is electrically connected to the interconnect 120 through the conductive features 162, the conductive structures 170 and the conductive patterns 174, for example.

In the disclosure, although multiple conductive patterns 174 are adopted to electrically connect the conductive structures 170 and the conductive grid 160, there may be one conductive pattern 174 across over and electrically connected to all of the conductive structures 170 for electrically connecting the conductive structures 170 and the conductive grid 160. In other words, for example, one conductive pattern 174 can electrically connect one conductive structure 170 to the conductive grid 160 or electrically connect two or more than two conductive structures 170 to the conductive grid 160. The number of the conductive patterns 174 is not limited in the disclosure. In the disclosure, two or more conductive structures 170 may be connected to one conductive line 124 of the topmost layer of the metallization layers of the interconnect 120, which is simultaneously exposed by the respective two or more openings OP4. For example, every two conductive structures 170 are together connected to one conductive line 124 of the topmost layer of the metallization layers of the interconnect 120, where the conductive line 124 is exposed by two openings OP4. However, the disclosure is not limited thereto; alternatively, each of the conductive structures 170 may be connected to one conductive line 124 of the topmost layer of the metallization layers of the interconnect 120 exposed by a respective one opening OP4, respectively. In other words, the conductive structures 170 are connected to different conductive lines 124 of the topmost layer of the metallization layers of the interconnect 120. Or, two or more conductive structures 170 in a portion of the conductive structures 170 may be connected to one conductive line 124 of the topmost layer of the metallization layers of the interconnect 120, while each conductive structure 170 in the rest of the conductive structures 170 may be connected to one conductive line 124 of the topmost layer of the metallization layers of the interconnect 120.

Figure 21:
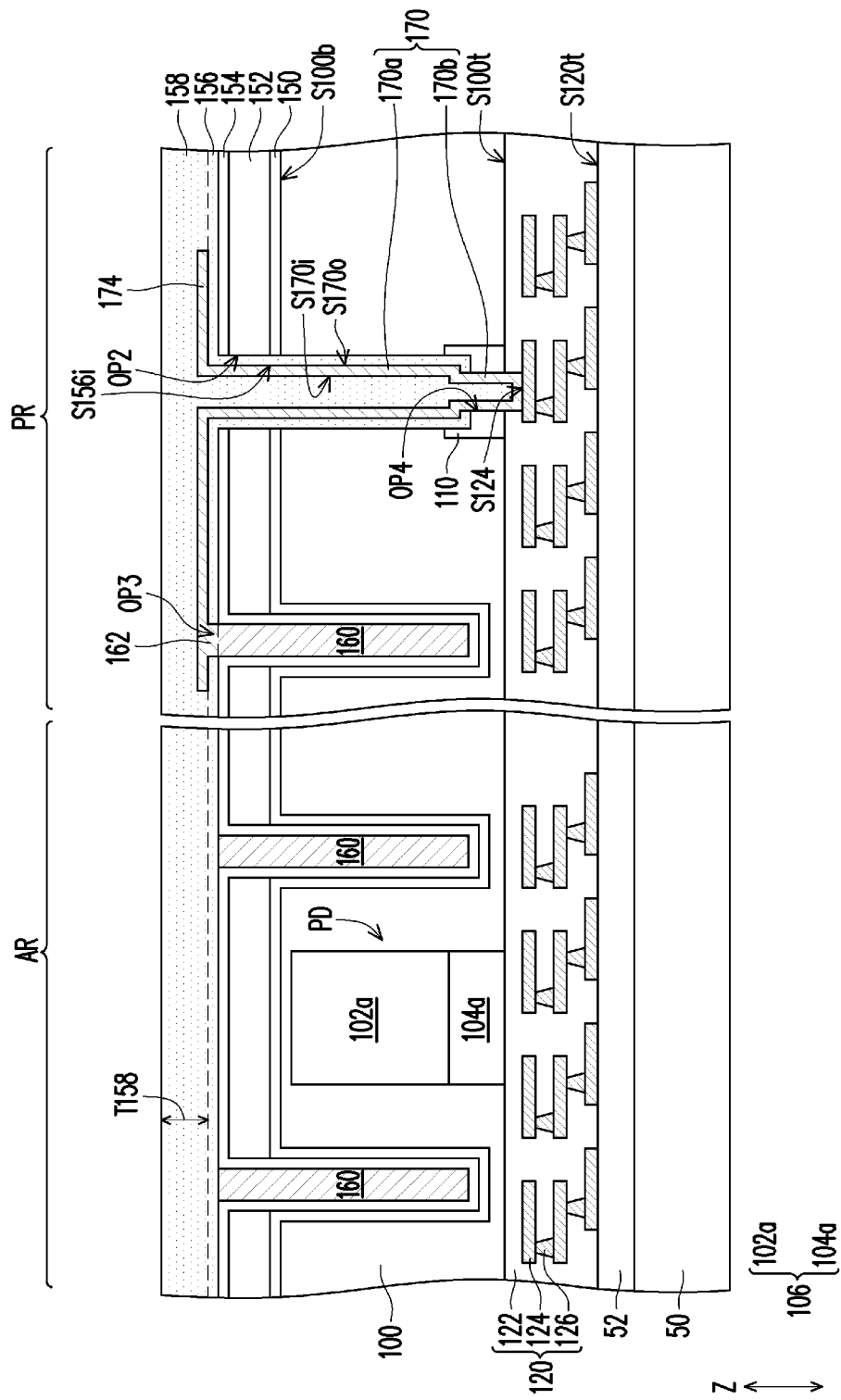
Figure 22:
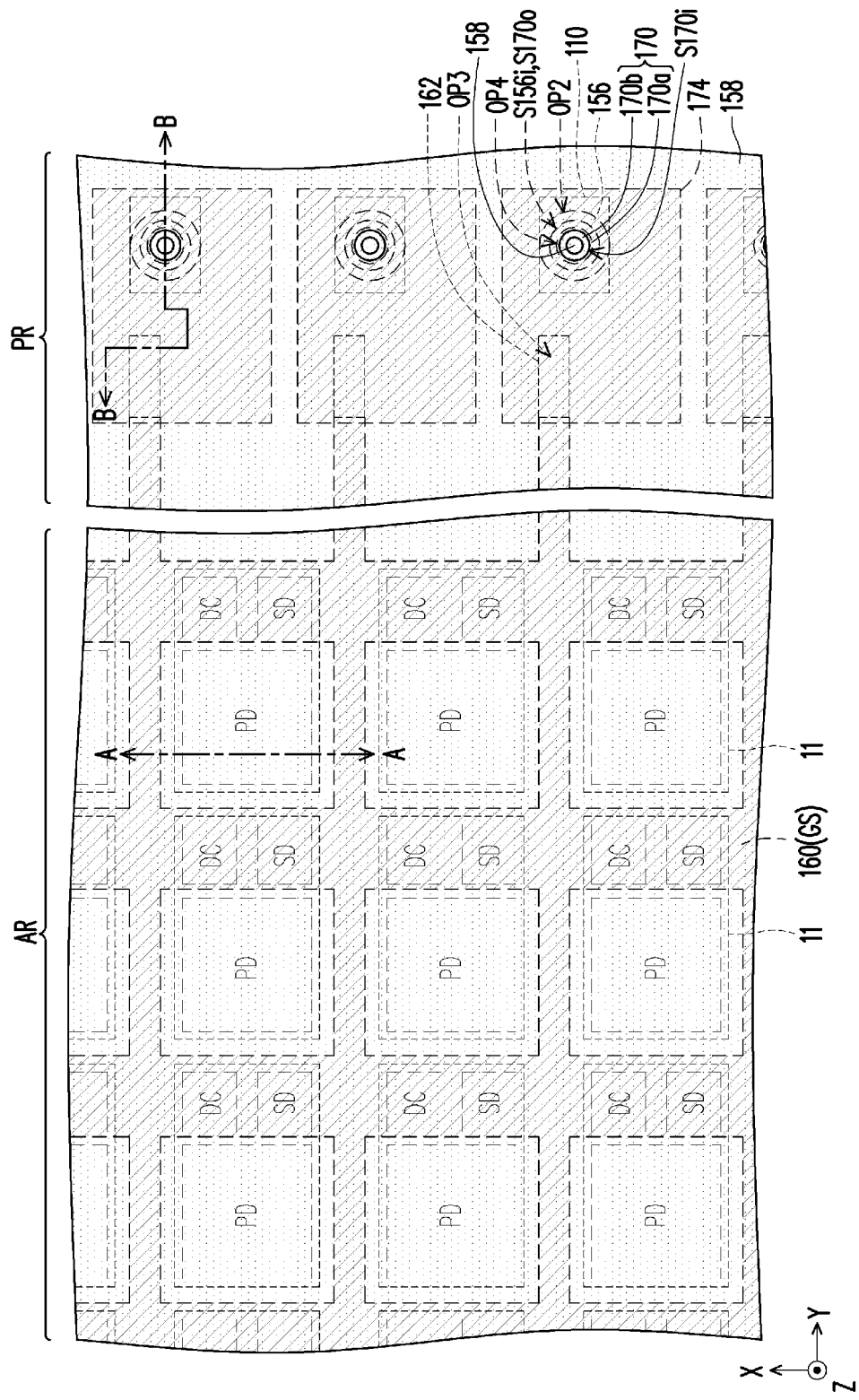

Referring to FIG. 21 and FIG. 22, in some embodiments, a dielectric layer 158 is formed on the structure depicted in FIG. 19 and FIG. 20 to cover the conductive patterns 174. The dielectric layer 158 may include a suitable dielectric material, such as silicon oxide, silicon nitride, or silicon oxynitride. In some embodiments, a thickness T158 of the dielectric layer 158 is approximately ranging from 50A to 5000A. The dielectric layer 158 may be formed using a suitable process such as CVD, physical vapor deposition (PVD), thermal oxidation, UV-ozone oxidation, or a combination thereof. As shown in FIG. 21, the thickness T158 of the dielectric layer 158 are greater than the thickness T156 of the dielectric layer 156, the thickness T154 of the dielectric layer 154 and the thickness T150 of the dielectric layer 150, for example. In some embodiments, the formation of the dielectric layer 158 may further include a planarization process, such as a CMP process, such that the dielectric layer 158 is formed to have a substantially planar top surface. In one embodiment, the material of the dielectric layer 158 may be the same as the material of the dielectric layer 156, where there is no distinct interface between the dielectric layers 156 and 158. In an alternative embodiment, the material of the dielectric layer 158 is different from the material of the dielectric layer 156, where an interface exists between the dielectric layers 156 and 158. The dielectric layer 158 may referred to as a passivation layer having a high degree of planarity and flatness, which is beneficial for the later-formed layers/elements (e.g. color filters, micro lenses, and/or the like).

Figure 23:
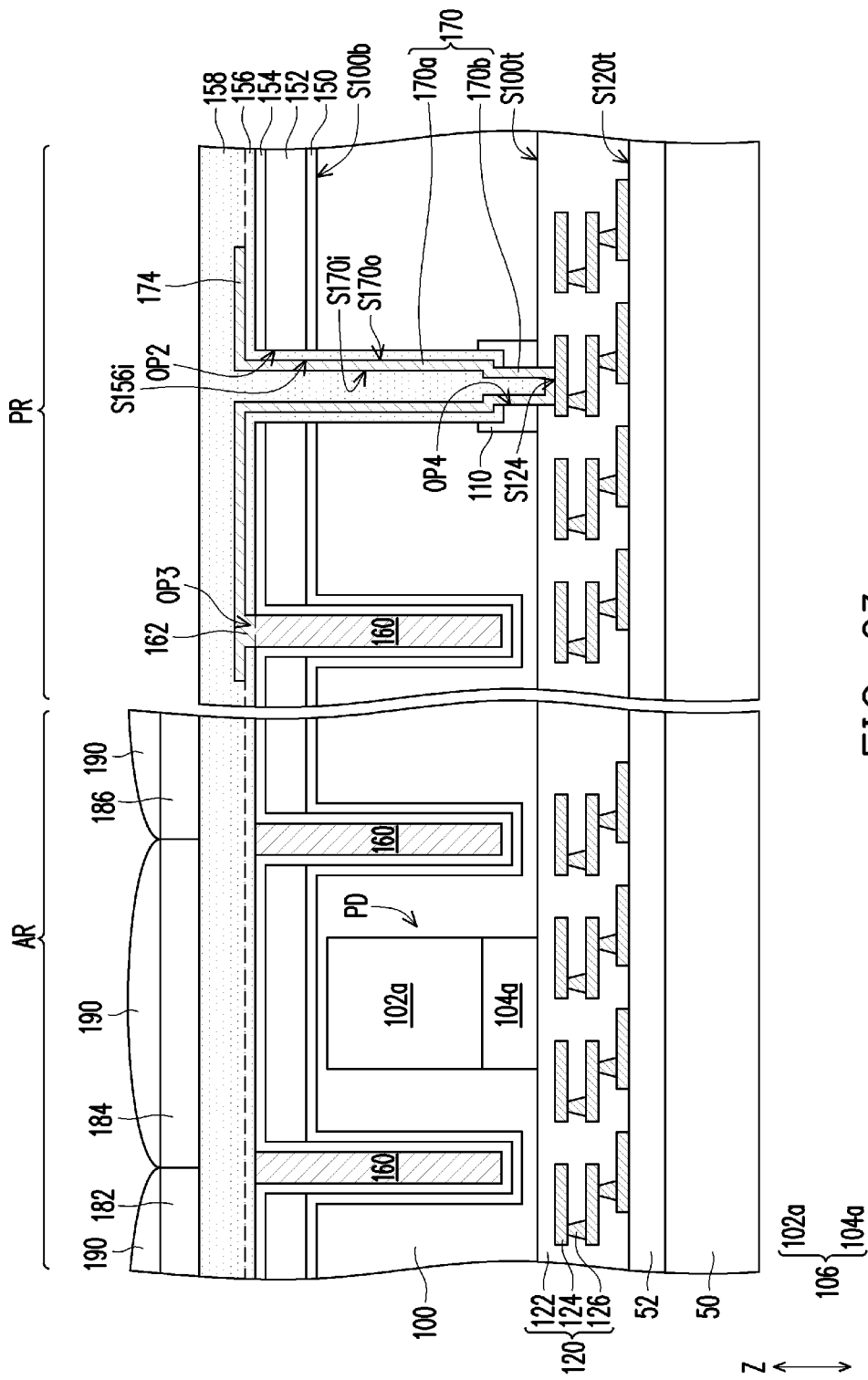

Referring to FIG. 23, in some embodiments, a light filter layer 180 (including a plurality of color filters 182, 184 and 186) and micro-lenses 190 are disposed on the dielectric layer 158 and over the isolation structure GS within the active region AR. As shown in FIG. 23, for example, each of the color filters 182, 184 and 186 is correspond to one photosensitive device PD not covered by the isolation structure GS, where each of the micro-lenses 190 is correspond to one of the color filters 182, 184, and 186. However, the disclosure is not limited thereto; in alternative embodiments, each of the color filters 182, 184 and 186 is correspond to one or more photosensitive devices PD not covered by the isolation structure GS, where each of the micro-lenses 190 is correspond to one of the color filters 182, 184, and 186.

The color filters 182, 184 and 186 have upper surfaces that are approximately even with the top surface of the dielectric layer 158, the color filters 182, 184 and 186 are assigned corresponding colors or wavelengths of light, and configured to filter out all but the assigned colors or wavelengths of light. The color filter assignments alternate between red, green, and blue light, such that the color filters 182, 184 and 186 include red color filters 182, green color filters 184, and blue color filters 186. In some embodiments, the color filter assignments alternate between red, green, and blue light according to a Bayer filter mosaic. Other combinations, such as cyan, yellow, and magenta, may also be used. The number of different colors of the color filters 182, 184 and 186 may also vary. In accordance with an embodiment, the light filter layer 180 may comprise a pigmented or dyed material, such as an acrylic. For example, polymethylmethacrylate (PMMA) or polyglycidylmethacrylate (PGMS) are suitable materials with which a pigment or dye may be added to form the light filter layer 180. Other materials, however, may be used. The light filter layer 180 may be formed by any suitable method known in the art.

The micro lenses 190 are disposed over the light filter layer 180, and are configured to focus the incident light L (FIG. 24) towards the photosensitive devices PD, for example. The micro lenses 190 may be formed of any material that may be patterned and formed into lenses, such as a high transmittance, acrylic polymer. The micro lenses 190 may be formed by any suitable method known in the art. The micro lenses 190 are centered with the photosensitive devices PD of the corresponding pixels 11, and are symmetrical about vertical axes centered on the photosensitive devices PD, as shown in FIG. 23. Further, neighboring edges of the micro lenses 190 abut against each other.

Figure 24:
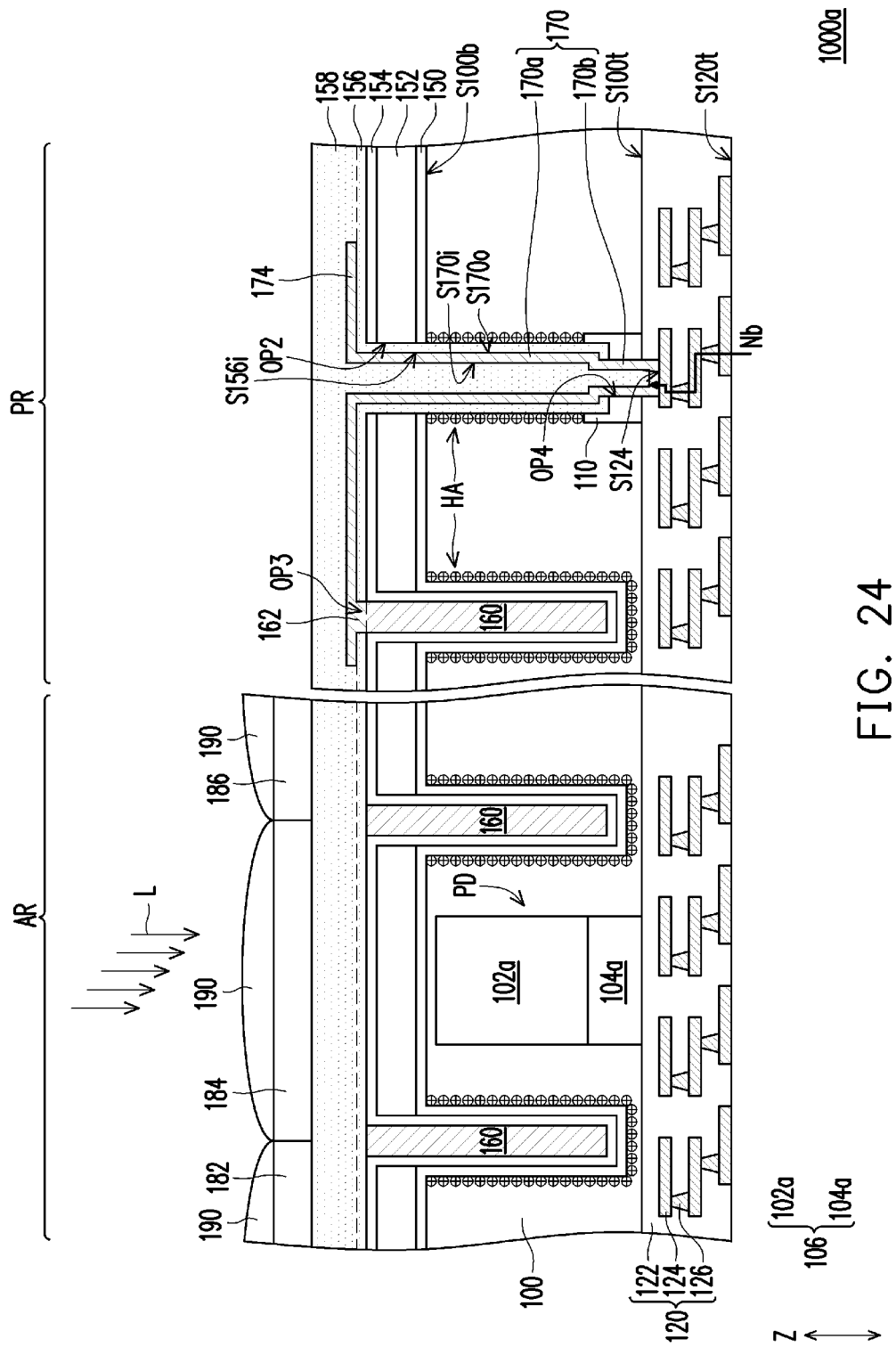

Referring to FIG. 24, in some embodiments, the carrier 50 is debonded from the interconnect 120 to expose the top surface S120t. In some embodiments, the top surface S120t of the interconnect 120 is easily separated from the carrier 50 due to the debond layer 52. In some embodiments, the carrier 50 is detached from the top surface S120t of the interconnect 120 through a debonding process, and the carrier 50 and the debond layer 52 are removed. In certain embodiments, the outermost layer (e.g. 124) of the metallization layers of the interconnect 120 is accessibly revealed, as show in FIG. 24. In one embodiment, the debonding process is a laser debonding process. Up to here, the image sensor device 1000a is manufactured.

It is appreciated that a dicing (singulation) process is performed to cut a plurality of the image sensor device 1000a interconnected therebetween into individual and separated (semiconductor) image sensor device 1000a as the image sensor device 1000a is done in a wafer level process. In one embodiment, the dicing (singulation) process is a wafer dicing process including mechanical blade sawing or laser cutting, however the disclosure is not limited thereto. During the debonding step, the structure depicted in FIG. 23 is flipped (turned upside down) and secured by a holding device (not shown) before debonding the carrier 50 and the debond layer 52. After the debonding process and the dicing (singulation) process, the image sensor devices 1000a are released from the holding device.

As illustrated in FIG. 24, for example, since the image sensor device 1000a includes the semiconductor substrate 100 of P-type, the negative bias Nb is applied to the interconnect 120, where the negative bias Nb is transmitted to the conductive grid 160 through the conductive structures 170 formed in the peripherical region PR electrically connected to the interconnect 120, the high concentration of negative charges in the isolation structure GS would generate hole accumulations (denoted as "HA") along sidewalls of the isolation structure GS and prevent electrons in the semiconductor substrate 100 from being trapped near the isolation structure GS so as to reduce leakage current as well as cross talk between neighboring pixels 11. However, the disclosure is not limited thereto; in an alternative embodiments (not shown) of which the image sensor device 1000a includes the semiconductor substrate 100 of n-type, the positive bias is applied to the conductive grid 160 through the conductive structures 170 formed in the peripherical region PR electrically connected to the interconnect 120, the high concentration of positive charges in the isolation structure GS would generate electron accumulations along sidewalls of the isolation structure GS and prevent electron holes in the semiconductor substrate 100 from being trapped near the isolation structure GS so as to reduce leakage current as well as cross talk between neighboring pixels 11. With such isolation structure GS, a better isolation for the photosensitive devices PD is provided, and thus improving the performance of the image sensor 10.

Figure 25:
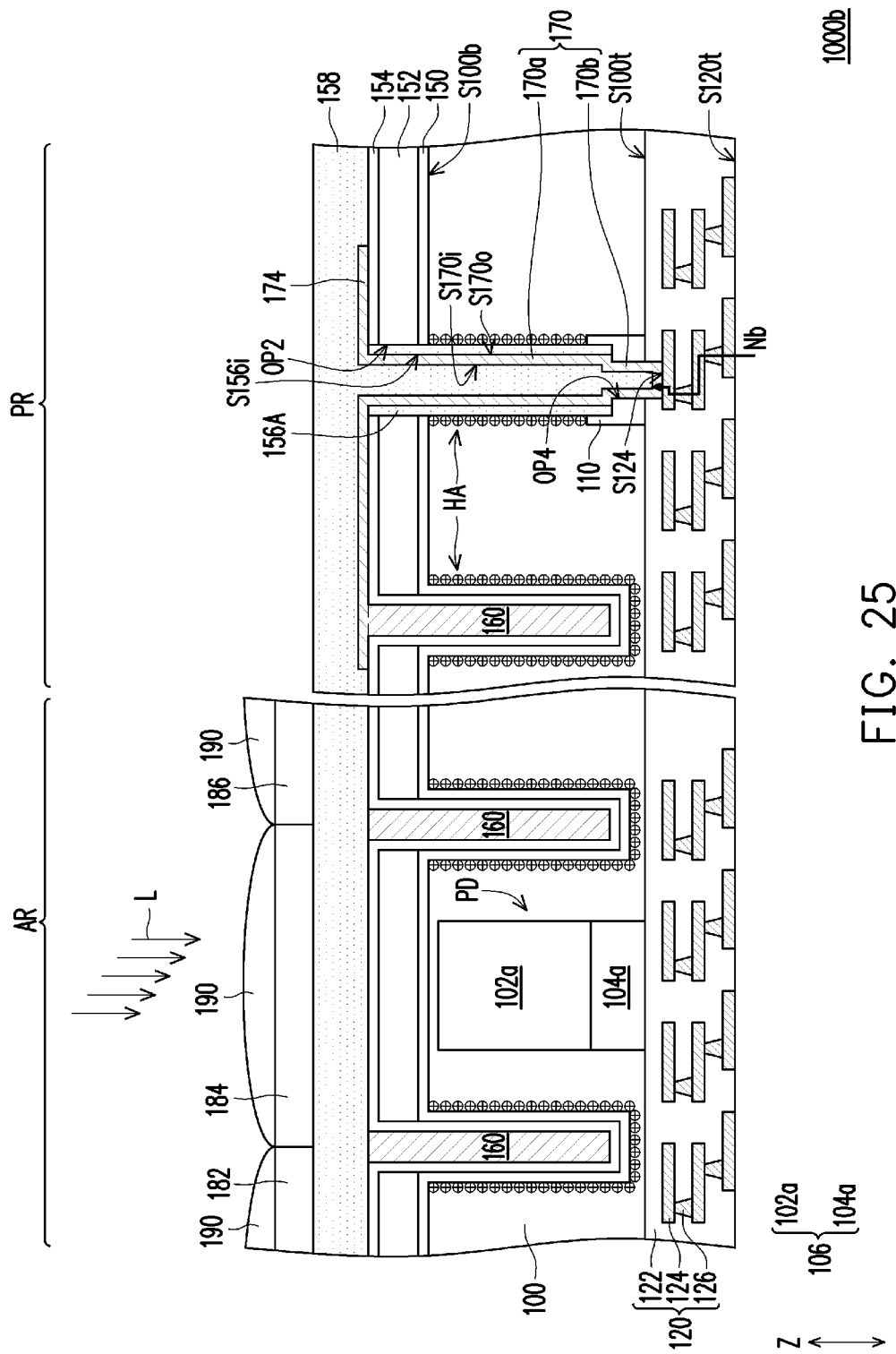
FIG. 25 is a schematic vertical (or cross-sectional) view showing an image sensor, in a (semiconductor) image sensor die in accordance with some alternative embodiments of the disclosure.

In alternative embodiments, a portion of the dielectric layer 156 extending along the X-Y plane is removed. FIG. 25 is a schematic vertical view showing an image sensor included in a semiconductor structure (e.g. a (semiconductor) image sensor device 1000*b*) in accordance with some alternative embodiments of the disclosure. The elements similar to or substantially the same as the elements described previously will use the same reference numbers, and certain details or descriptions of the same elements may not be repeated herein. The image sensor devices 1000*b* of FIG. 25 is similar to the image sensor devices 1000*a* of FIG. 24, the difference is that, in the image sensor devices 1000*b* of FIG. 25, the dielectric layer 156 is substituted by a dielectric layer 156A and the conductive features 162 are omitted. For example, as shown in FIG. 25, the dielectric layer 156A is only disposed at the sidewalls of the openings OP2.

In some embodiments, in the vertical projection on the semiconductor substrate 100 along the direction Z, the dielectric layer 156A is only located within the openings OP2 and the dielectric layer 156A is not overlapped with the conductive structures 170. The dielectric layer 156A is referred to as a dielectric liner of the openings OP2. The formation and material of the dielectric layer 156A is similar to the process and material of forming the dielectric layer 156 as described in FIG. 15 through FIG. 18 except using an etching mask with a different pattern, and thus are not repeated herein. Alternatively, the dielectric layer 156A may be also formed by a blanket etching process, where no photomask is used as an etching mask during etching, and which will be discussed in greater detail later in conjunction with FIG. 29 through FIG. 38. With such configuration, without reducing the isolation ability of the isolation structure GS, an overall thickness of the image sensor device (e.g. 1000*b*) is further reduced. For example, an overall thickness (in direction Z) of the image sensor device 1000*b* is less than the overall thickness (in direction Z) of the image sensor device 1000*a*.

Figure 26:
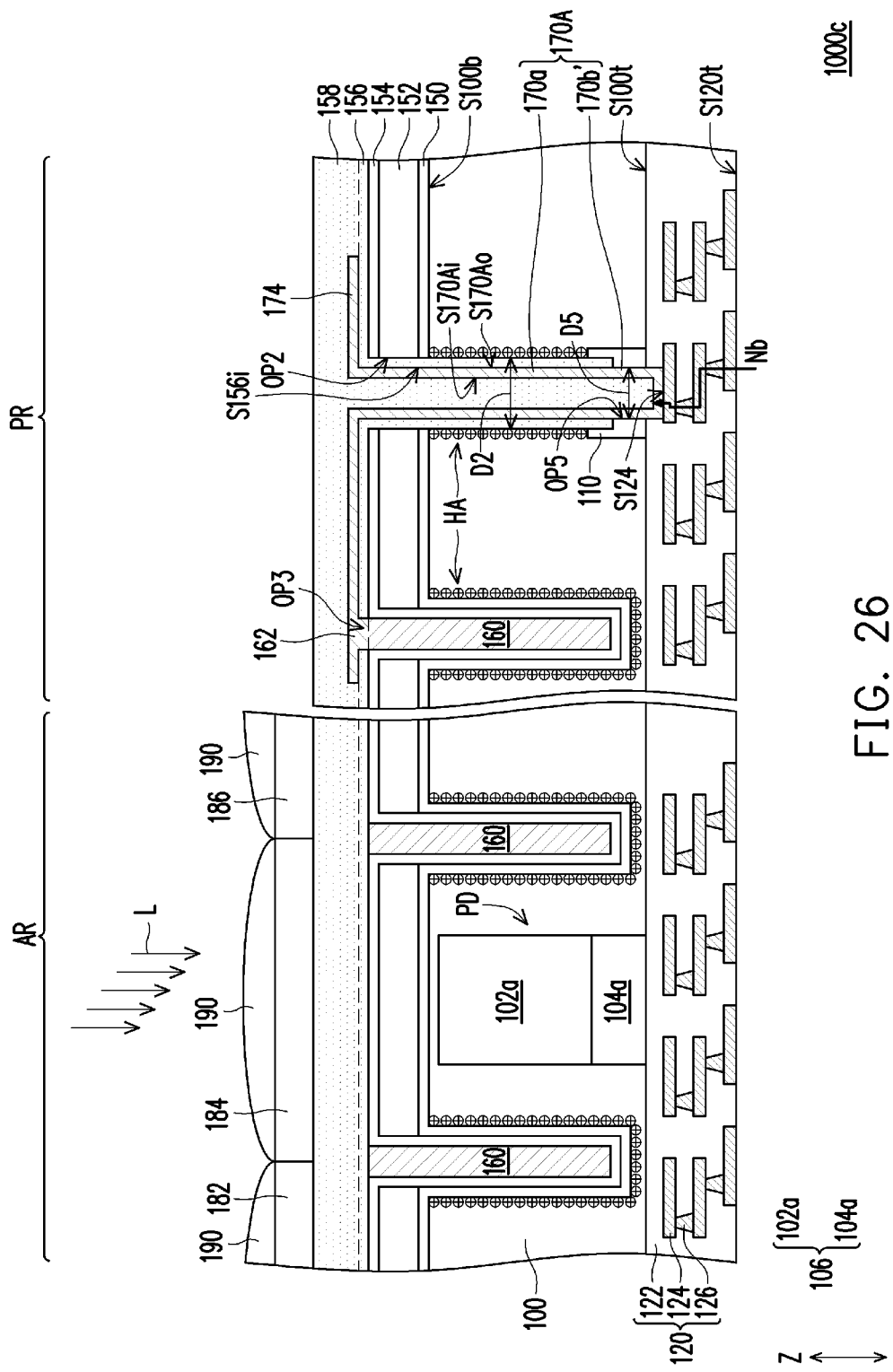
FIG. 26 and FIG. 27 are schematic vertical (or cross-sectional) and horizontal (or plane) views showing an image sensor, in a (semiconductor) image sensor die in accordance with some alternative embodiments of the disclosure.
Figure 27:
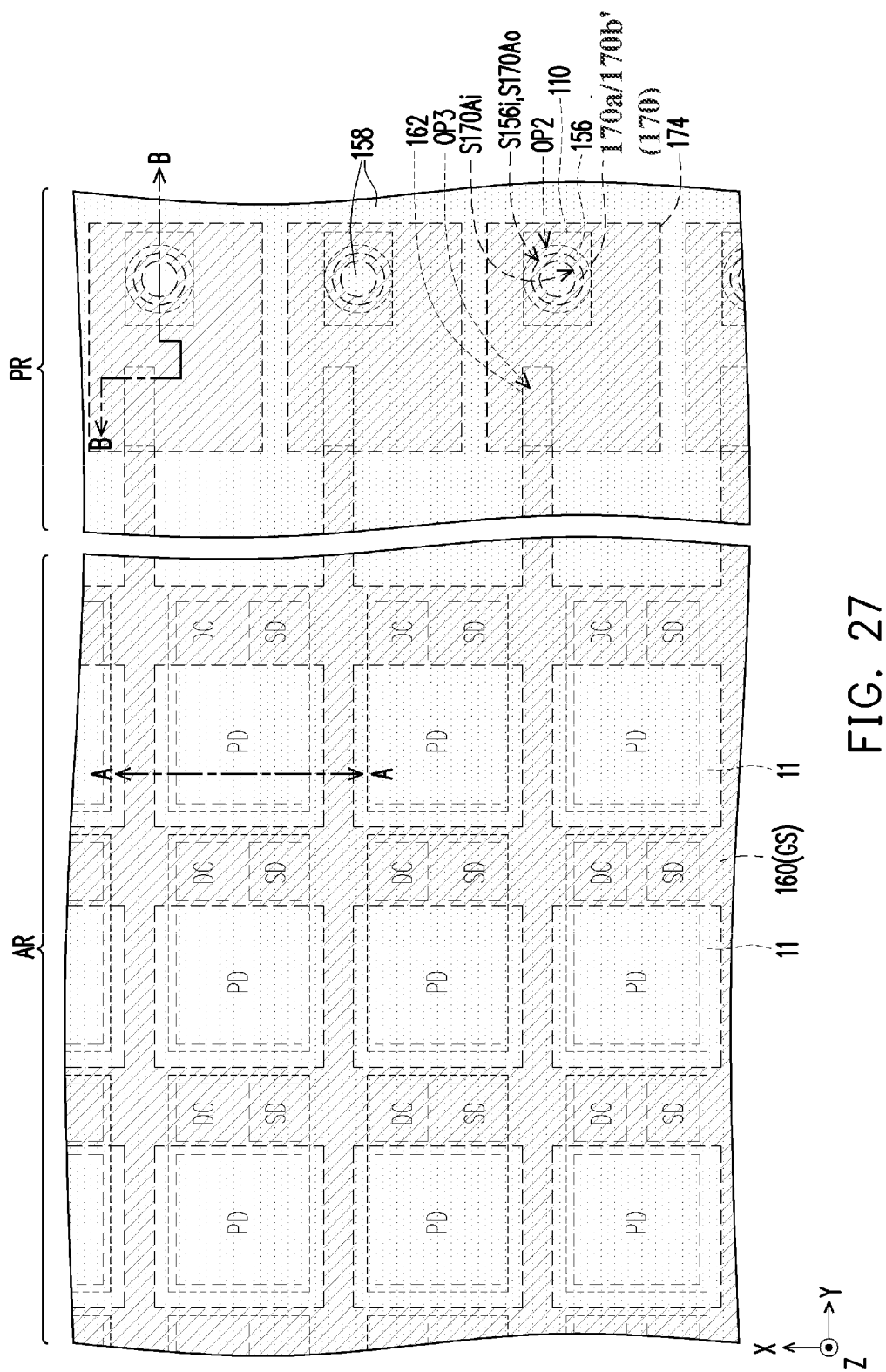
Figure 28:
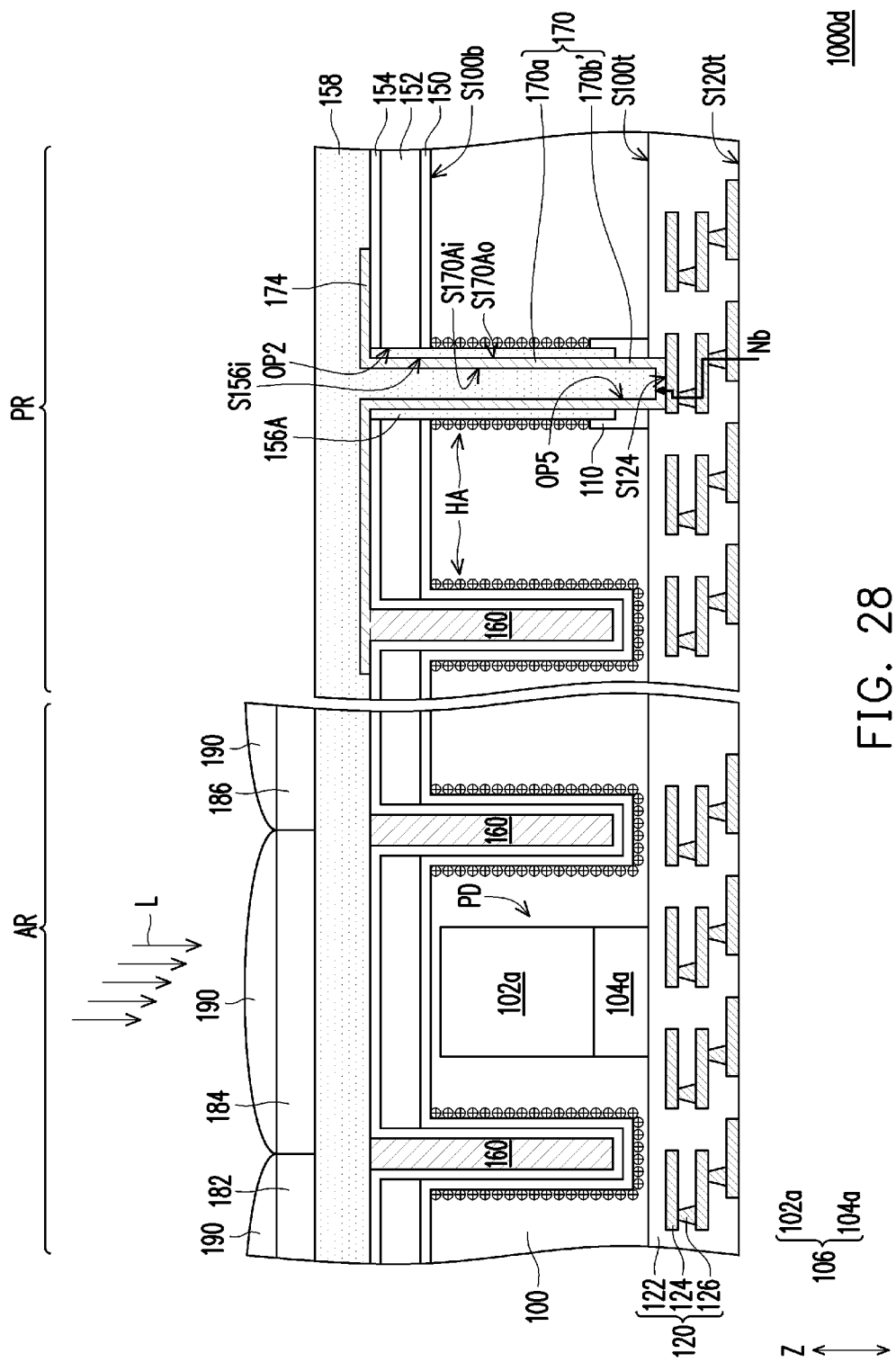
FIG. 28 is a schematic vertical (or cross-sectional) view showing an image sensor, in a (semiconductor) image sensor die in accordance with some alternative embodiments of the disclosure.

Alternatively, the conductive structures each may have a contour (or profile) of a non-step form, such as conductive structures 170A. FIG. 26 and FIG. 27 are schematic vertical and horizontal views showing an image sensor included in a semiconductor structure (e.g. a (semiconductor) image sensor device 1000*c*) in accordance with some alternative embodiments of the disclosure. FIG. 28 is a schematic vertical view showing an image sensor included in a semiconductor structure (e.g. a (semiconductor) image sensor device 1000*d*) in accordance with some alternative embodiments of the disclosure. The elements similar to or substantially the same as the elements described previously will use the same reference numbers, and certain details or descriptions of the same elements may not be repeated herein. The image sensor devices 1000*c* of FIG. 26 and FIG. 27 is similar to the image sensor devices 1000*a* of FIG. 24, the difference is that, in the image sensor devices 1000*c* of FIG. 26 and FIG. 27, the conductive structures 170 are substituted by the conductive structures 170A. For example, as shown in the cross-sectional view of FIG. 26, inner sidewalls S170Ai and outer sidewalls S170Ao of the conductive structures 170A are a straight line (e.g. not a curved line). In other words, there is no bend at the inner sidewalls S170Ai and the outer sidewalls S170Ao of the conductive structures 170A.

In some embodiments, as shown in FIG. 26 and FIG. 27, instead of forming the openings OP4, a plurality of the openings OP5 are formed to penetrate the second isolations 110, where sidewalls of the openings OP5 are aligned with the inner sidewalls S156*i* of the dielectric layer 156. For example, a width D5 of the openings OP5 is approximately ranging from 0.08 μm to 14.8 μm, where the width D5 is measured along a direction perpendicular to an extending direction of the openings OP5, as shown in FIG. 26. In some embodiments, the size (e.g. D5) of the openings OP5 is greater than the size (e.g. D4) of the openings OP4. The formation and material of the openings OP5 is similar to the process and material of forming the openings OP4 as described in FIG. 17 through FIG. 18 except using an etching mask with a different pattern, and thus are not repeated herein. In some embodiments, a width of the conductive structures 170A is constant, as measured along the direction (e.g. the direction X and/or Y) perpendicular to the direction Z. Owing to the conductive structures 170A, a contact area between the conductive structures 170A and the interconnect 120 is increased, which reduces the contact resistance therebetween; thereby enhancing the isolation ability of the isolation structure GS and further improving the performance of the image sensor 10.

Alternatively, similar to the image sensor device 1000*b*, the dielectric layer 156 of the image sensor device 1000*c* may be substituted by the dielectric layer 156A, which omits the presence of the conductive features 162, see the image sensor device 1000*d* as shown in FIG. 28.

FIG. 29 through FIG. 38 are schematic vertical and horizontal views showing a method of manufacturing an image sensor included in an semiconductor structure (e.g. a (semiconductor) image sensor device 2000*a*) in accordance with some embodiments of the disclosure, where FIG. 29, FIG. 31, FIG. 33, FIG. 35 and FIG. 37 are the cross-sectional views taken along lines A-A and B-B depicted in FIG. 30, FIG. 32, FIG. 34, FIG. 36 and FIG. 38. The elements similar to or substantially the same as the elements described previously will use the same reference numbers, and certain details or descriptions of the same elements may not be repeated herein.

Figure 29:
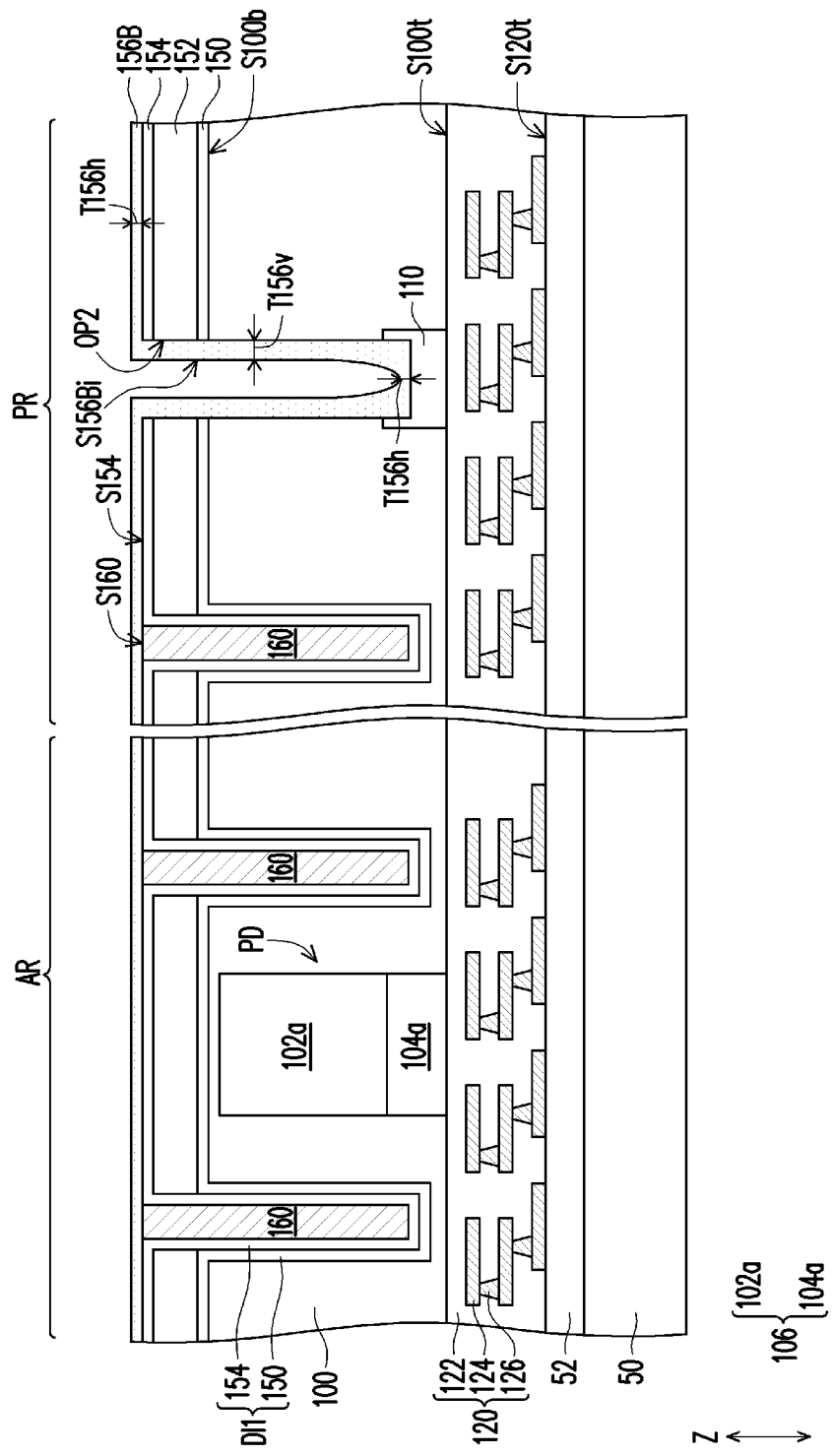
FIG. 29, FIG. 31, FIG. 33, FIG. 35, FIG. 37 and FIG. 38 are schematic vertical (or cross-sectional) views showing a method of manufacturing an image sensor, in a (semiconductor) image sensor die in accordance with some embodiments of the disclosure.
Figure 30:
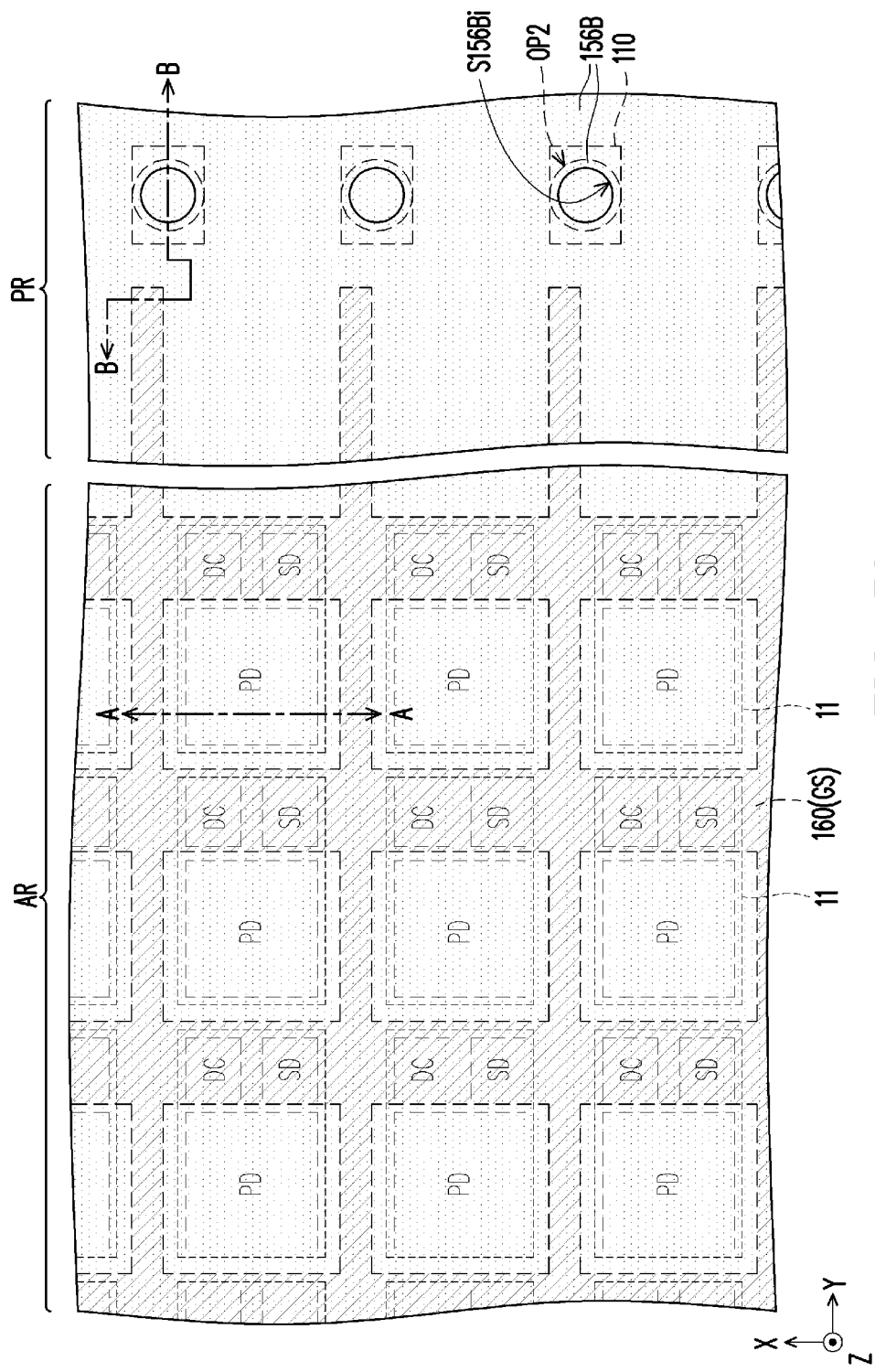
FIG. 30, FIG. 32, FIG. 34 and FIG. 36 are schematic horizontal (or plane) views illustrating a relative position of components included in the image sensor depicted in FIG. 29, FIG. 31, FIG. 33 and FIG. 35.

Referring to FIG. 29 and FIG. 30, in some embodiments, a dielectric layer 156B is formed on the dielectric layer 154 and the conductive grid 160 and further extended into the openings OP2, following the process as described in FIG. 13 and FIG. 14. For example, as shown in FIG. 29, the dielectric layer 1568 covers sidewalls and bottom surfaces of the openings OP2, the top surface S154 of the dielectric layer 154 and the top surface S160 of the conductive grid 160. In some embodiments, the dielectric layer 1568 has a first portion (not labeled) extending along the X-Y plane outside the openings OP2, a plurality of second portions (not labeled) extending along the direction Z inside the openings OP2 and a plurality of third portions (not labeled) extending along the X-Y plane inside the openings OP2, where the third portions each are connected to the first portion by the second portions. In some embodiments, the first portion and the third portions of the dielectric layer 1568 each have a thickness T156*h* approximately ranging from 50Å to 5000Å as measured along the direction Z. In some embodiments, the second portions of the dielectric layer 1568 each have a thickness T156*v* approximately ranging from 50Å to 5000Å as measured along the direction (e.g. X and/or Y) perpendicular to the direction Z. For example, the thickness T156*h* is less than the thickness T156v. Alternatively, the thickness T156h may be substantially equal to the thickness T156v. As shown in FIG. 29, the thickness T156h is constant while the thickness T156v is gradually increased from the top openings toward the bottom surfaces of the openings OP2, for example. That is, the thickness T156v is non-constant. The formation and material of the dielectric layer 156B are similar to or the same as the process and the material of the dielectric layer 156 as described in FIG. 15 and FIG. 18, and thus is not repeated herein for brevity.

Figure 31:
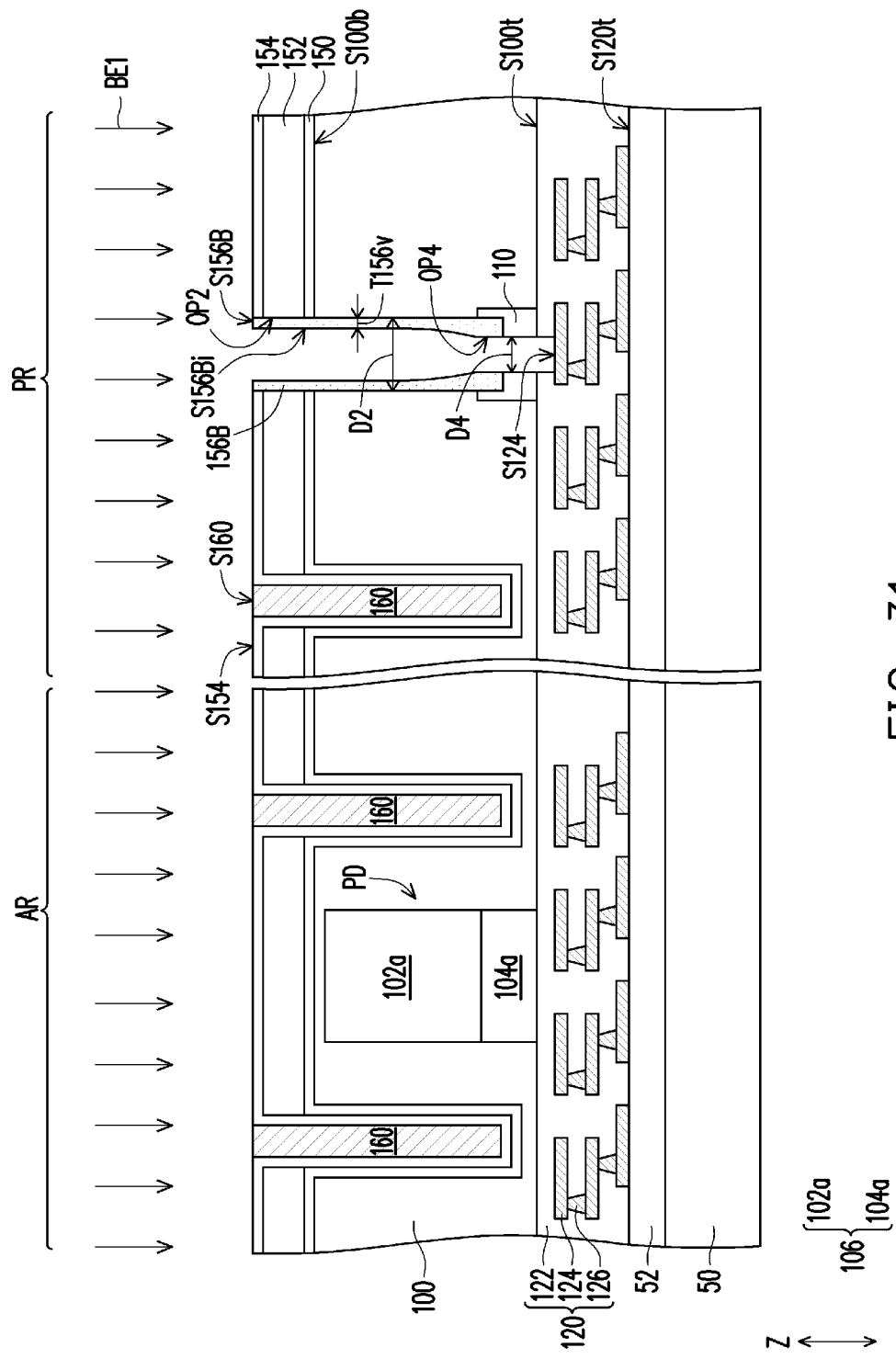
Figure 32:
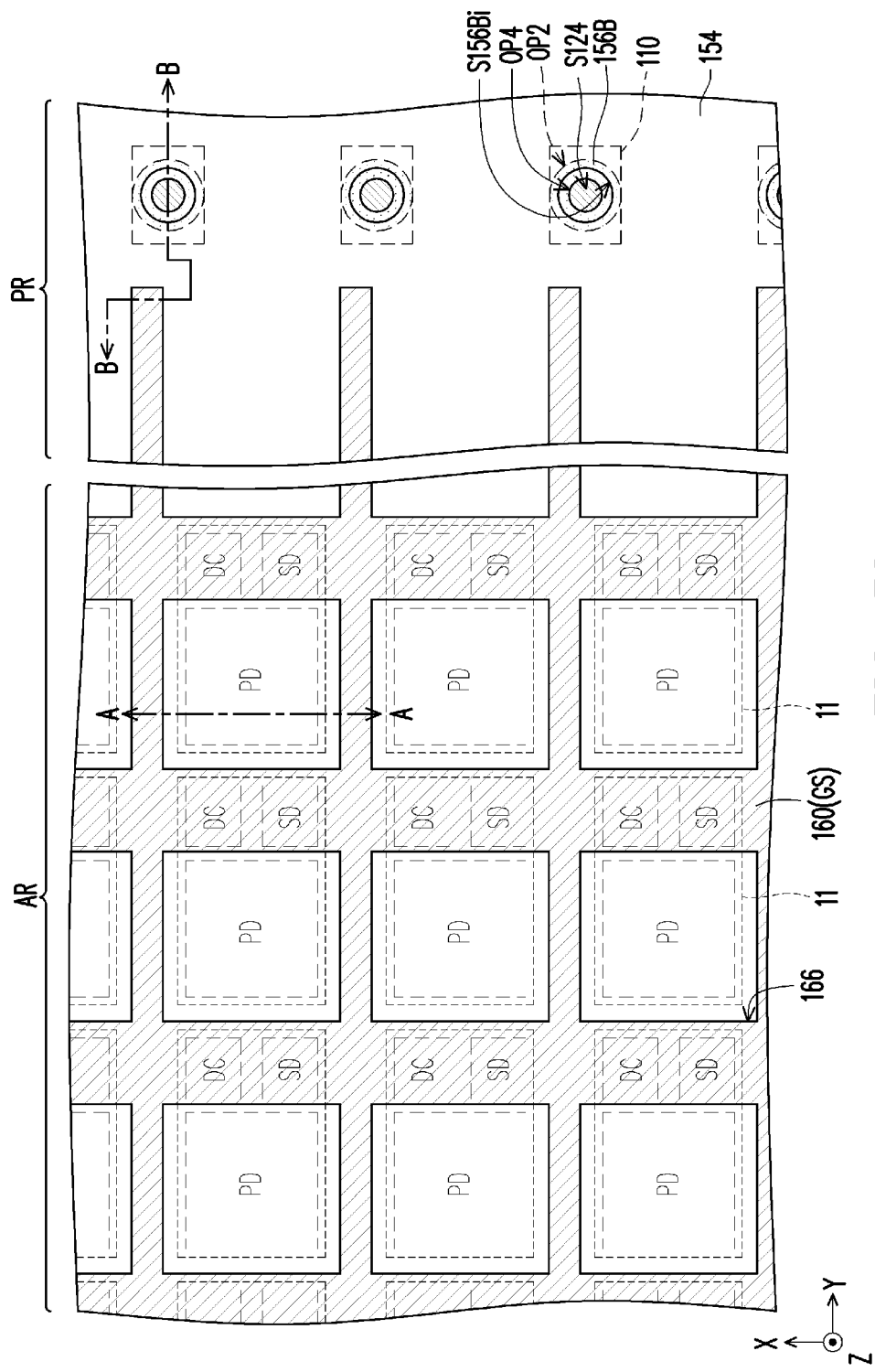

Referring to FIG. 31 and FIG. 32, in some embodiments, a patterning process BE1 is performed on the structure depicted in FIG. 29 and FIG. 30 to form a plurality of openings OP4. For example, the openings OP4 are formed in the openings OP2 to penetrate through the dielectric layer 156B and the rest of the second isolation 110, so to expose a layer (e.g. a conductive line 124 being most distant from the top surface S120t) of the metallization layers of the interconnect 120. In other words, a surface S124 of the conductive line 124 is accessibly revealed by the openings OP4. One of the openings OP2 is spatially communicated to a respective one of the openings OP4. The patterning process BE1 is, for example, a blanket etching process using no photomask during etching. In some embodiments, the blanket etching process is an anisotropic etching globally performed at the bottom surface S100b of the semiconductor substrate 100 (e.g. to both active regions AR and peripherical regions PR) to simultaneously pattern the first portion, the second portions and the third portions of the dielectric layer 156B, where the first portion and the third portions of the dielectric layer 156B are completely removed while some of each of the second portions are still remained as residuals disposed at the sidewalls of the openings OP2. The dielectric layer 156B (e.g. the remained second portions) may also be referred to as a dielectric liner (of the openings OP2), which has a non-constant thickness T156v. As shown in FIG. 31 and FIG. 32, for example, top surfaces S156B of the second portions of the dielectric layer 156B, the top surface S154 of the dielectric layer 154 and the top surface S160 of the conductive grid 160 are accessibly revealed.

Figure 33:
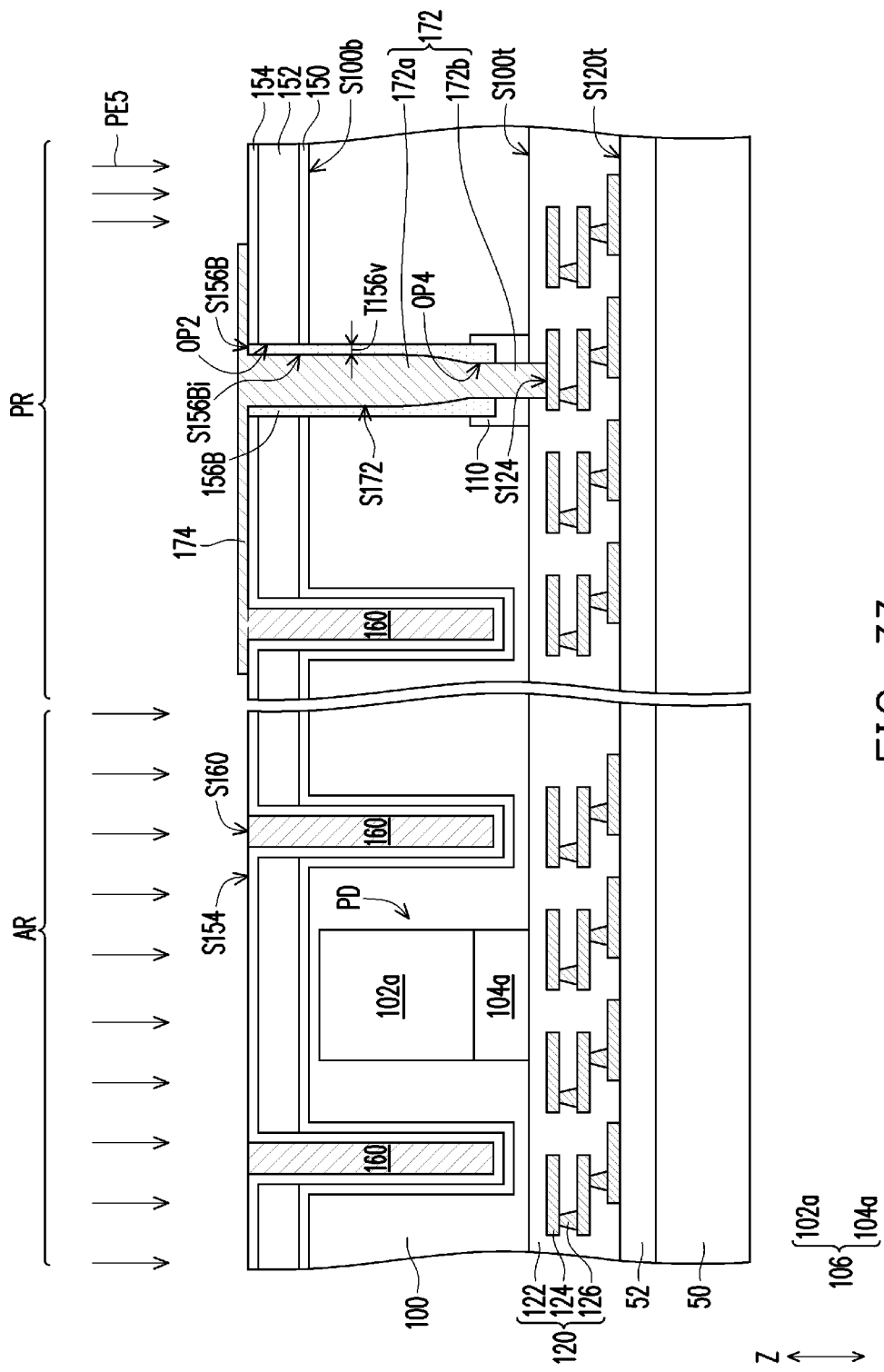
Figure 34:
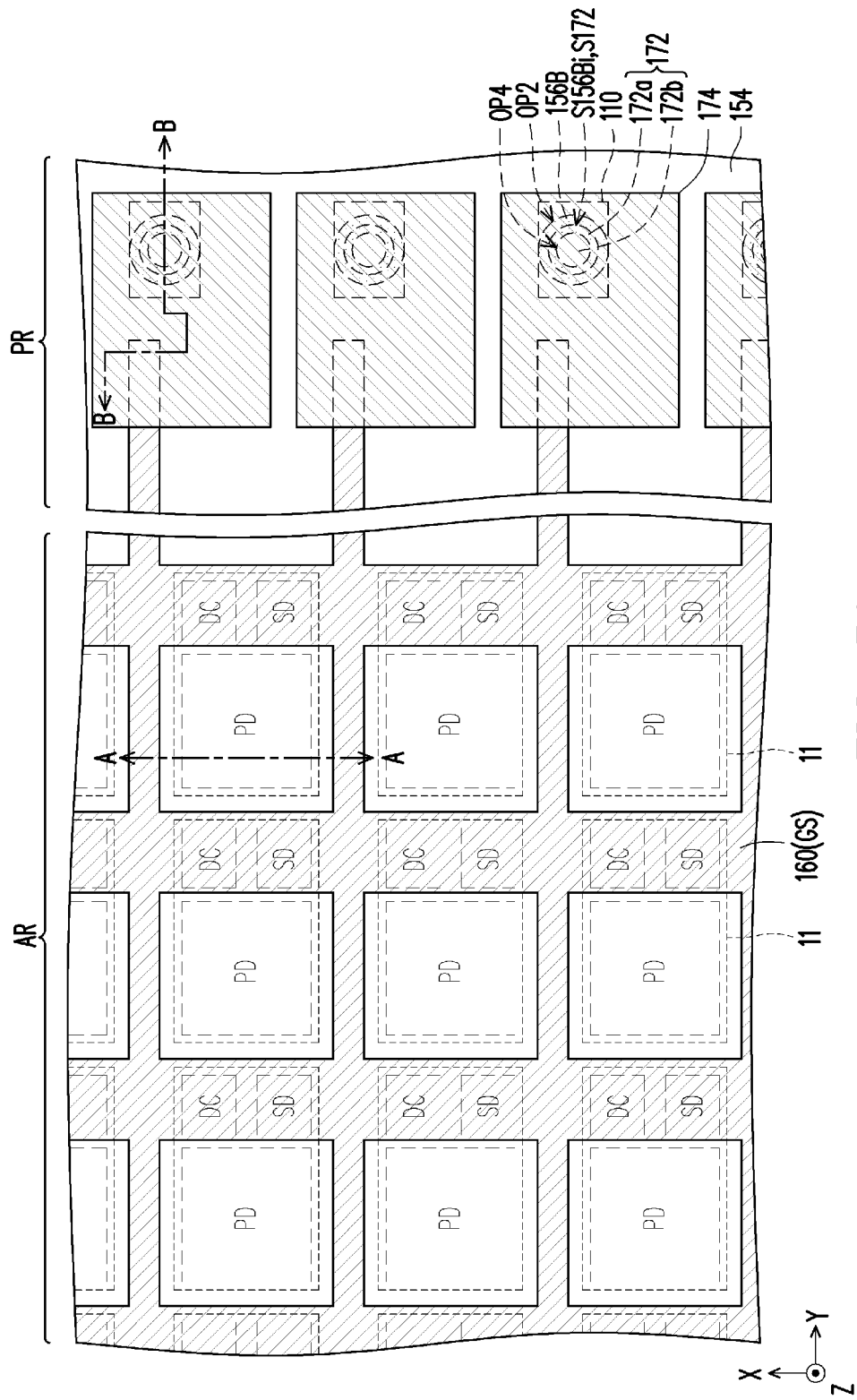

Referring to FIG. 33 and FIG. 34, in some embodiments, a conductive feature including a plurality of conductive features 172 and a plurality of conductive features 174 is formed on the dielectric layers 154 and 156B within the peripherical region PR. In some embodiments, the conductive features 170 are electrically connected to the conductive features 174 by direct contact. For example, the conductive features 170 and 174 are formed integrally.

In some embodiments, the conductive features 172 are formed in the openings OP2 and openings OP4 to be in contact with the exposed layer of the metallization layers of the interconnect 120, so that the conductive features 172 are electrically connected to the interconnect 120. For example, as shown in FIG. 33, the conductive features 172 are formed in a form of conductive pillars in contact with inner sidewalls S156Bi of the dielectric layer 156B located at the sidewalls of the openings OP2, and further extend into the openings OP4 to be in contact with sidewalls (not labeled) and bottom surfaces (not labeled) of the openings OP4. For example, illustrated top surfaces (not labeled) of the conductive features 172 are considered as surfaces being substantially coplanar to the top surface S154 of the dielectric layer 154 and the top surface S156B of the dielectric layer 156B. In some embodiments, the conductive features 172 each includes a first portion 172a in the opening OP2 and a second portion 172b in the opening OP4. For example, as shown in FIG. 33, the conductive features 172 are electrically connected to the interconnect 120 by physically and electrically connecting the second portions 172b and the exposed layer of the metallization layers of the interconnect 120, and the conductive features 172 are electrically connected to the conductive features 174 by physically and electrically connecting the first portions 172a and the conductive features 174. The conductive features 172 may be referred to as conductive structures 172, where each first portion 172a may be referred to as a conductive body and each second portion 172b may be referred to a conductive via of the conductive body. As shown in FIG. 33, the conductive structures 172 each have a step-form contour (or profile), where the sidewalls S172 of the conductive structure 172 in the cross-sectional view each are a curved line (e.g. not a straight line), for example.

In some embodiments, the conductive features 174 are formed on the top surface S154 of the dielectric layer 154 and the top surface S156B of the dielectric layer 156B to be in contact with the conductive features 172 and the conductive grid 160 of the isolation structure GS, so that the conductive features 174 are electrically connected to the conductive features 172 and the conductive grid 160 of the isolation structure GS. In other words, the conductive features 174 are planar conductive layers extending between the conductive grid 160 of the isolation structure GS and the conductive features 172 to provide a proper electrical connection therebetween. For example, illustrated bottom surfaces (not labeled) of the conductive features 174 are considered as surfaces being substantially coplanar to the top surface S154 of the dielectric layer 154. The conductive features 174 may be referred to as conductive patterns 174.

The formation of the conductive feature including the conductive features 172 and 174 may be formed by, but not limited to, forming a conductive material layer (not shown) over the semiconductor substrate 100 along the bottom surface S100b to cover the structure depicted in FIG. 31, where the conductive material layer fills into the openings OP2 and OP4; and a patterning process PE5 is performed on the conductive material layer to simultaneously form the conductive features 172 and the conductive features 174. The patterning process PE5 may be the same or identical to the patterning process PE1 as described in FIG. 7 and FIG. 8 but using a different patterned mask layer, and thus is not repeated herein for brevity. The conductive material layer may be the same as or similar to the material of the conductive material layer 160m as described in FIG. 9 and FIG. 10, and thus is not repeated herein for brevity. For an example, the conductive grid 160 is made of Al, and the conductive features 170 and 174 are also made of Al. For another example, the conductive grid 160 is made of Al, and the conductive features 170 and 174 are made of W. As shown in FIG. 33, the conductive grid 160 is electrically connected to the interconnect 120 through the conductive structures 172 and the conductive patterns 174, for example. With the presence of the conductive structures 172, the electrical connection between the isolation structure GS and the interconnect 120 can be ensured.

In some embodiments, the formation of the conductive material layer may further include a planarization process, such as a CMP process, such that the conductive material layer is formed to have a substantially planar top surface. Besides, although multiple conductive patterns 174 are adopted to electrically connect the conductive structures 172 and the conductive grid 160, there may be one conductive pattern 174 across over and electrically connected to all of the conductive structures 172 for electrically connecting the conductive structures 172 and the conductive grid 160. For example, one conductive pattern 174 can electrically connect one conductive structure 172 to the conductive grid 160 or electrically connect two or more than two conductive structures 172 to the conductive grid 160. The number of the conductive patterns 174 is not limited in the disclosure.

Figure 35:
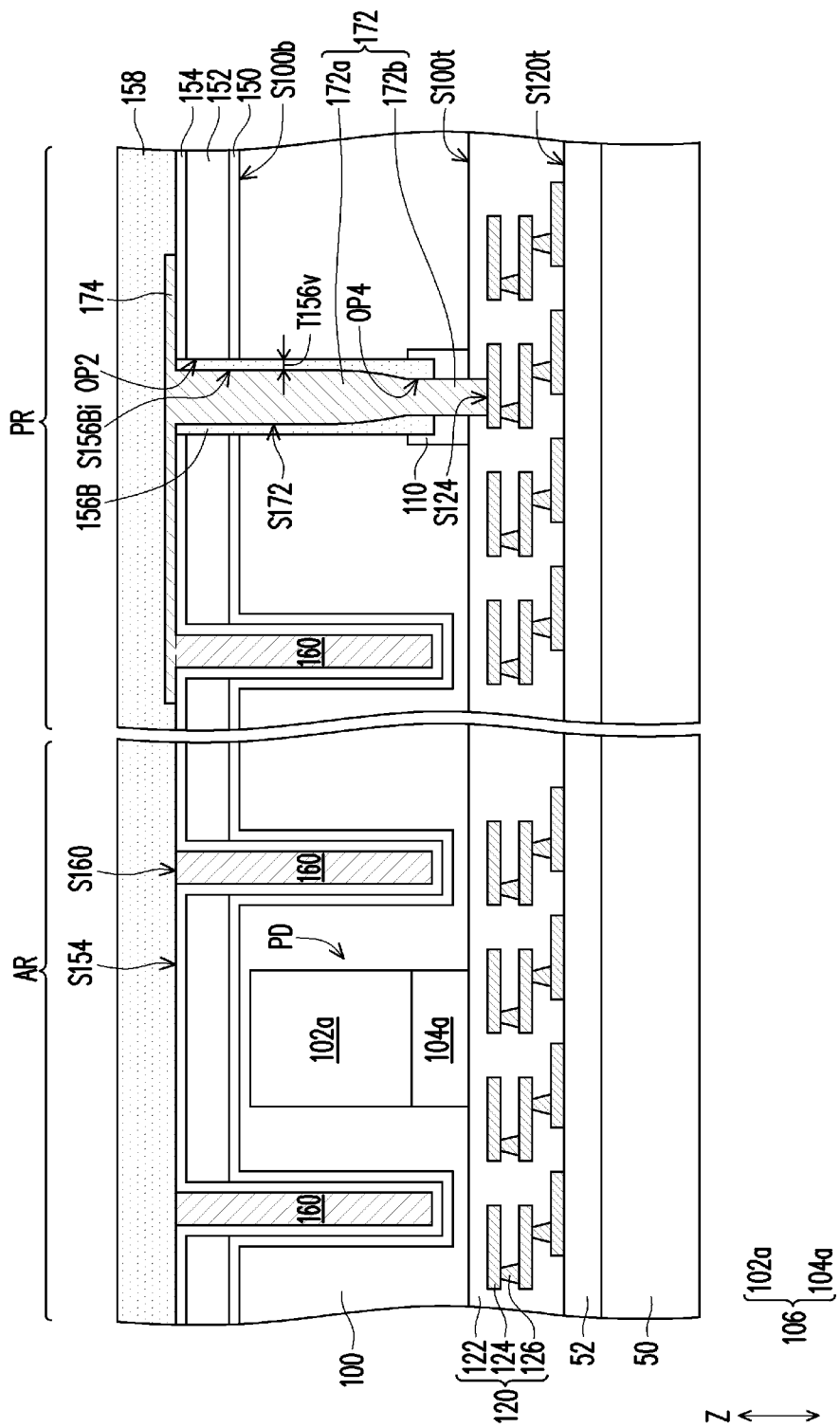
Figure 36:
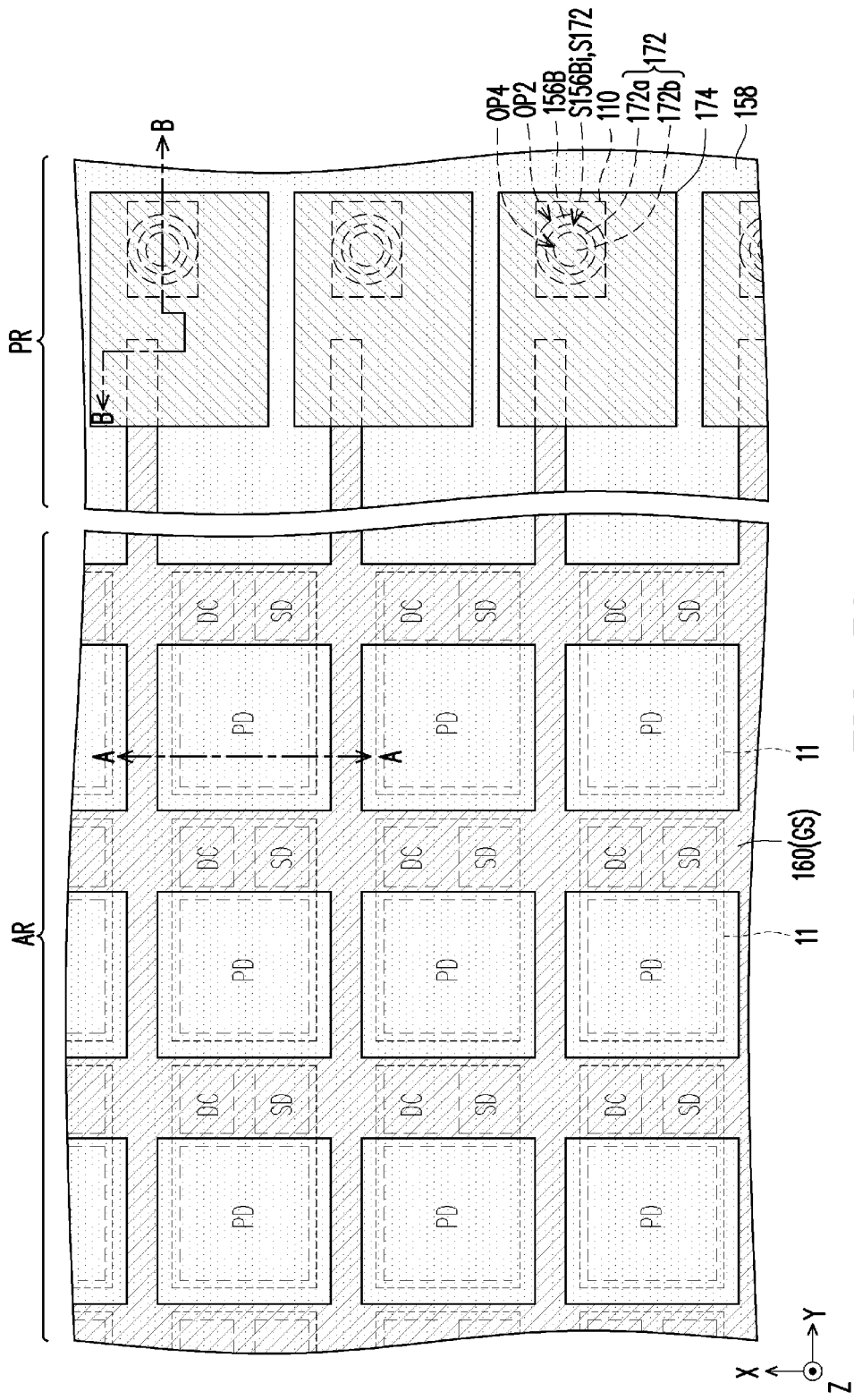
Figure 37:
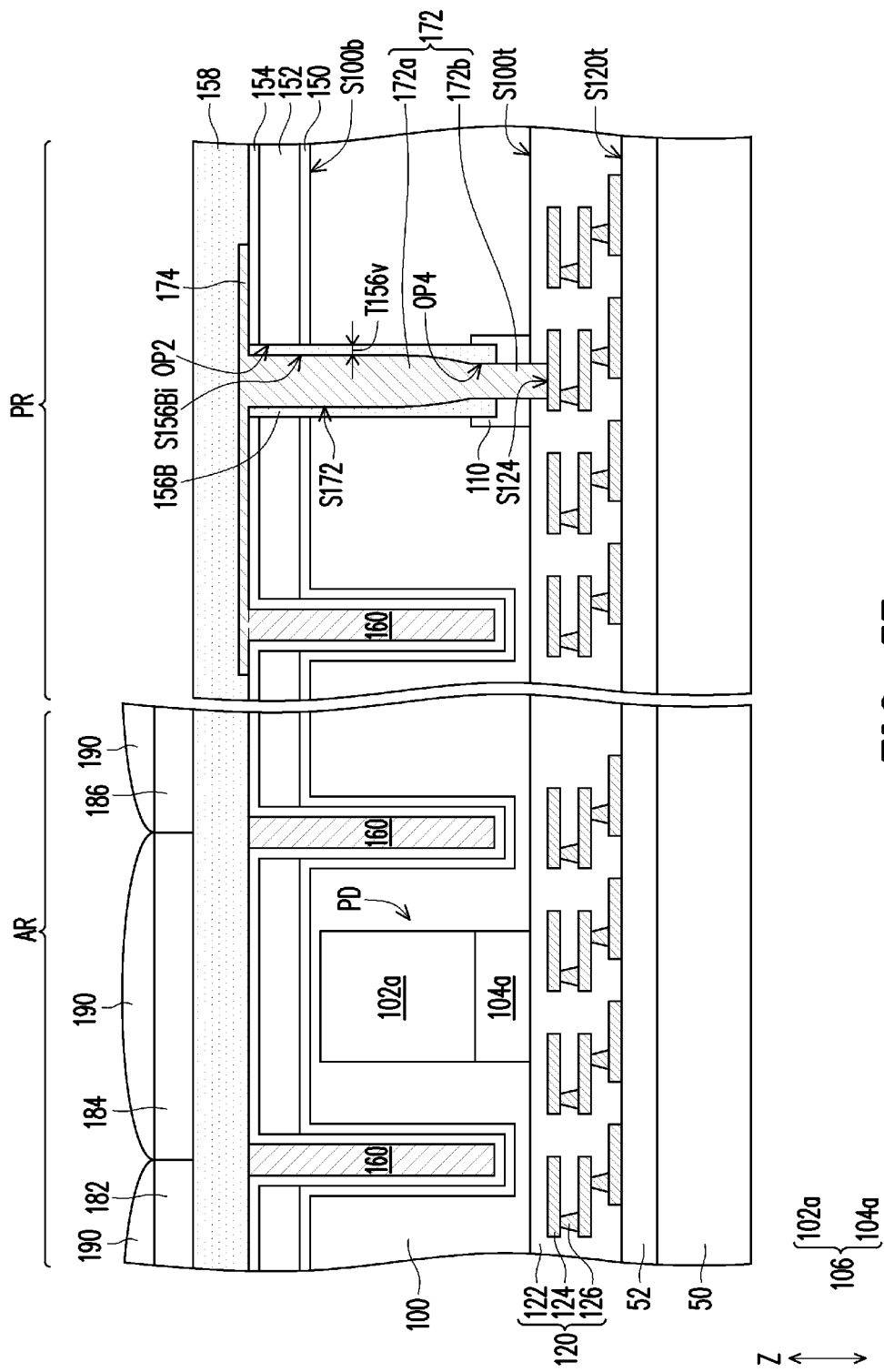
Figure 38:
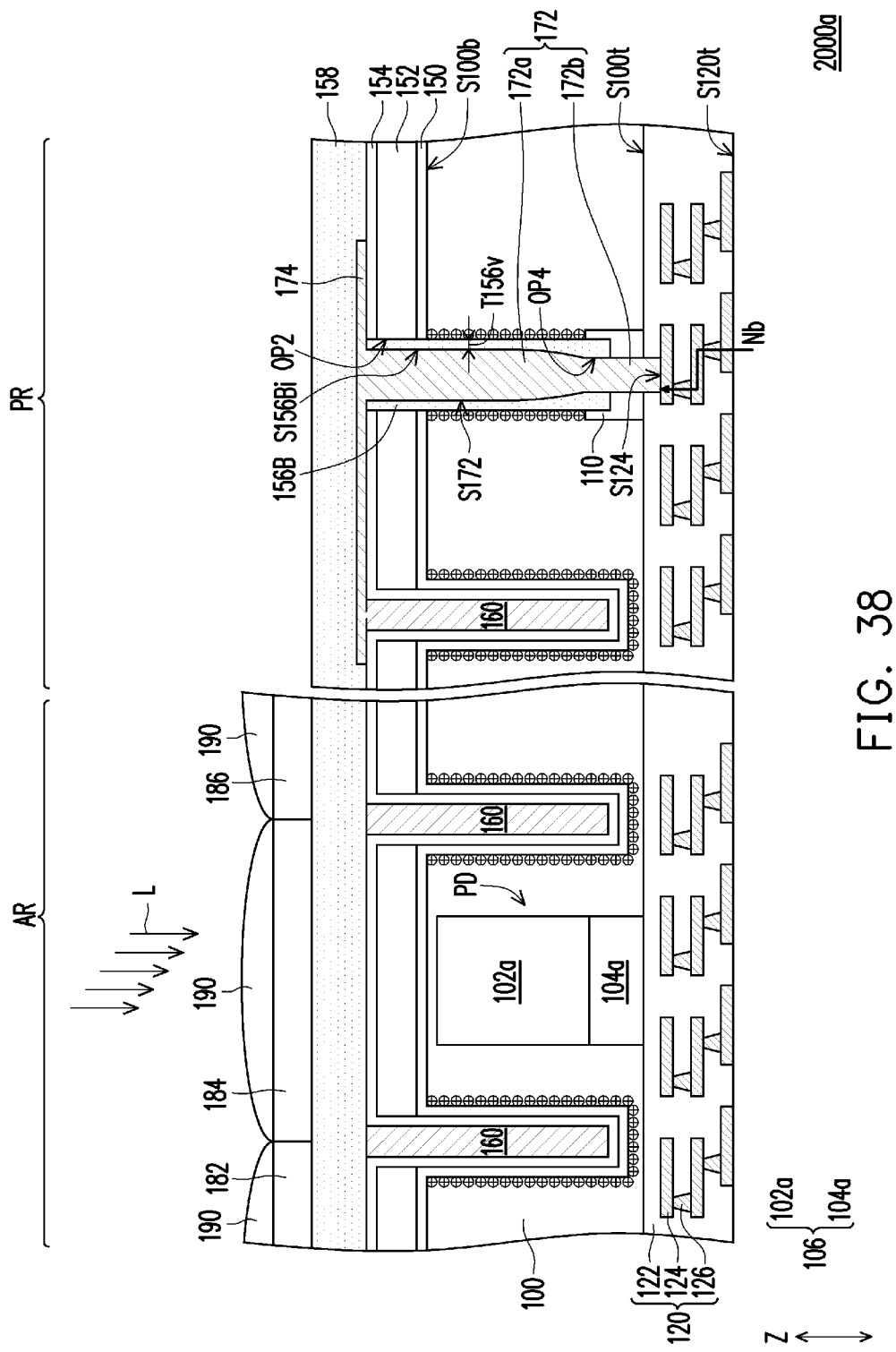

Referring to FIG. 35 and FIG. 36, in some embodiments, a dielectric layer 158 is formed on the structure depicted in FIG. 33 and FIG. 34 to cover the conductive patterns 174. The dielectric layer 158 may referred to as a passivation layer having a high degree of planarity and flatness, which is beneficial for the later-formed layers/elements (e.g. color filters, micro lenses, and/or the like). The detail of the dielectric layer 158 has been described in FIG. 21 and FIG. 22, and thus are not repeated herein for simplicity. Referring to FIG. 37, in some embodiments, a light filter layer 180 (including a plurality of color filters 182, 184 and 186) and micro-lenses 190 are disposed on the dielectric layer 158 and over the isolation structure GS within the active region AR. The detail of the light filter layer 180 and the micro-lenses 190 have been described in FIG. 23, and thus are not repeated herein for simplicity. Referring to FIG. 38, in some embodiments, the previously described manufacturing process as described in FIG. 24 above can be performed on the structure depicted in FIG. 37 to obtain the image sensor device 2000a depicted in FIG. 38. With the isolation structure GS, a better isolation for the photosensitive devices PD is provided, and thus improving the performance of the image sensor 10. In addition, an overall thickness (in direction Z) of the image sensor device 2000a is further reduced.

Figure 39:
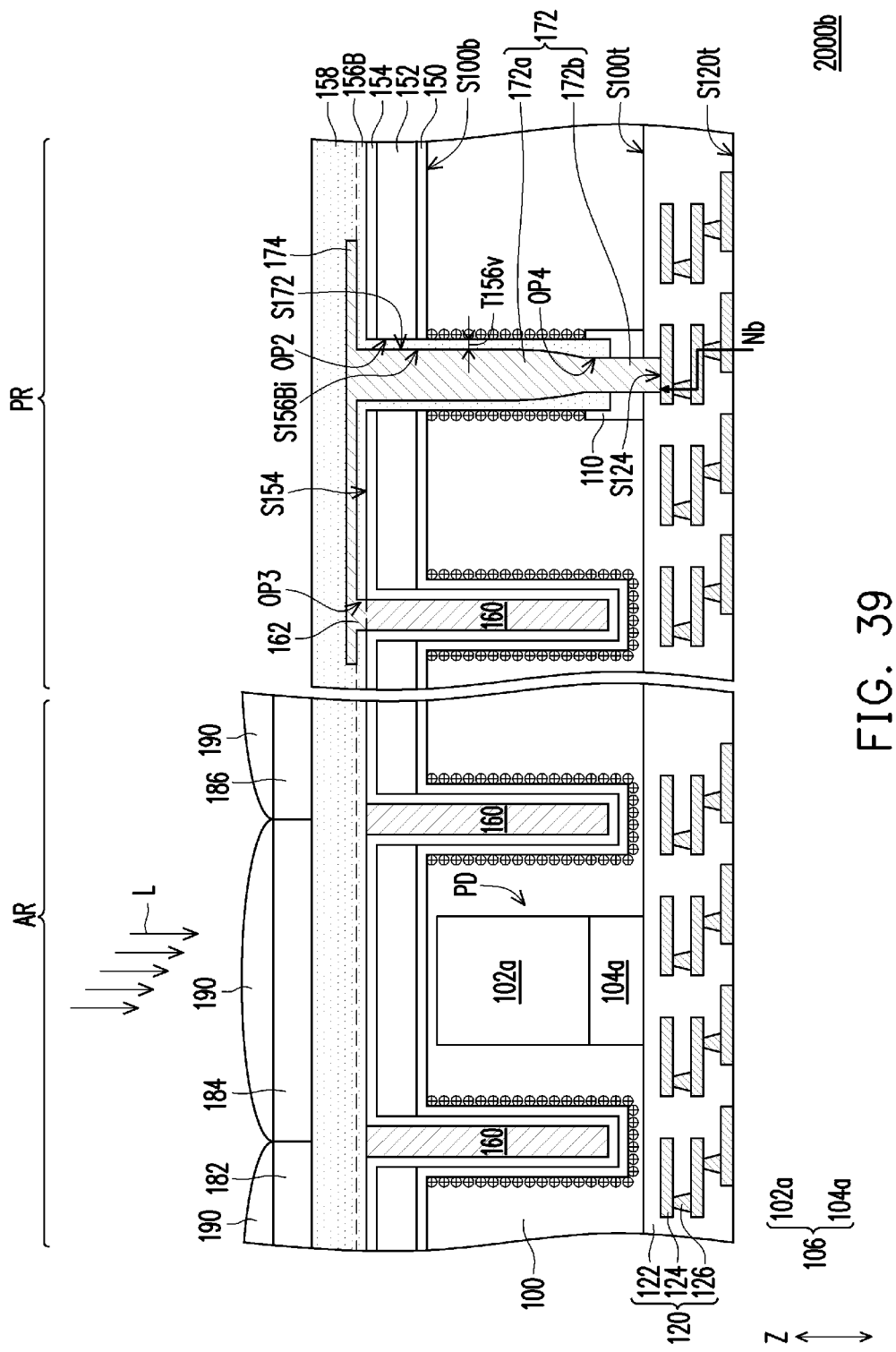
FIG. 39 is a schematic vertical (or cross-sectional) view showing an image sensor, in a (semiconductor) image sensor die in accordance with some alternative embodiments of the disclosure.

FIG. 39 is a schematic vertical view showing an image sensor included in a semiconductor structure (e.g. a (semi-conductor) image sensor device 2000b) in accordance with some alternative embodiments of the disclosure. The elements similar to or substantially the same as the elements described previously will use the same reference numbers, and certain details or descriptions of the same elements may not be repeated herein. The image sensor devices 2000b of FIG. 39 is similar to the image sensor devices 2000a of FIG. 38, the difference is that, in the image sensor devices 2000b of FIG. 38, the first portion of the dielectric layer 156B is remained on the top surface S154 of the dielectric layer 154. In other words, instead using the patterning process BE1 (without a photomask) in the previously described manufacturing process as described in FIG. 33 and FIG. 34 above, another patterning process (with a photomask) is adopted to form the openings OP4. The another patterning process may be the same or identical to the patterning process PE1 as described in FIG. 7 and FIG. 8 but using a different patterned mask layer, and thus is not repeated herein for brevity.

Figure 40:
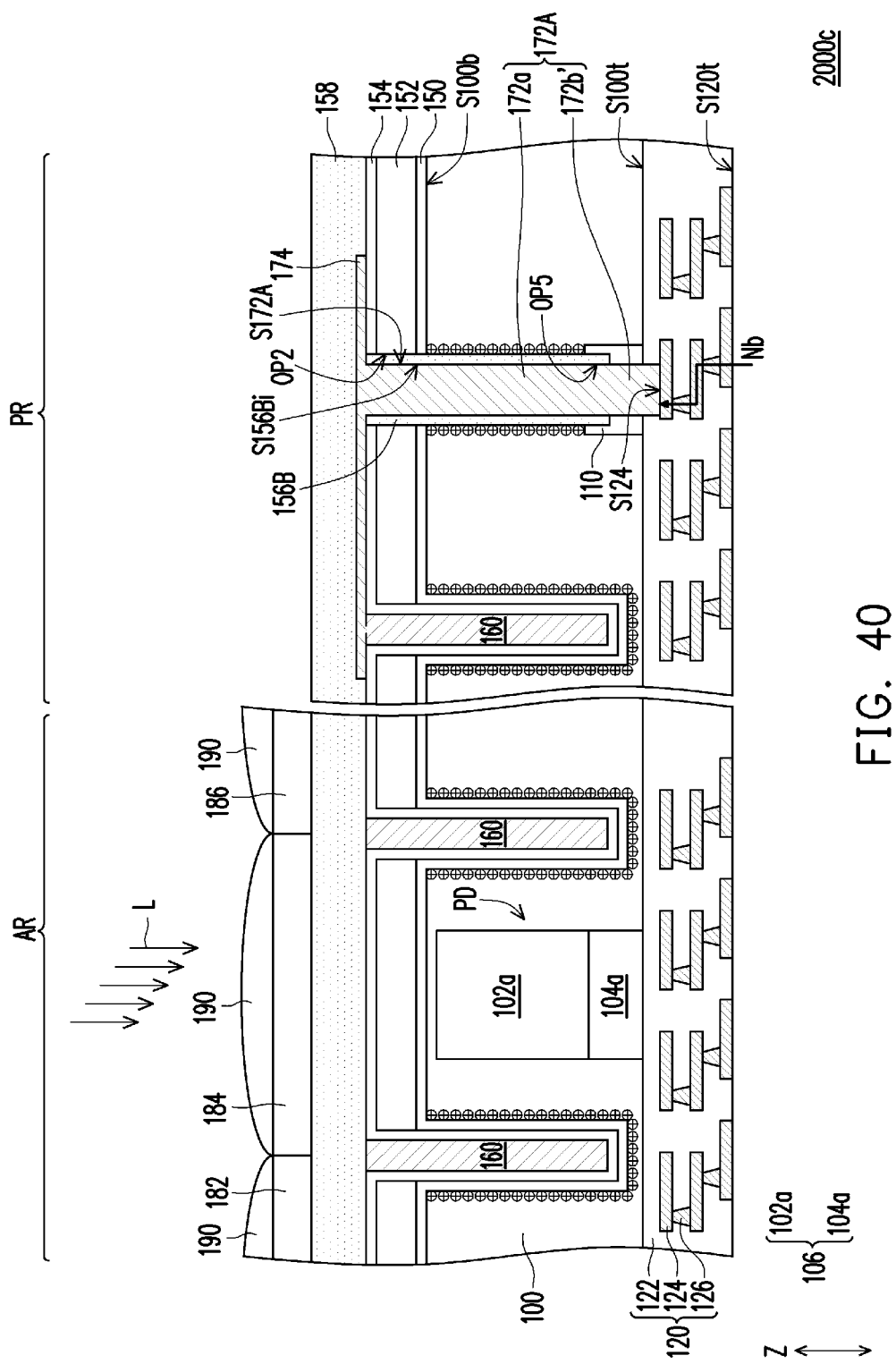
FIG. 40 and FIG. 41 are schematic vertical (or cross-sectional) and horizontal (or plane) views showing an image sensor, in a (semiconductor) image sensor die in accordance with some alternative embodiments of the disclosure.
Figure 41:
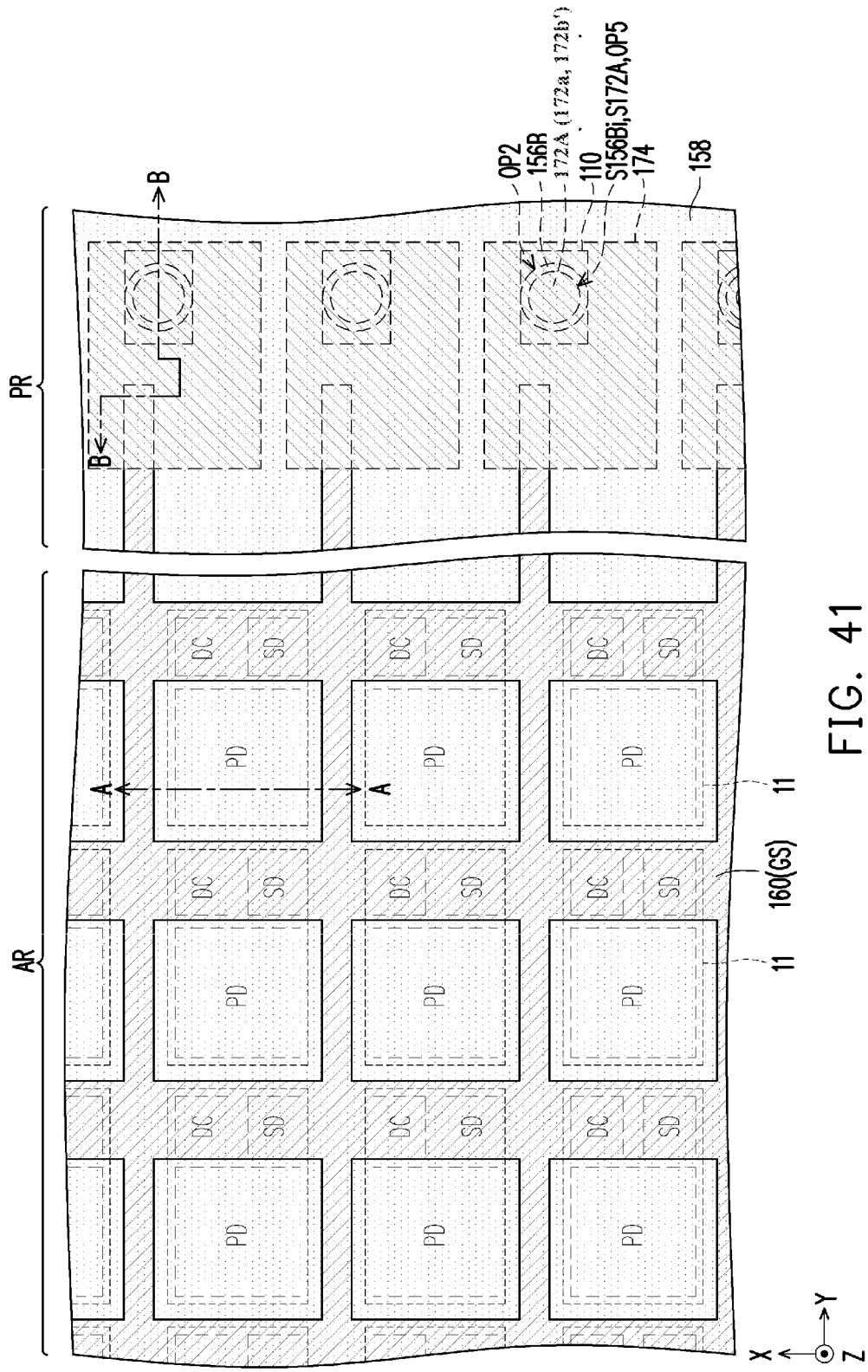
Figure 42:
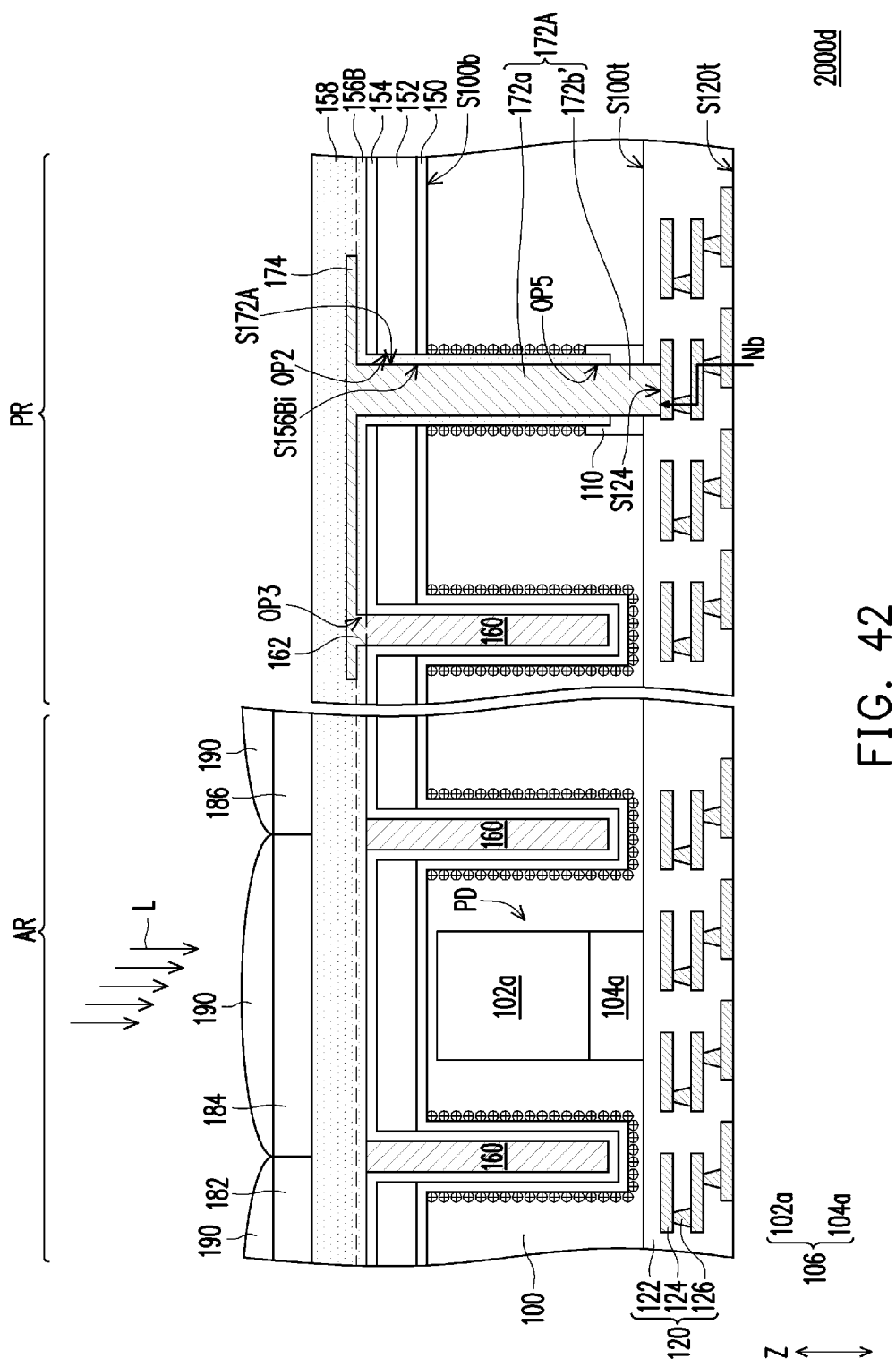
FIG. 42 is a schematic vertical (or cross-sectional) view showing an image sensor, in a (semiconductor) image sensor die in accordance with some alternative embodiments of the disclosure.

FIG. 40 and FIG. 41 are schematic vertical and horizontal views showing an image sensor included in a semiconductor structure (e.g. a (semiconductor) image sensor device 2000c) in accordance with some alternative embodiments of the disclosure. FIG. 42 is a schematic vertical view showing an image sensor included in a semiconductor structure (e.g. a (semiconductor) image sensor device 2000d) in accordance with some alternative embodiments of the disclosure. The elements similar to or substantially the same as the elements described previously will use the same reference numbers, and certain details or descriptions of the same elements may not be repeated herein. The image sensor devices 2000c of FIG. 40 and FIG. 41 is similar to the image sensor devices 2000a of FIG. 38, the difference is that, in the image sensor devices 2000c of FIG. 40 and FIG. 41, the conductive structures 172 are substituted by conductive structures 172A. For example, as shown in the cross-sectional view of FIG. 40, sidewalls S172A of the conductive structures 172A are a straight line (e.g. not a curved line). In other words, there is no bend at the sidewalls S172A of the conductive structures 172A. That is, the conductive structures 172A each have a non-step form contour (or profile). The formation and material of the conductive structures 172A is similar to the process of forming the openings OP5 as described in FIG. 26 and FIG. 27 and the process and materials of forming the conductive structures 172 as described in FIG. 33 and FIG. 34, and thus are not repeated herein for brevity. Owing to the conductive structures 172A, a contact area between the conductive structures 172A and the interconnect 120 is increased, which reduces the contact resistance therebetween; thereby enhancing the isolation ability of the isolation structure GS and further improving the performance of the image sensor 10.

Alternatively, similar to the image sensor device 2000b, the first portion of the dielectric layer 156B of the image sensor device 2000c may not be removed, see the image sensor device 2000d as shown in FIG. 42.

In alternative embodiments, instead of having STIs as the first isolations in the active region AR and/or the second isolations in the peripherical region PR, the first isolations and the second isolations may be formed, independently, in a form of a doped isolation feature having a stacked structure of multiple doped regions. Depending on the conductivity type of a semiconductor substrate for constructing the image sensor, the dopants in the multiple doped regions may be varied. In some embodiments, the dopants in the multiple doped regions and the semiconductor substrate with the multiple doped regions formed therein are the same type.

FIG. 43 through FIG. 50 are schematic vertical and horizontal views showing a method of manufacturing an image sensor included in an semiconductor structure (e.g. a (semiconductor) image sensor device 3000a) in accordance with some embodiments of the disclosure, where FIG. 43, FIG. 45, FIG. 47, and FIG. 49 are the cross-sectional views taken along lines A-A and B-B depicted in FIG. 44, FIG. 46, FIG. 48, and FIG. 50. The elements similar to or substantially the same as the elements described previously will use the same reference numbers, and certain details or descriptions of the same elements may not be repeated herein.

Figure 43:
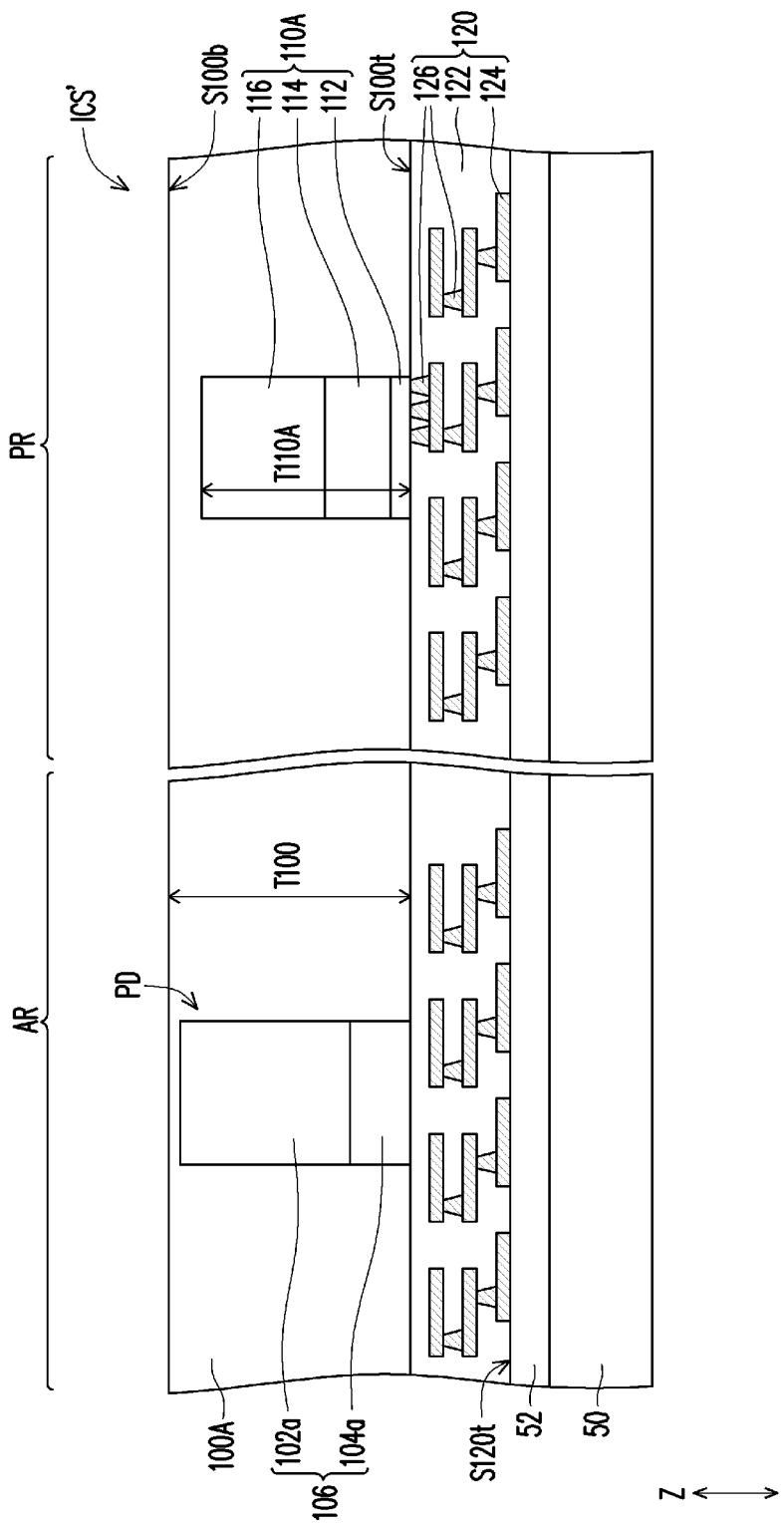
FIG. 43, FIG. 45, FIG. 47 and FIG. 49 are schematic vertical (or cross-sectional) views showing a method of manufacturing an image sensor, in a (semiconductor) image sensor die in accordance with some embodiments of the disclosure.
Figure 44:
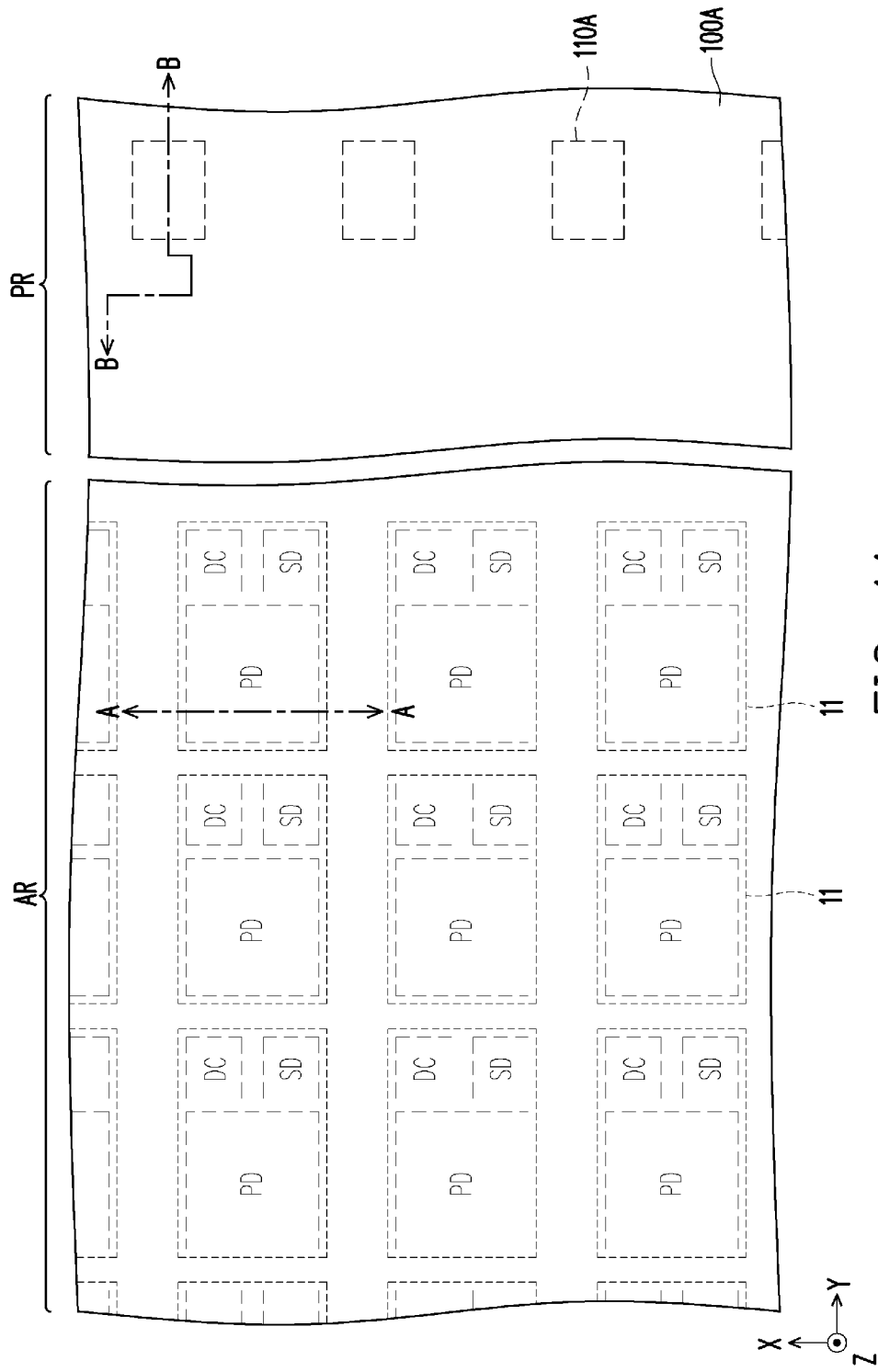
FIG. 44, FIG. 46, FIG. 48 and FIG. 50 are schematic horizontal (or plane) views illustrating a relative position of components included in the image sensor depicted in FIG. 43, FIG. 45, FIG. 47 and FIG. 49.

Referring to FIG. 43 and FIG. 44, in some embodiments, an initial integrated circuit structure ICS' is provided and placed on a carrier 50 through a debond layer 52, then the initial integrated circuit structure ICS' is thinned by the process as previously described in FIG. 6. In some embodiments, as shown in FIG. 43, the initial integrated circuit structure ICS' includes a semiconductor substrate 100A, a device region (not shown) and an interconnect 120. The details of the carrier 50, the debond layer 52, the device region, and the interconnect 120 have been described in FIG. 4 and FIG. 5, and thus are not repeated herein for brevity. In the disclosure, the semiconductor substrate 100A of FIG. 43 is similar to the semiconductor substrate 100 of FIG. 6, the difference is that, in the semiconductor substrate 100A of FIG. 43, the second isolations 110 are substituted by a plurality of second isolations 110A. In some embodiments, the second isolations 110A each include a doped isolation having a stacked structure of doped regions. The second isolations 110A may be referred to as doped isolation structures 110A. For example, as shown in FIG. 43, the doped isolation features 110A each include a doped region 112, a doped region 114 and a doped region 116 being stacked along the direction Z. In some embodiments, along the direction Z, the doped region 112 is located between the interconnect 120 and the doped region 114, and the doped region 114 is located between the doped region 112 and the doped region 116. In some embodiments, a thickness T110A of the second isolations 110A is approximately ranging from 0.01 μm to 10 μm, where the thickness T110A is measured along a stacking direction of the doped regions 112-116, as shown in FIG. 43.

For example, a surface of the doped region 112 is substantially coplanar with the top surface S100t of the semiconductor substrate 100A, and the doped region 116 is not accessibly revealed by the bottom surface of the semiconductor substrate 100A. In some embodiments, the doped isolation structures 110A are electrically connected to the interconnect 120 through a layer (e.g. one or more than one vias via/contact 126 being most distant from the top surface S120t) of the metallization layers of the interconnect 120. The configuration of the semiconductor substrate 100A is similar to the configuration of the semiconductor substrate 100 as described in FIG. 4 and FIG. 5, and thus are not repeated herein for brevity.

In some embodiments, the semiconductor substrate 100A and the doped regions 112, 114 and 116 have the same conductivity type. For example, the semiconductor substrate 100A is a p-type substrate, the doped regions 112, 114 and 116 are doped with p-type dopants (such as boron or $BF_2$). The formation of the doped regions 112, 114 and 116 may be formed by, but not limited to, implanting p-type dopants, such as boron or the like, through the top surface S100t of the semiconductor substrate 100A before the formation of the interconnect 120. In some embodiments, a p-type doping concentration of the doped region 114 is greater than a p-type doping concentration of the doped region 112, and a p-type doping concentration of the doped region 116 is greater than the p-type doping concentration of the doped region 114. In addition, the p-type doping concentration of the doped region 116 is greater than the p-type doping concentration of the semiconductor substrate 100A. The doped region 112 may have a doping concentration in a range from about $10^{15}/cm^3$ to about $10^{21}/cm^3$. The doped region 114 can have a doping concentration in a range from about $10^{15}/cm^3$ to about $10^{19}/cm^3$. The doped region 116 can have a doping concentration in a range from about $10^{13}/cm^3$ to about $10^{18}/cm^3$. In some embodiments, for each doped isolation structure 110A, the doped region 112 may be referred to as a p+ doping region or a p+ well, the doped region 114 may be referred to as a heavily doped region or a cell p-well (CPW), and the doped region 116 may be referred to as a heavily doped region or a deep p-well (DPW).

On the other hand, if the semiconductor substrate 100A is an n-type substrate, the doped regions 112, 114 and 116 are doped with n-type dopants (such as phosphorous or arsenic). The formation of the doped regions 112, 114 and 116 may be formed by, but not limited to, implanting n-type dopants through the top surface S100t of the semiconductor substrate 100A before the formation of the interconnect 120. In some embodiments, an n-type doping concentration of the doped region 114 is greater than an n-type doping concentration of the doped region 112, and an n-type doping concentration of the doped region 116 is greater than the n-type doping concentration of the doped region 114. In addition, the n-type doping concentration of the doped region 116 is greater than the n-type doping concentration of the semiconductor substrate 100A. The doped region 112 may have a doping concentration in a range from about $10^{15}/cm^3$ to about $10^{21}/cm^3$. The doped region 114 can have a doping concentration in a range from about $10^{15}/cm^3$ to about $10^{19}/cm^3$. The doped region 116 can have a doping concentration in a range from about $10^{13}/cm^3$ to about $10^{18}/cm^3$. In some embodiments, for each doped isolation structure 110A, the doped region 112 may be referred to as n+ doping region or a n+ well, the doped region 114 may be referred to as a heavily doped region or a cell n-well (CNW), and the doped region 116 may be referred to as a heavily doped region or a deep n-well (DNW).

The first isolations (not shown) may have the same structure as the doped isolation structures 110A. Alternatively, the first isolations may not have the same structure as the doped isolation structures 110A. The disclosure is not limited thereto.

Figure 45:
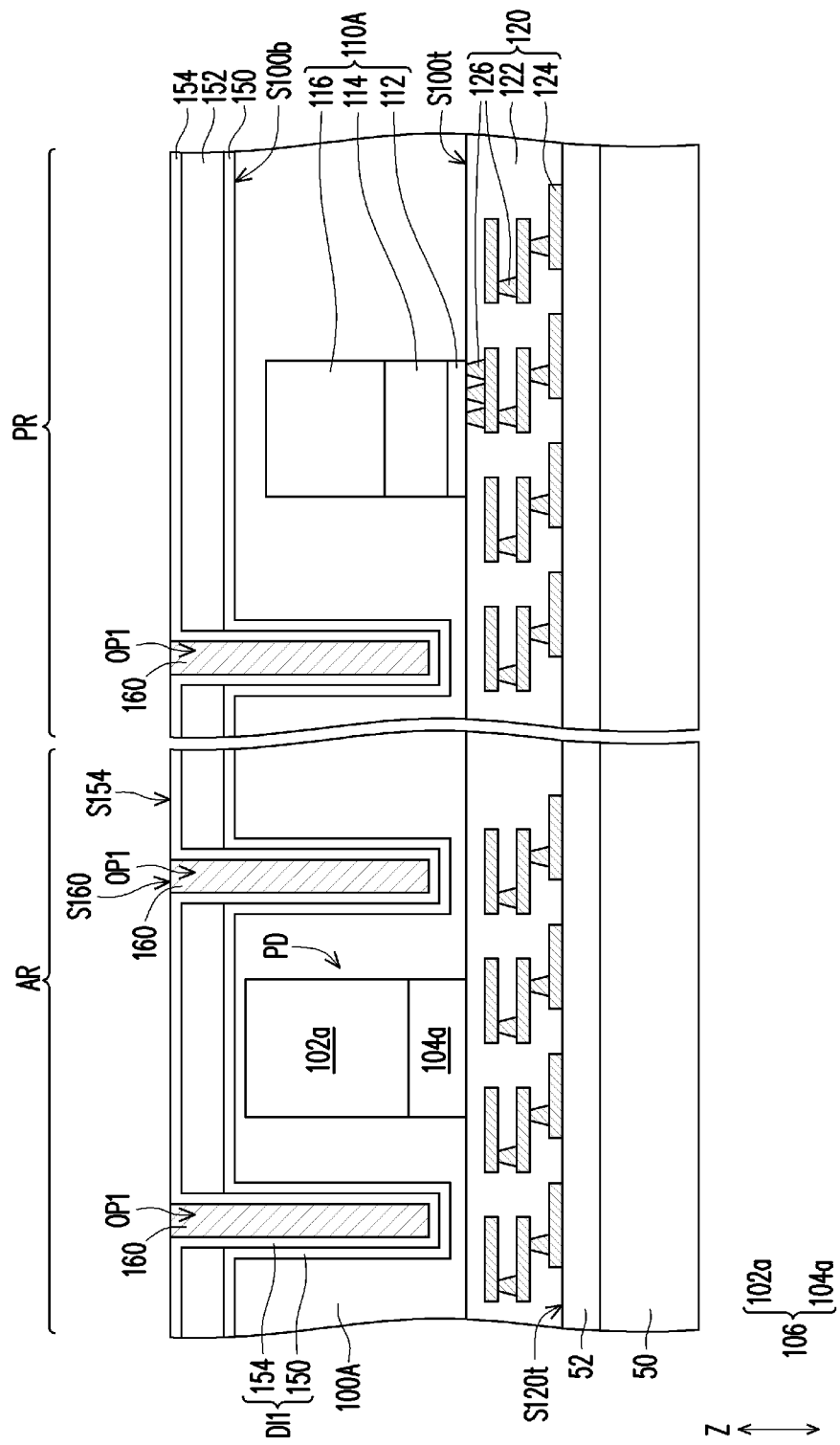
Figure 46:
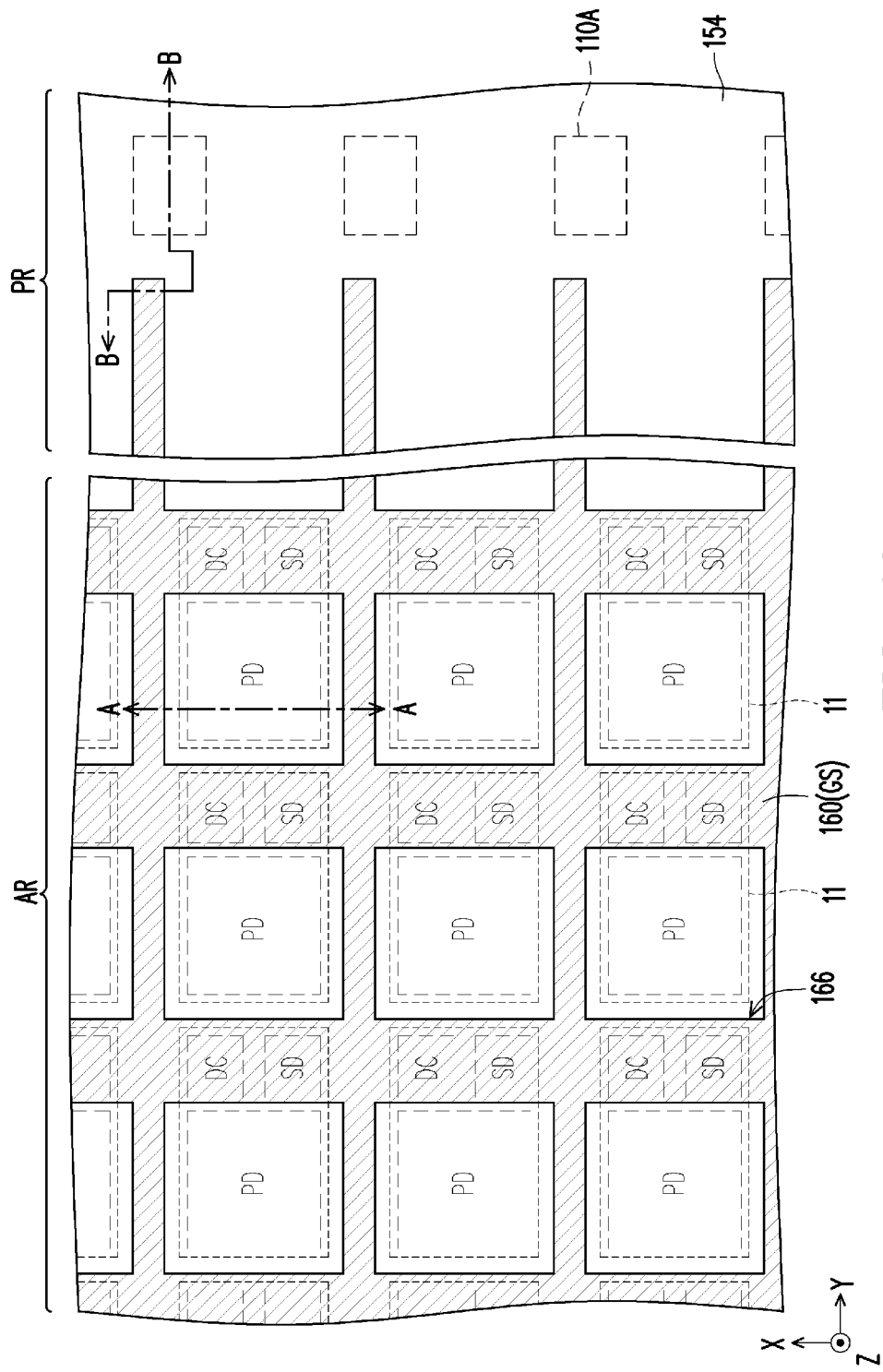

Referring to FIG. 45 and FIG. 46, in some embodiments, a plurality of trenches OP1 are formed in the semiconductor substrate 100A, and an isolation structure GS having a conductive grid 160 are formed in the trenches OP1, where the trenches OP1 together constitute a grid (mesh) cavity. The detail of the trenches OP1 has been described in the previously described manufacturing process as described in FIG. 7 and FIG. 8, the detail of the isolation structure GS has been described in the previously described manufacturing process as described in FIG. 9 and FIG. 12, and thus are not repeated herein for simplicity.

Figure 47:
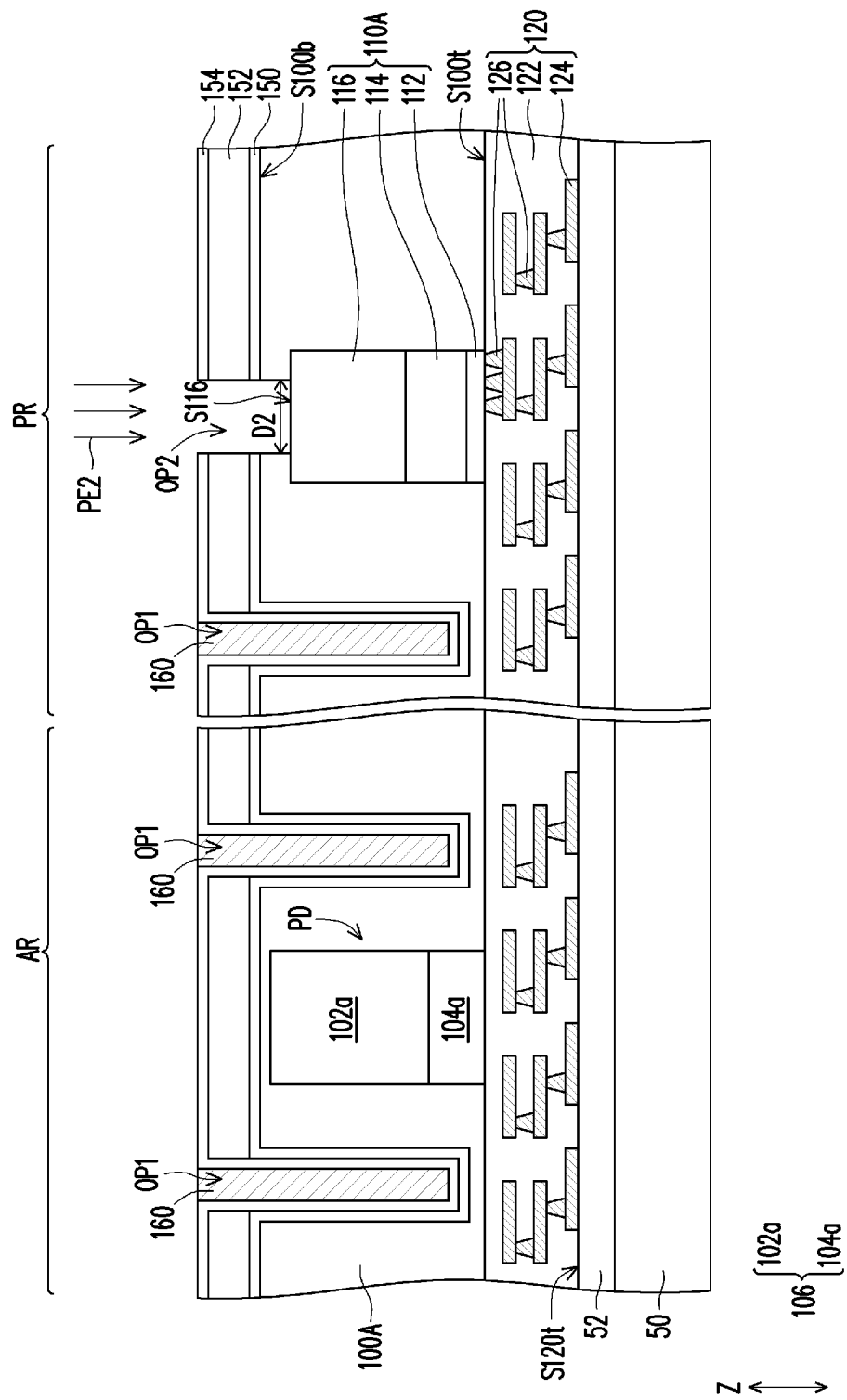
Figure 48:
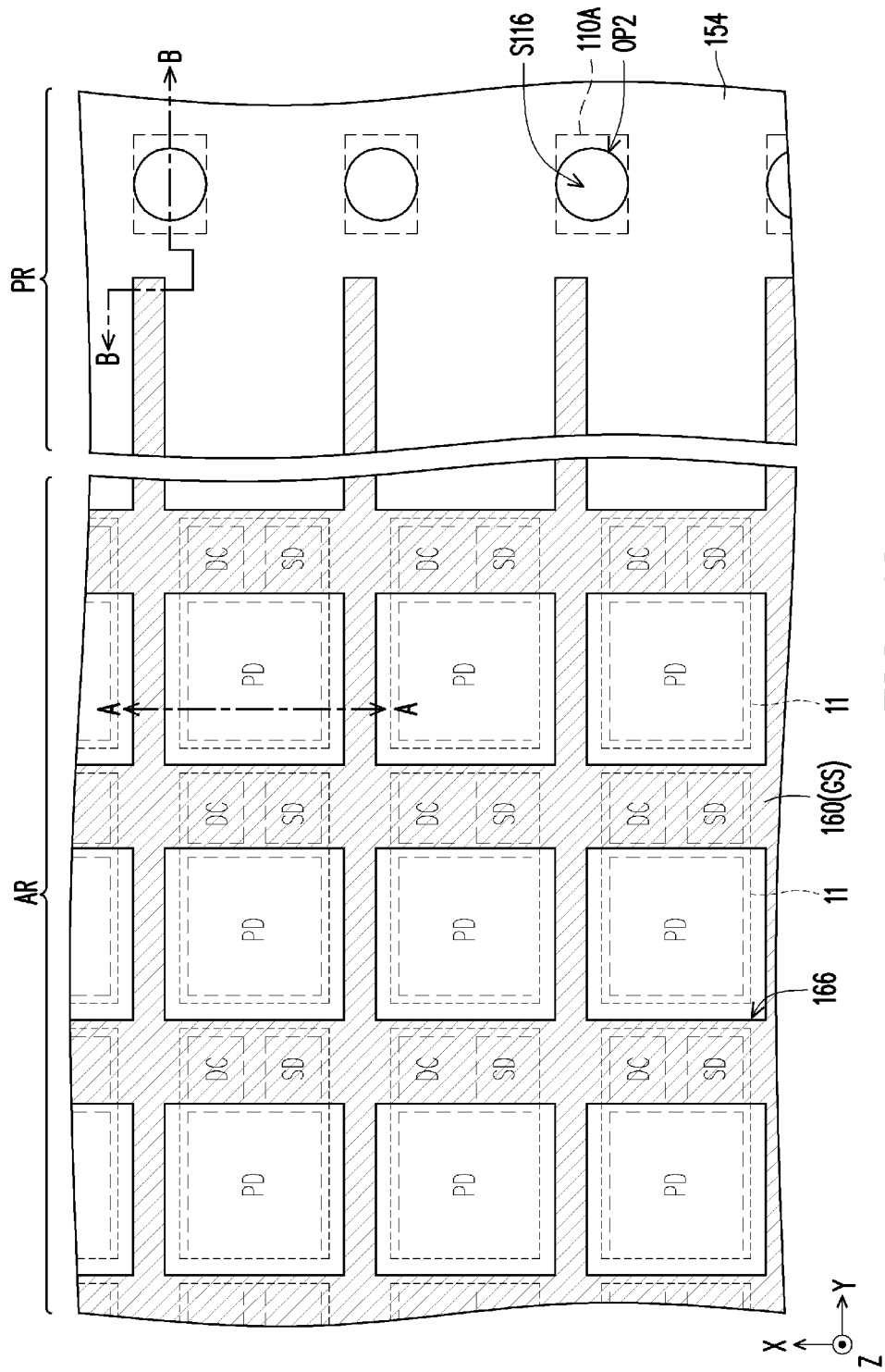

Referring to FIG. 47 and FIG. 48, in some embodiments, a patterning process PE2 is performed to form a plurality of openings OP2 in the semiconductor substrate 100A to expose the doped isolation structures 110A. For example, surfaces S116 of the doped isolation structures 110A are accessibly exposed by the openings OP2 formed in the peripherical region PR. The detail of the patterning process PE2 and the detail of the openings OP2 have been described in the previously described manufacturing process as described in FIG. 13 and FIG. 14, and thus are not repeated herein for simplicity. In some embodiments, after the formation of the openings OP2 exposing the surfaces S116 of the doped isolation structures 110A, the previously described manufacturing processes as described in FIG. 19 through FIG. 24 above can be performed on the structure depicted in FIG. 47 and FIG. 48 to obtain the image sensor device 3000a depicted in FIG. 49 and FIG. 50. In the image sensor device 3000a, a plurality of conductive features (or conductive patterns) 174 electrically connects a plurality of conductive features (or conductive structures) 170A to the conductive grid 160 of the isolation structure GS, where the isolation structure GS is electrically connected to the interconnect 120 (e.g., the vias 126) through the doped isolation structures 110A, the conductive structures 170A and the conductive patterns 174. With such isolation structure GS, a better isolation for the photosensitive devices PD is provided, and thus improving the performance of the image sensor 10.

Figure 51:
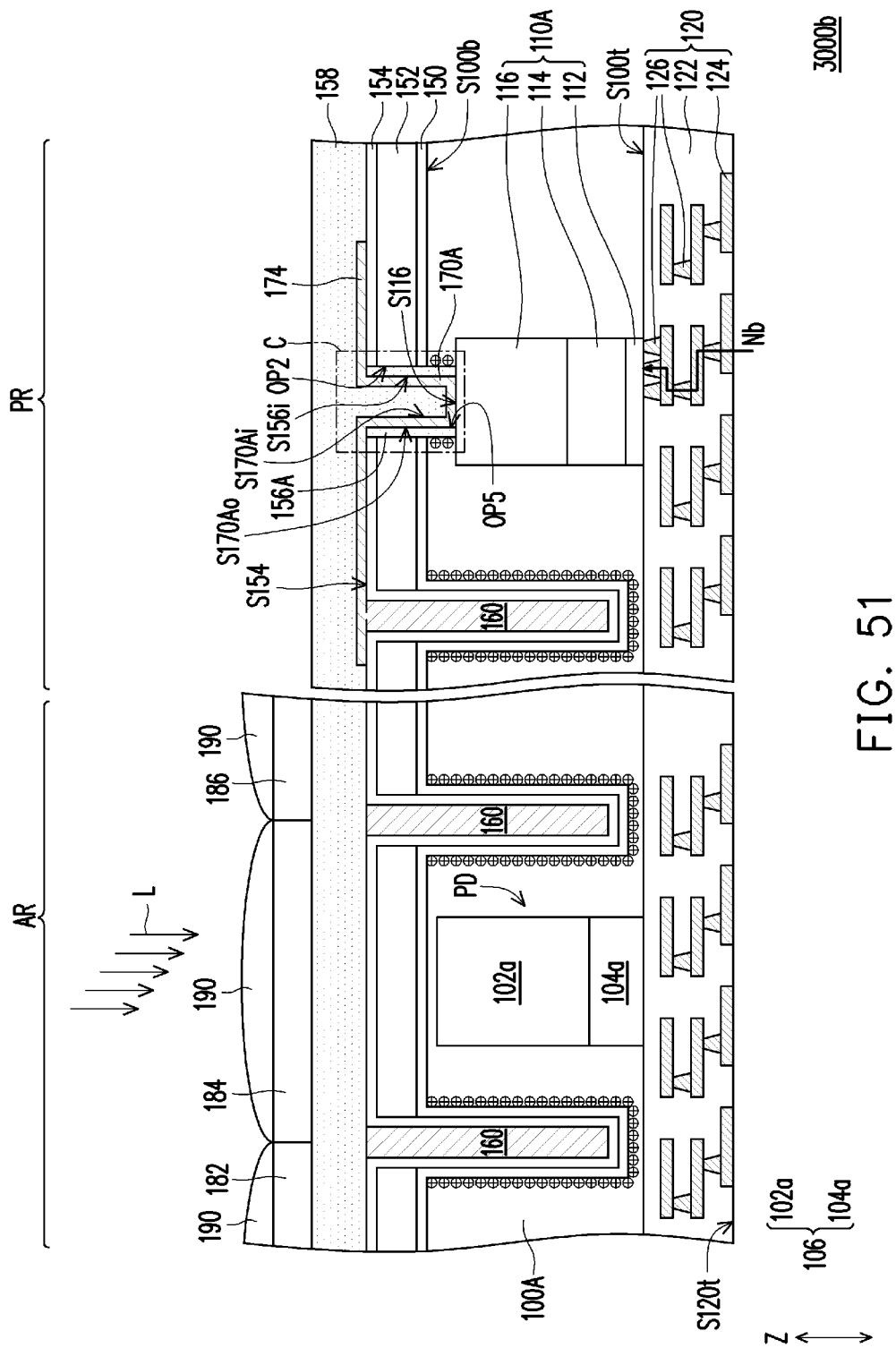
FIG. 51 is a schematic vertical (or cross-sectional) view showing an image sensor, in a (semiconductor) image sensor die in accordance with some alternative embodiments of the disclosure.

In alternative embodiments, a portion of the dielectric layer 156 extending along the X-Y plane over the dielectric layer 154 in the image sensor device 3000a is removed, see a (semiconductor) image sensor device 3000b of FIG. 51. The removal of the such portion of the dielectric layer 156 may be done by a process is similar to or the same as the process previously described in FIG. 25 or the processes previously described in FIG. 33 through FIG. 36. With such configuration, without reducing the isolation ability of the isolation structure GS, an overall thickness of the image sensor device (e.g. 3000b) is further reduced.

Figure 49:
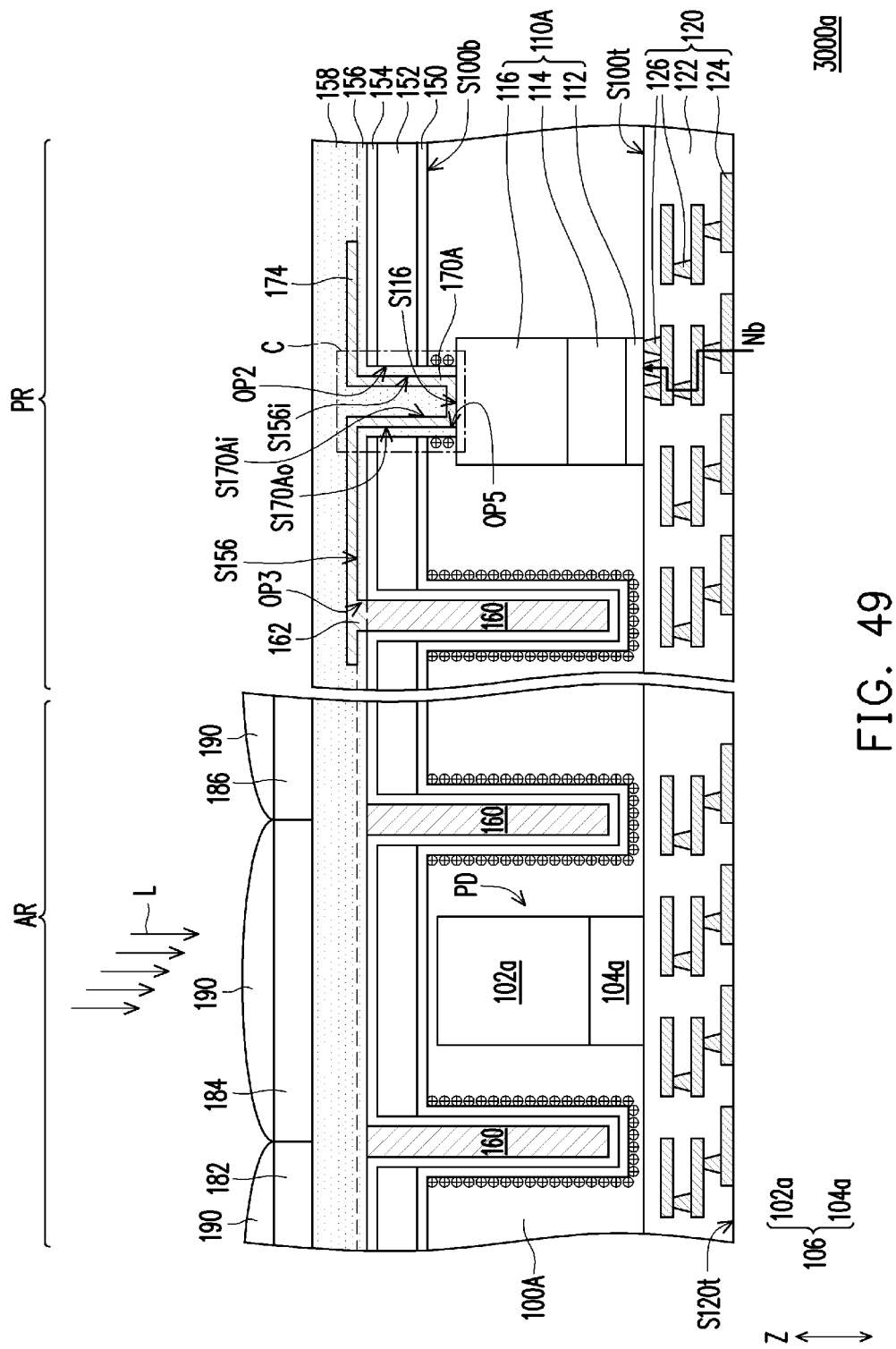
Figure 50:
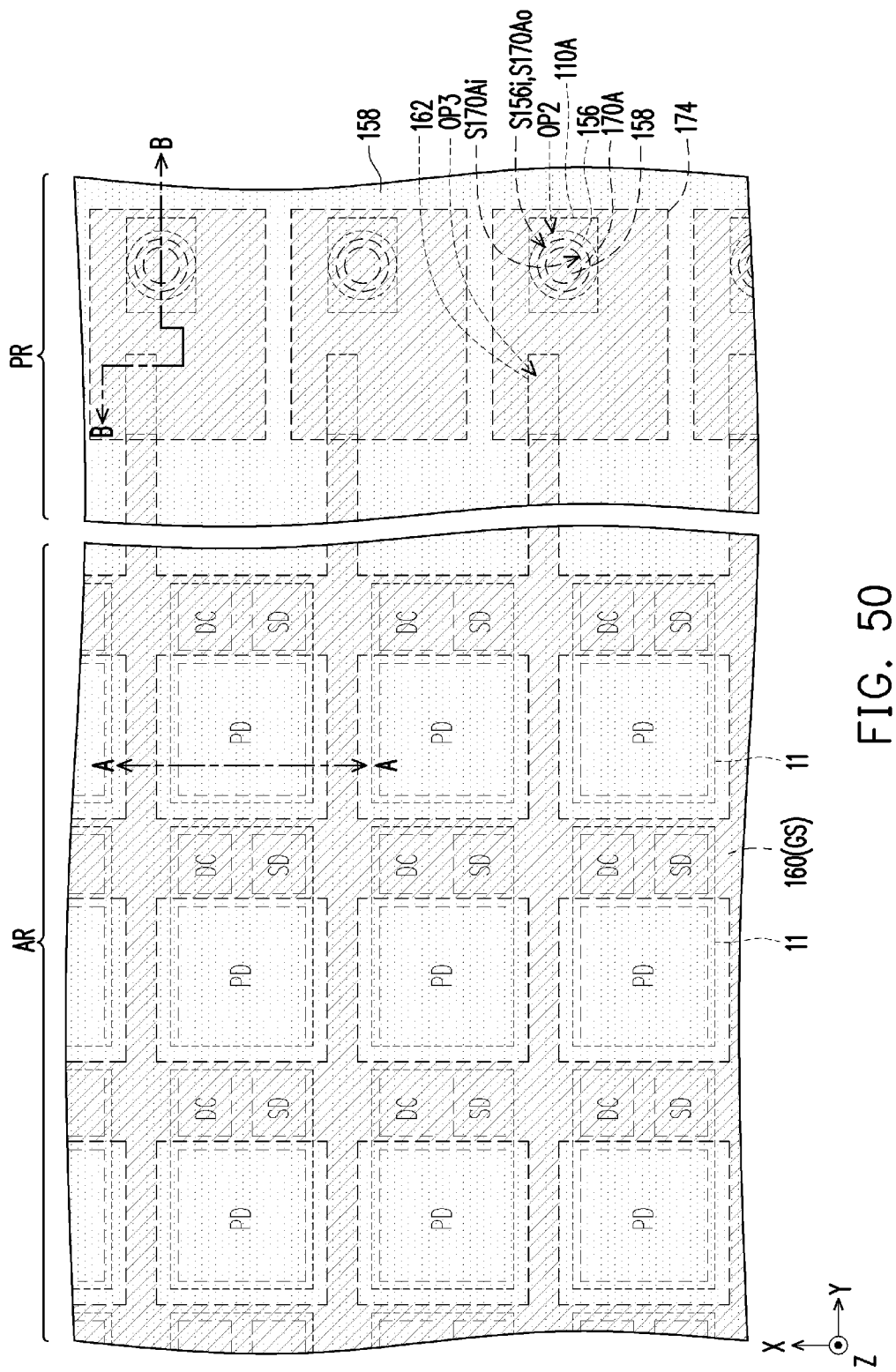
Figure 59:
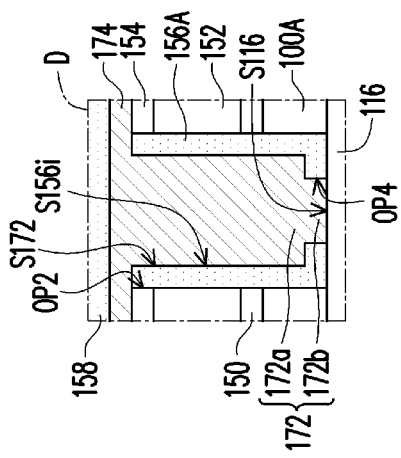

As shown in the image sensor device 3000a of FIG. 49 and in the image sensor device 3000b of FIG. 51, the conductive structures 170A each have a non-step form contour (or profile), for example. However, the disclosure is not limited thereto; alternatively, the conductive structures 170A in the image sensor device 3000a of FIG. 49 and in the image sensor device 3000b of FIG. 51 may be substituted by the conductive structures 170 each having a step-form contour (or profile), as shown in FIG. 59.

Figure 52:
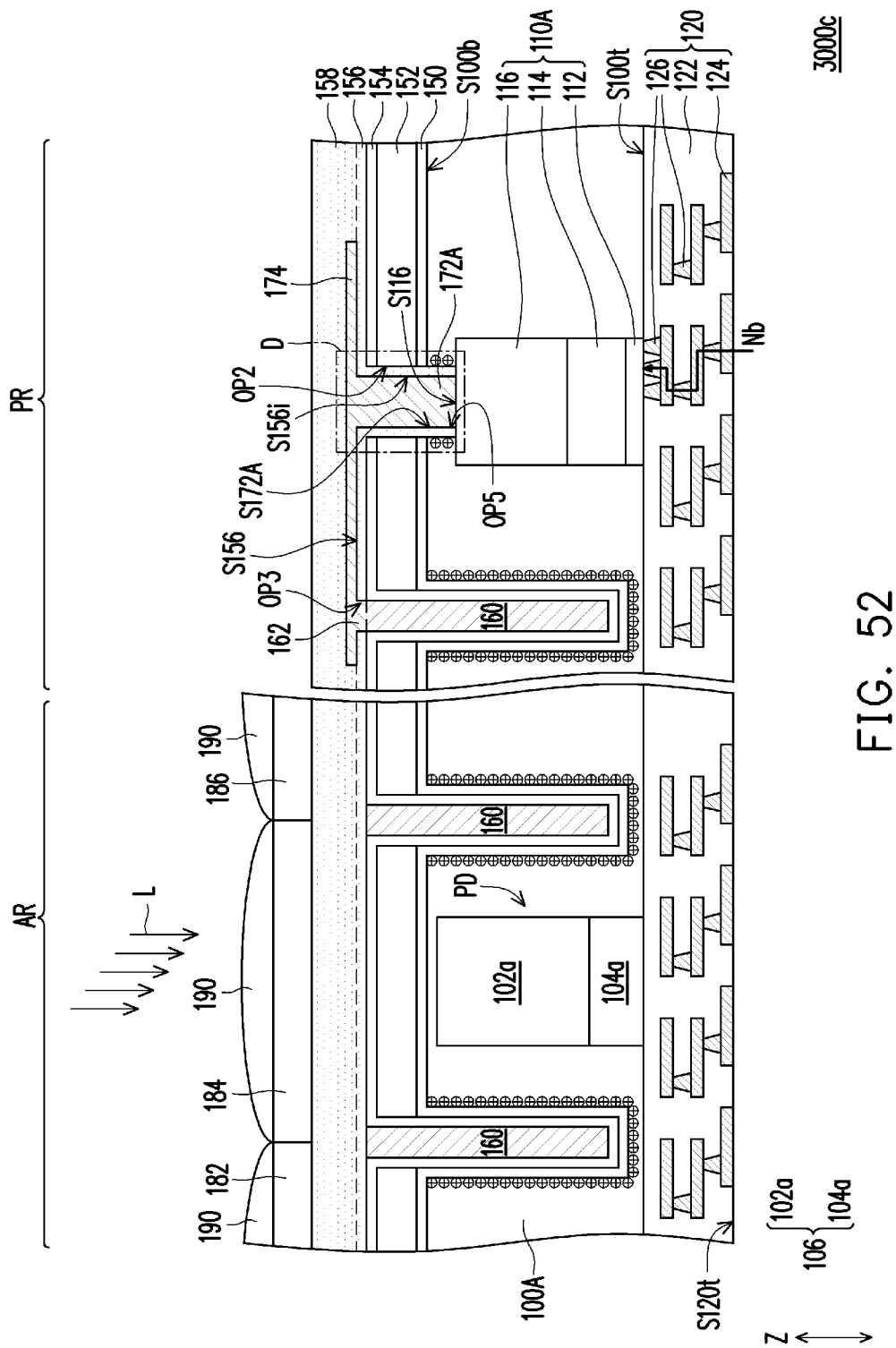
FIG. 52 and FIG. 53 are schematic vertical (or cross-sectional) and horizontal (or plane) views showing an image sensor, in a (semiconductor) image sensor die in accordance with some alternative embodiments of the disclosure.
Figure 53:
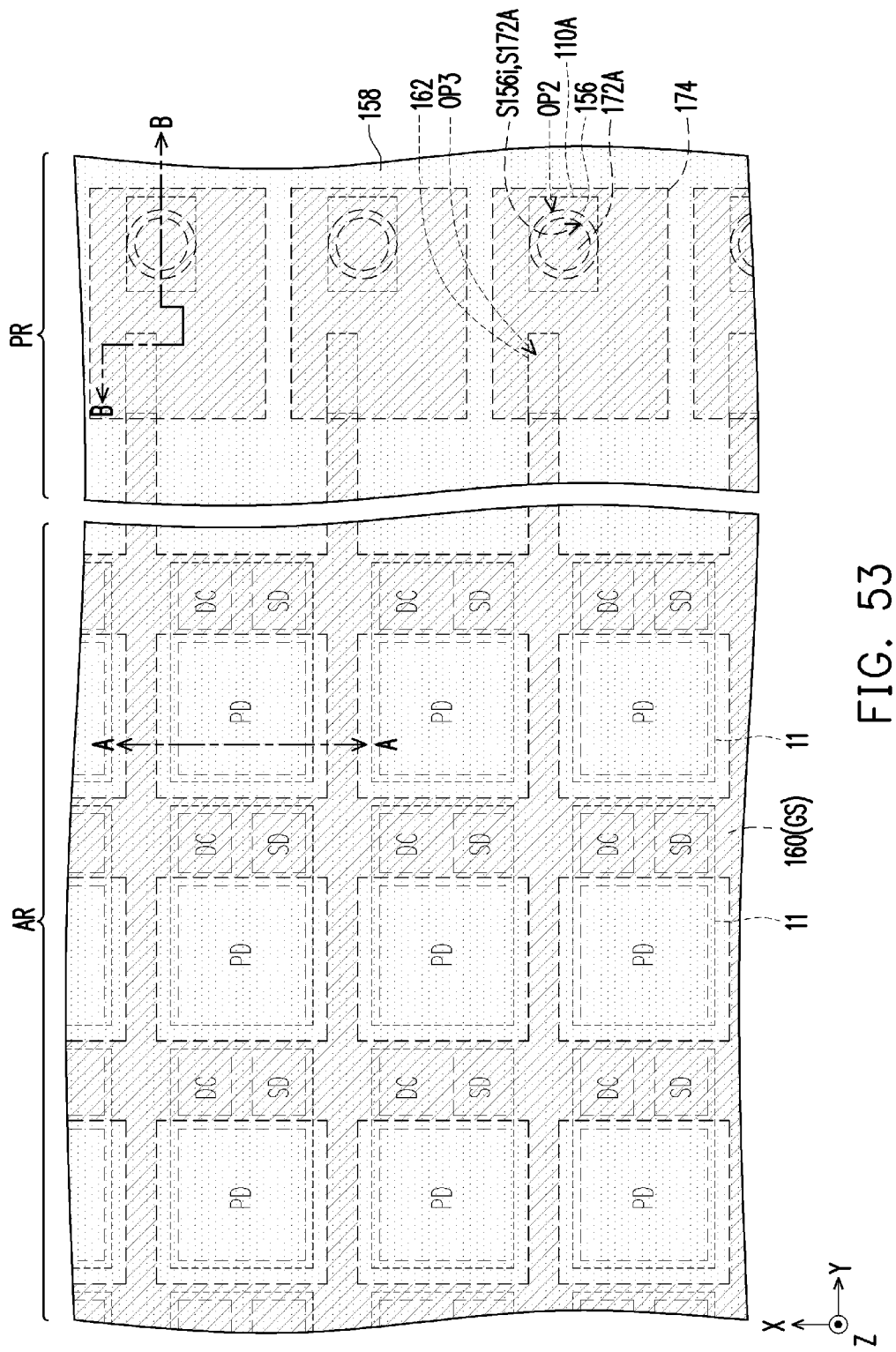

In further alternative embodiments, the conductive structures 170A in the image sensor device 3000a are substituted by conductive structures 172A, see a (semiconductor) image sensor device 3000c of FIG. 52 and FIG. 53. With the presence of the conductive structures 172A, the electrical connection between the isolation structure GS and the interconnect 120 can be ensured. The formation of the conductive structures 172A may be done by a process is similar to or the same as the process previously described in FIG. 40 through FIG. 41. In yet further embodiments, similar to the image sensor device 3000b, a portion of the dielectric layer 156 extending along the X-Y plane over the dielectric layer 154 in the image sensor device 3000c is removed, see a (semiconductor) image sensor device 3000d of FIG. 54. With such configuration, without reducing the isolation ability of the isolation structure GS, an overall thickness of the image sensor device (e.g. 3000d) is further reduced.

Figure 54:
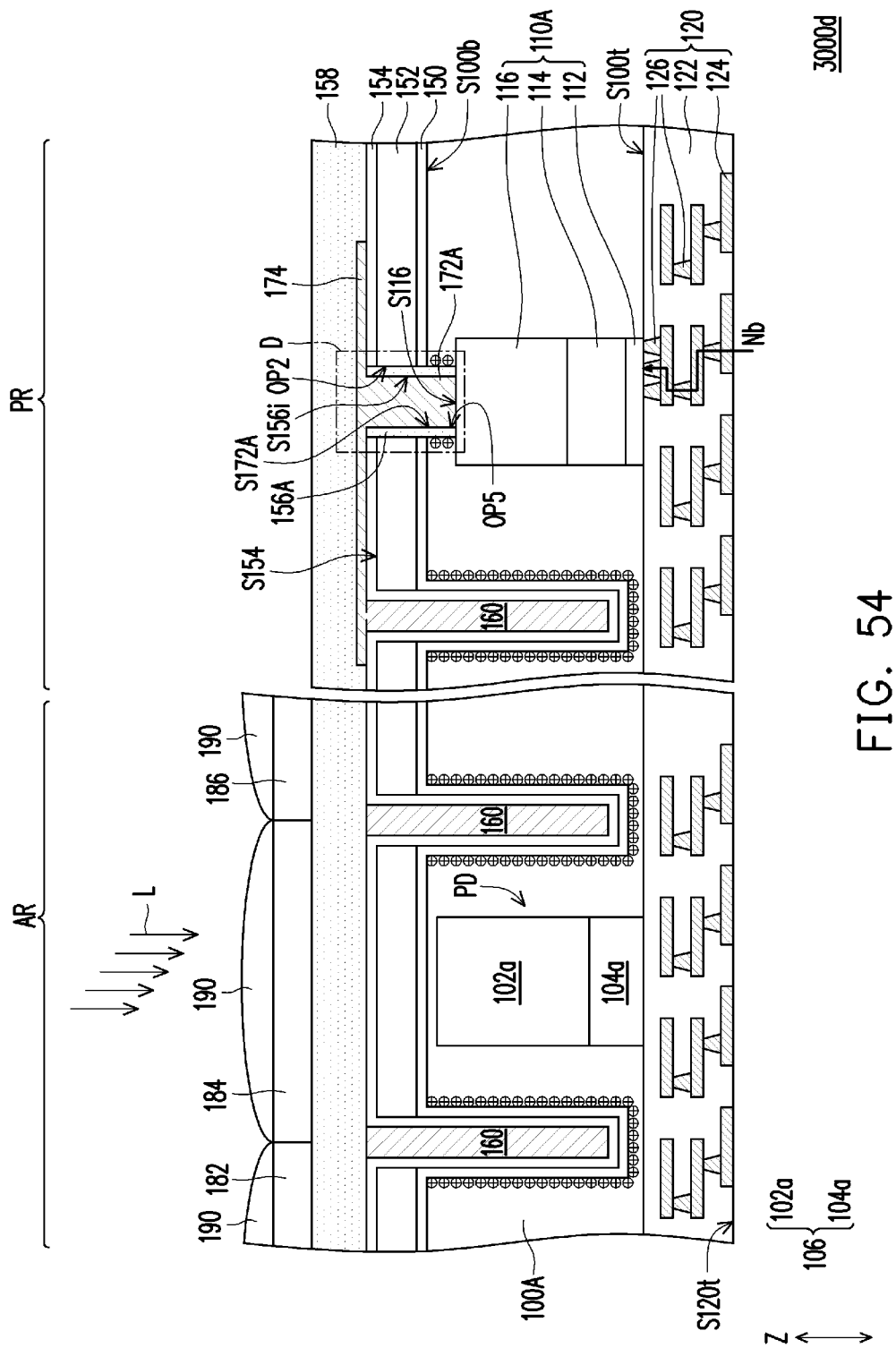
FIG. 54 is a schematic vertical (or cross-sectional) view showing an image sensor, in a (semiconductor) image sensor die in accordance with some alternative embodiments of the disclosure.
Figure 60:
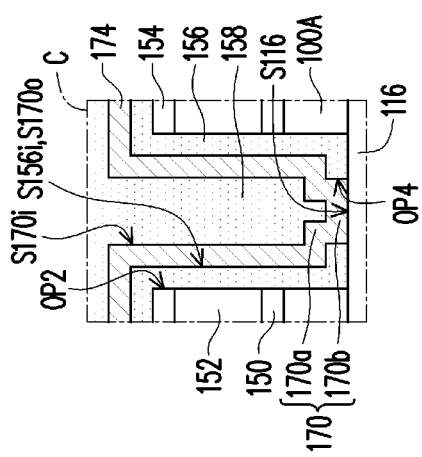

As shown in the image sensor device 3000c of FIG. 52 and in the image sensor device 3000d of FIG. 54, the conductive structures 172A each have a non-step form contour (or profile), for example. However, the disclosure is not limited thereto; alternatively, the conductive structures 172A in the image sensor device 3000c of FIG. 52 and in the image sensor device 3000d of FIG. 54 may be substituted by the conductive structures 172 each having a step-form contour (or profile), as shown in FIG. 60.

FIG. 55 through FIG. 58 are schematic vertical (or cross-sectional) views showing various embodiments of an image sensor included in a semiconductor structure (e.g. a (semiconductor) image sensor device) in accordance with some embodiments of the disclosure. The elements similar to or substantially the same as the elements described previously will use the same reference numbers, and certain details or descriptions of the same elements may not be repeated herein.

Figure 55:
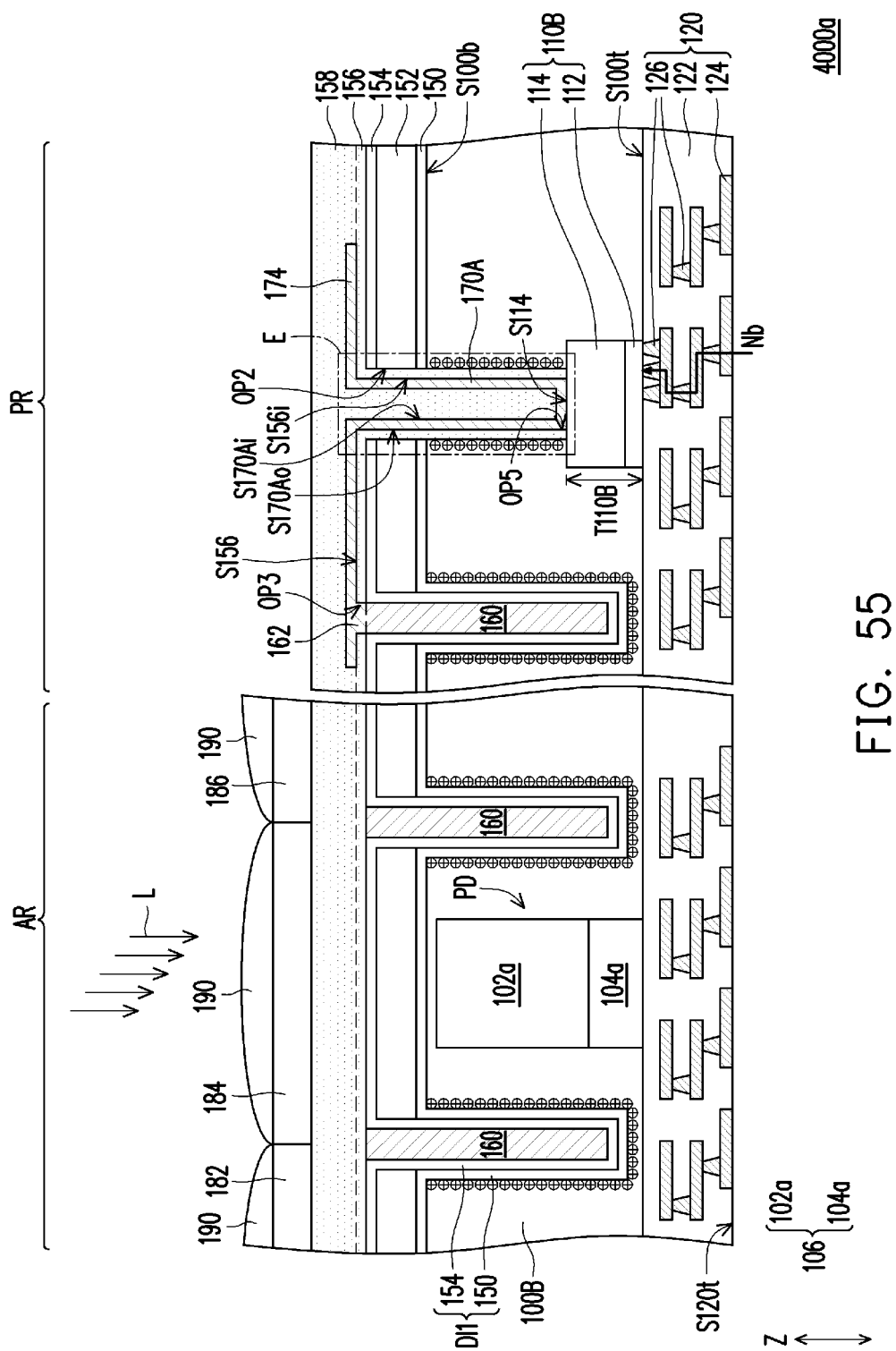
FIG. 55 through FIG. 58 are schematic vertical (or cross-sectional) views showing various embodiments of an image sensor, in a (semiconductor) image sensor die in accordance with some embodiments of the disclosure.

For example, a (semiconductor) image sensor device 4000a of FIG. 55 and the image sensor device 3000a of FIG. 49 are similar; and the difference is that, in the image sensor device 4000a depicted in FIG. 55, a plurality of second isolations (referred to as doped isolation structures) 110B are adopted to substitute the second isolations (referred to as the doped isolation structures) 110A. Rather than the doped isolation structure 110B, the detail and other components of the image sensor device 4000a are similar to the detail and other components of the image sensor device 3000a as described in FIG. 43 through FIG. 50, and thus are not repeated herein for simplicity.

In some embodiments, the doped isolation structures 110B each include a doped region 112 and a doped region 114 being stacked along the direction Z. In some embodiments, along the direction Z, the doped region 112 is located between the interconnect 120 and the doped region 114, where the doped region 114 is not accessibly revealed by the bottom surface S100b of the semiconductor substrate 100B and a surface of the doped region 112 is substantially coplanar to the top surface S100t of the semiconductor substrate 100B. In some embodiments, a thickness T110B of the doped isolation structures 110B is approximately ranging from 0.01 µm to 9.5 µm, where the thickness T110B is measured along a stacking direction of the doped regions 112-114, as shown in FIG. 55. For example, the openings OP2 penetrates the semiconductor substrate 100B to expose (or accessibly revealed) the doped isolation structures 110B (e.g. surfaces S114). In some embodiments, the doped isolation structures 110B are electrically connected to the interconnect 120 through a layer (e.g. one or more than one via/contact 126 being most distant from the top surface S120t) of the metallization layers of the interconnect 120. In some embodiments, as shown in FIG. 55, the conductive patterns 174 electrically connects the conductive structures 170A to the conductive grid 160 of the isolation structure GS, where the isolation structure GS is electrically connected to the interconnect 120 (e.g., the vias 126) through the doped isolation structures 110B, the conductive structures 170A and the conductive patterns 174. With such isolation structure GS, a better isolation for the photosensitive devices PD is provided, and thus improving the performance of the image sensor 10.

Figure 56:
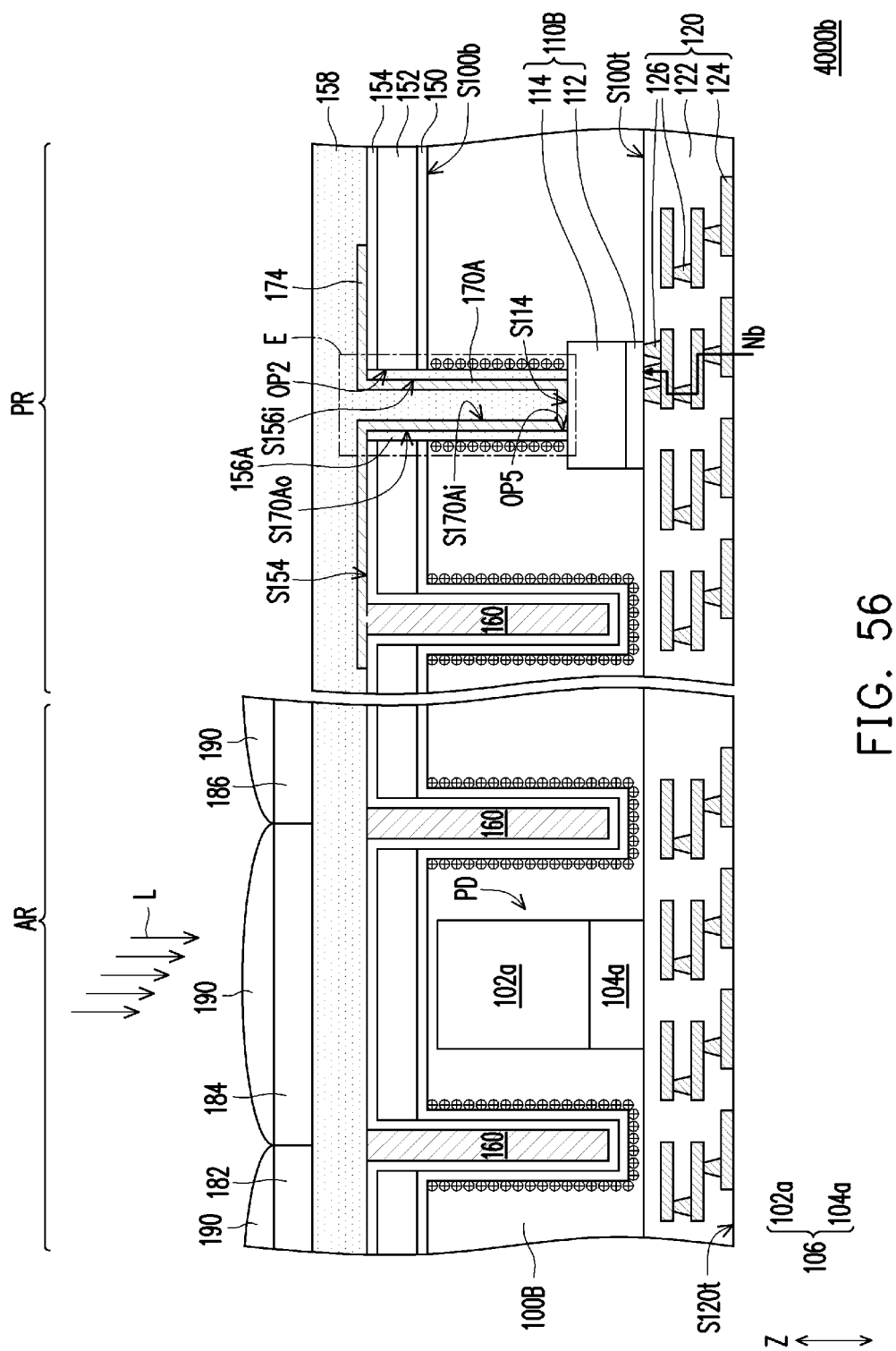

In alternative embodiments, a portion of the dielectric layer 156 extending along the X-Y plane over the dielectric layer 154 in the image sensor device 4000a is removed, see a (semiconductor) image sensor device 4000b of FIG. 56. The removal of the such portion of the dielectric layer 156 may be done by a process is similar to or the same as the process previously described in FIG. 25 or the processes previously described in FIG. 33 through FIG. 36. With such configuration, without reducing the isolation ability of the isolation structure GS, an overall thickness of the image sensor device (e.g. 4000b) is further reduced. As shown in the image sensor device 4000a of FIG. 55 and in the image sensor device 4000b of FIG. 56, the conductive structures 170A each have a non-step form contour (or profile), for example. However, the disclosure is not limited thereto; alternatively, the conductive structures 170A in the image sensor device 4000a of FIG. 55 and in the image sensor device 4000b of FIG. 56 may be substituted by the conductive structures 170 each having a step-form contour (or profile), as shown in FIG. 61.

Figure 57:
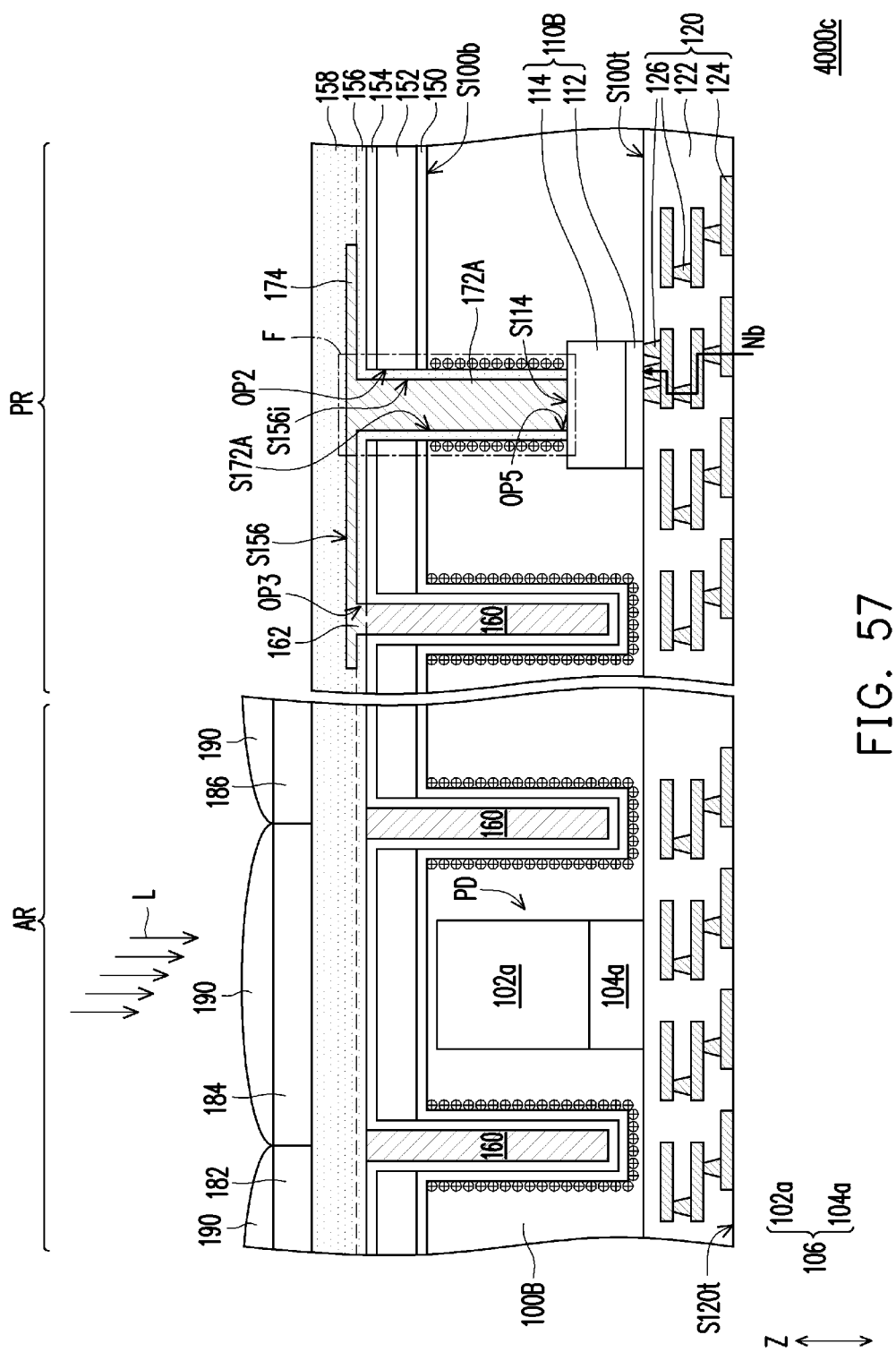
Figure 58:
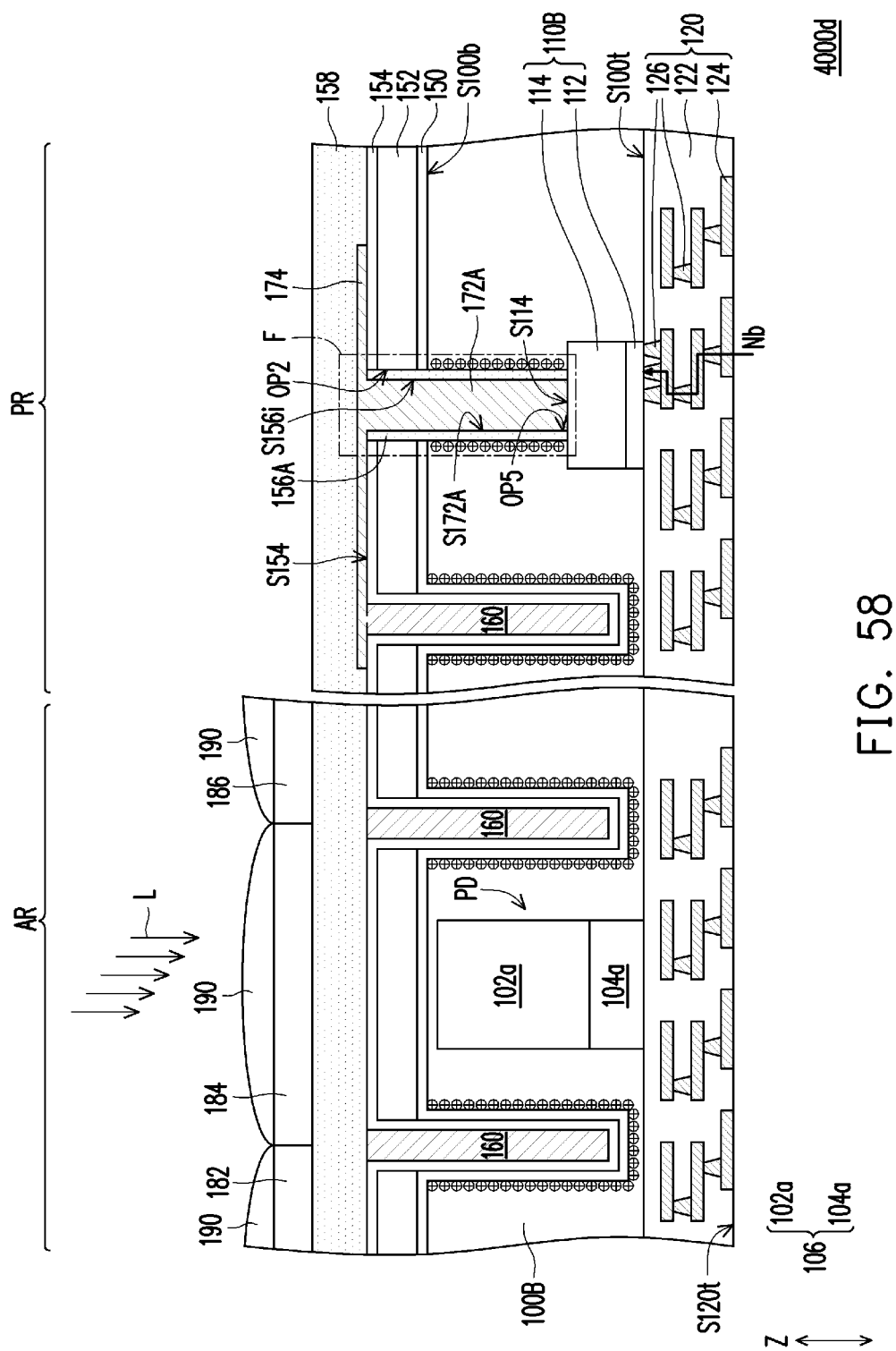

In further alternative embodiments, the conductive structures 170A in the image sensor device 4000a are substituted by conductive structures 172A, see a (semiconductor) image sensor device 4000c of FIG. 57. With the presence of the conductive structures 172A, the electrical connection between the isolation structure GS and the interconnect 120 can be ensured. The formation of the conductive structures 172A may be done by a process is similar to or the same as the process previously described in FIG. 40 through FIG. 41. In yet further embodiments, similar to the image sensor device 4000b, a portion of the dielectric layer 156 extending along the X-Y plane over the dielectric layer 154 in the image sensor device 4000c is removed, see a (semiconductor) image sensor device 4000d of FIG. 58. With such configuration, without reducing the isolation ability of the isolation structure GS, an overall thickness of the image sensor device (e.g. 4000d) is further reduced. As shown in the image sensor device 4000c of FIG. 57 and in the image sensor device 4000d of FIG. 58, the conductive structures 172A each have a non-step form contour (or profile), for example. However, the disclosure is not limited thereto; alternatively, the conductive structures 172A in the image sensor device 4000c of FIG. 57 and in the image sensor device 4000d of FIG. 58 may be substituted by the conductive structures 172 each having a step-form contour (or profile), as shown in FIG. 62.

Figure 75:
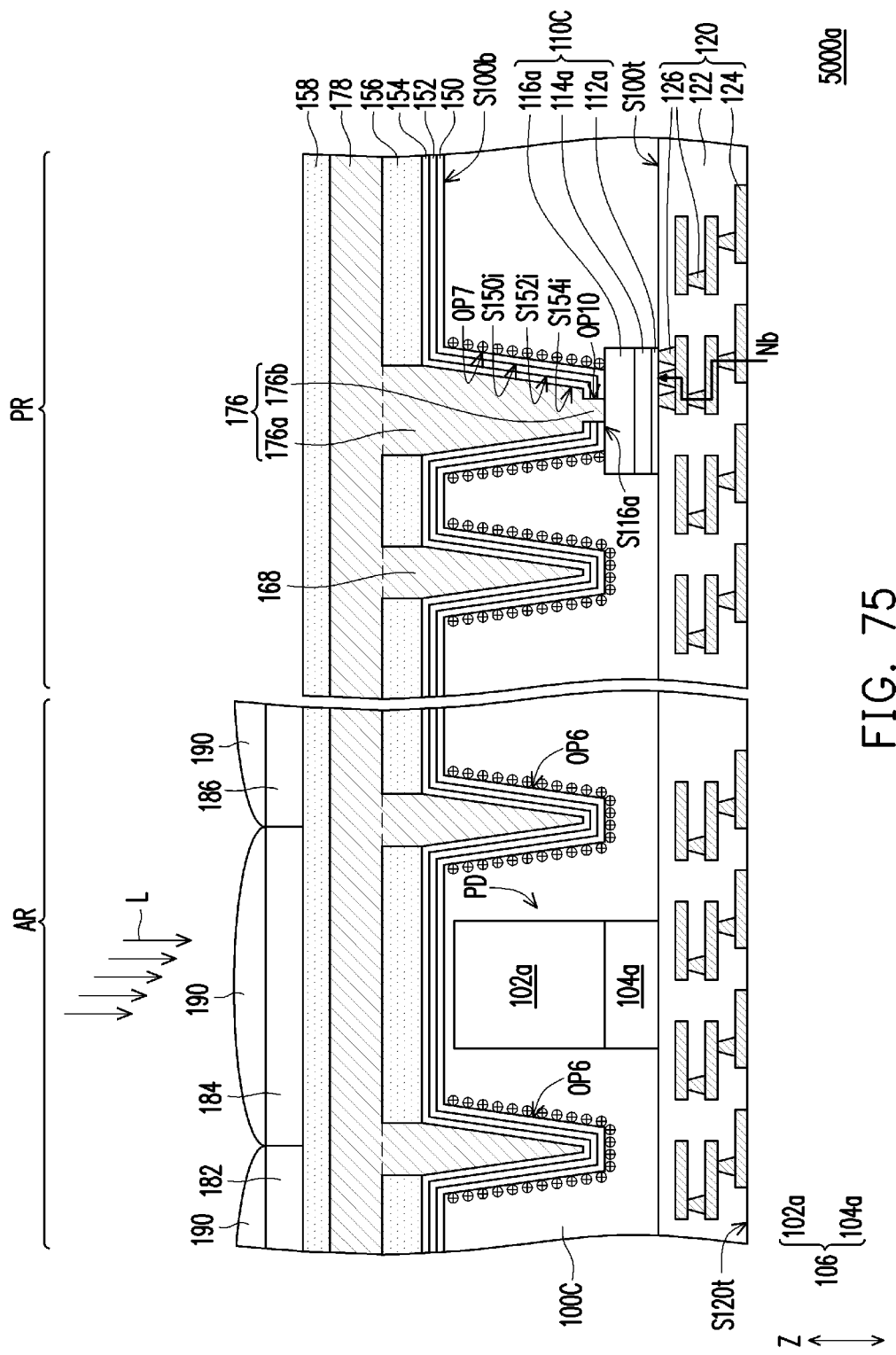
Figure 76:
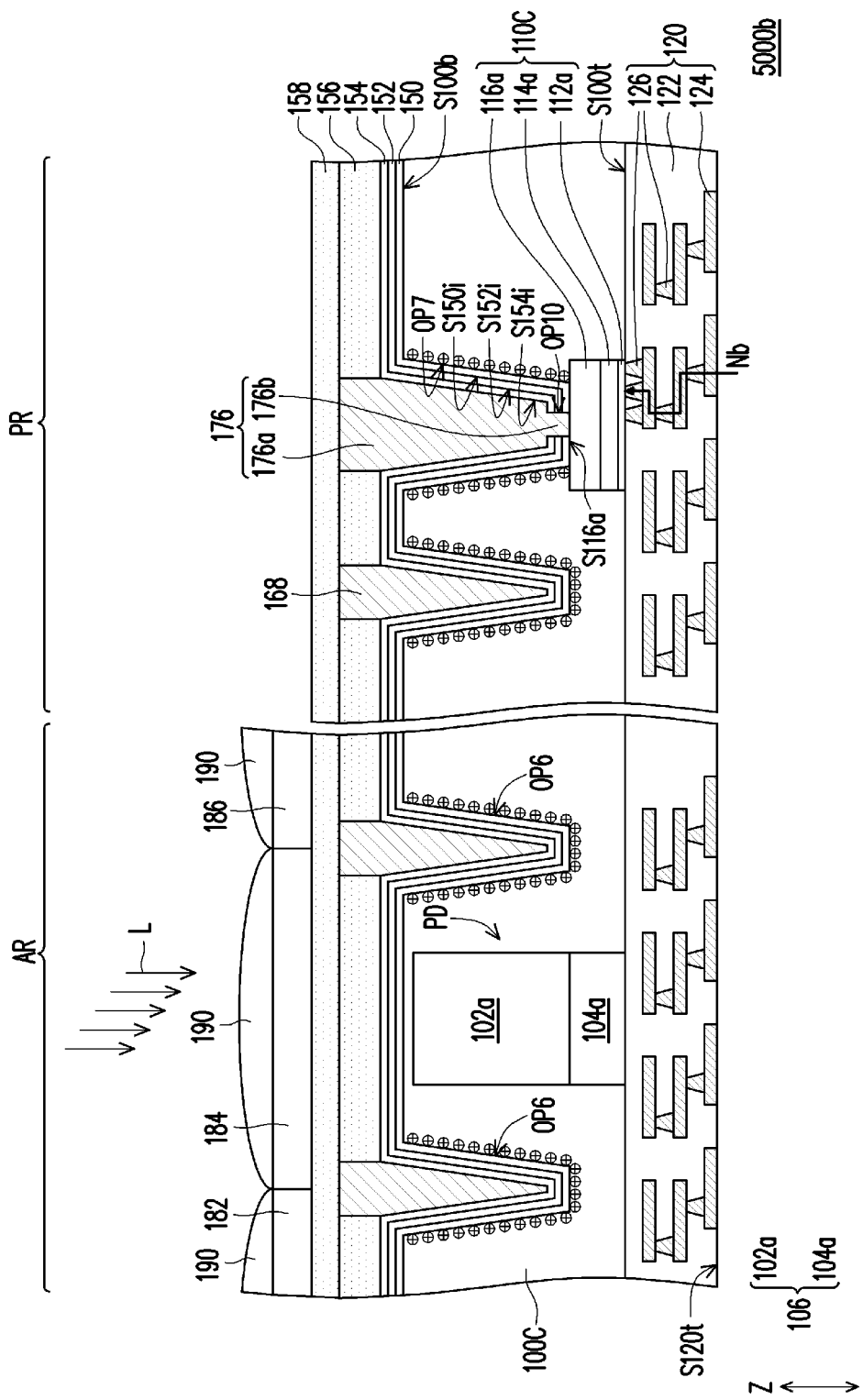
FIG. 76 is a schematic vertical (or cross-sectional) view showing an image sensor, in a (semiconductor) image sensor die in accordance with some alternative embodiments of the disclosure.

FIG. 63 through FIG. 75 are schematic vertical and horizontal views showing a method of manufacturing an image sensor included in an semiconductor structure (e.g. a (semiconductor) image sensor device 2000a) in accordance with some embodiments of the disclosure, where FIG. 63, FIG. 65, FIG. 67, FIG. 69, FIG. 71 and FIG. 73 are the cross-sectional views taken along lines A-A and B-B depicted in FIG. 64, FIG. 66, FIG. 68A, FIG. 70A, FIG. 72A and FIG. 74. FIG. 76 is a schematic vertical view showing an image sensor, in a (semiconductor) image sensor die in accordance with some alternative embodiments of the disclosure. The elements similar to or substantially the same as the elements described previously will use the same reference numbers, and certain details or descriptions of the same elements may not be repeated herein.

Figure 63:
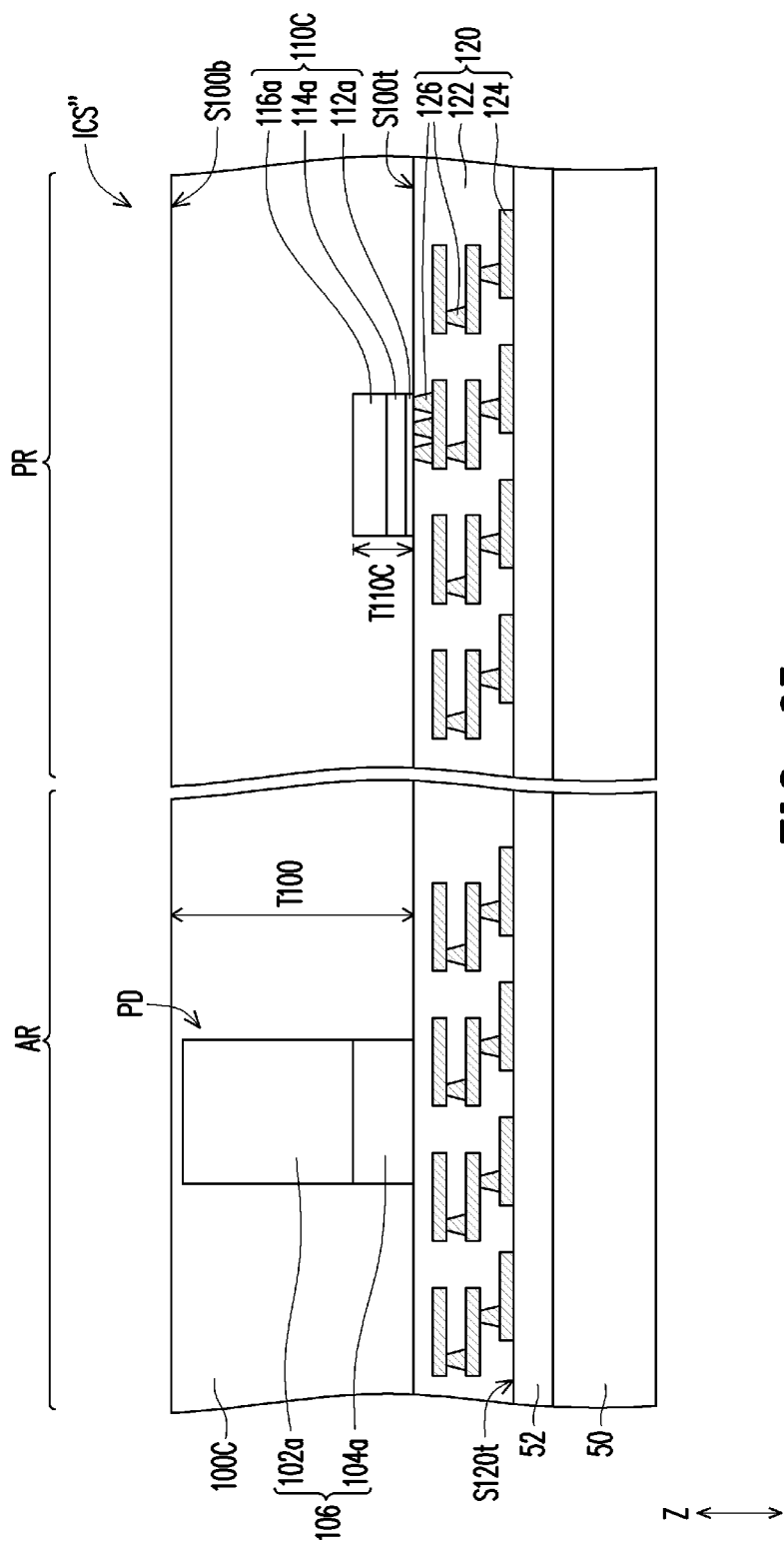
FIG. 63, FIG. 65, FIG. 67, FIG. 69, FIG. 71, FIG. 73 and FIG. 75 are schematic vertical (or cross-sectional) views showing a method of manufacturing an image sensor, in a (semiconductor) image sensor die in accordance with some embodiments of the disclosure.
Figure 64:
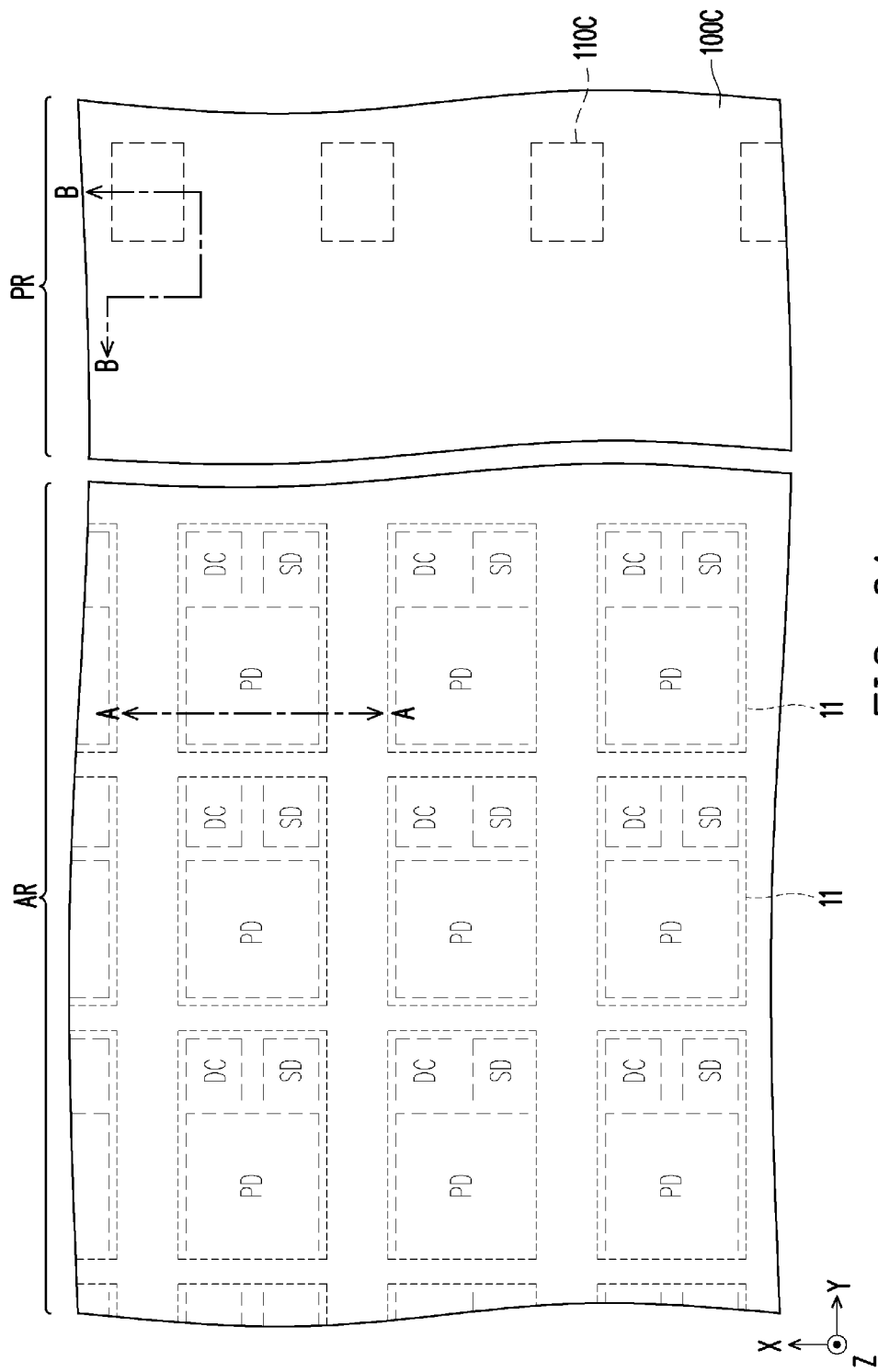
FIG. 64, FIG. 66, FIG. 68A, FIG. 68B, FIG. 70A, FIG. 70B, FIG. 72A, FIG. 72B and FIG. 74 are schematic horizontal (or plane) views illustrating a relative position of components included in the image sensor depicted in FIG. 63, FIG. 65, FIG. 67, FIG. 69, FIG. 71 and FIG. 73.

Referring to FIG. 63 and FIG. 64, in some embodiments, an initial integrated circuit structure ICS" is provided and placed on a carrier 50 through a debond layer 52, then the initial integrated circuit structure ICS" is thinned by the process as previously described in FIG. 6. The initial integrated circuit structure ICS" of FIG. 63 is similar to the initial integrated circuit structure ICS' as described in FIG. 43; and the difference is that, in initial integrated circuit structure ICS" of FIG. 63, a plurality of second isolations (referred to as doped isolation structures) 110C are adopted to substitute the second isolations (referred to as the doped isolation structures) 110A. Rather than the doped isolation structure 110C, the detail and other components of the initial integrated circuit structure ICS" are similar to the detail and other components of the initial integrated circuit structure ICS' as described in FIG. 43 through FIG. 44, and thus are not repeated herein for simplicity.

In some embodiments, the doped isolation structures 110C each include a doped region (referred to as a p+ doping region or a p+ well) 112a, a doped region (referred to a heavily doped region or a cell p-well (CPW)) 114a and a doped region (referred to as a heavily doped region or a deep p-well (DPW)) 116a being stacked along the direction Z. In some embodiments, along the direction Z, the doped region 112a is located between the interconnect 120 and the doped region 114a, and the doped region 114a is located between the doped region 112a and the doped region 116a. For example, as shown in FIG. 63, the doped region 116a is not accessibly revealed by the bottom surface S100b of the semiconductor substrate 100C and a surface of the doped region 112a is substantially coplanar to the top surface S100t of the semiconductor substrate 100C to electrically connect to the interconnect 120 through a layer (e.g. one or more than one via/contact 126 being most distant from the top surface S120t) of the metallization layers of the interconnect 120. In some embodiments, a thickness T110C of the doped isolation structures 110C is approximately ranging from 0.01 µm to 10 µm, where the thickness T110C is measured along a stacking direction of the doped regions 112a-116a, as shown in FIG. 63. The formations and materials of the doped regions 112a-116a are the same or similar to the processes and materials of forming the doped regions 112-116 as previously described in FIG. 43 through FIG. 44, and thus are not repeated herein for simplicity.

Figure 65:
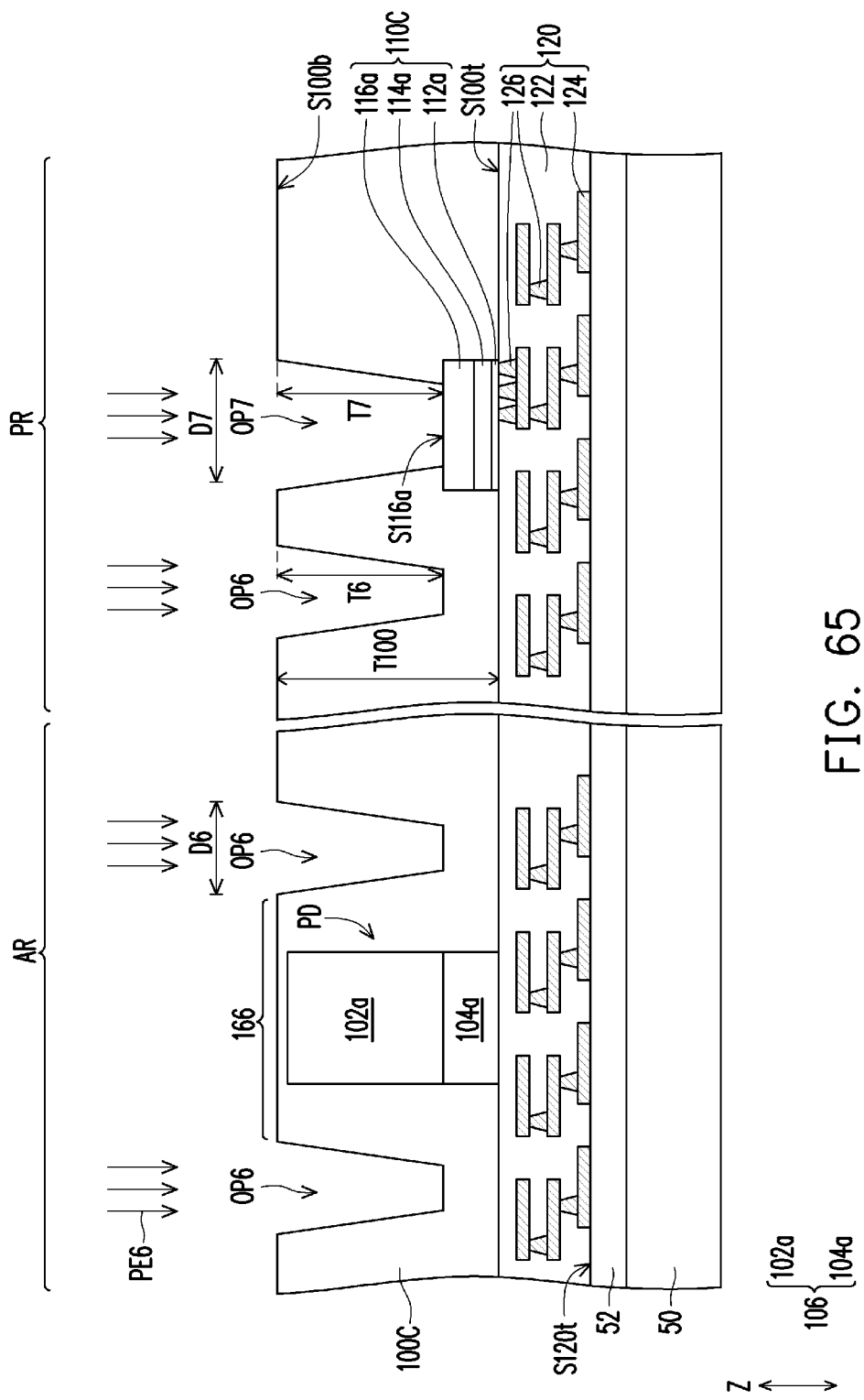
Figure 66:
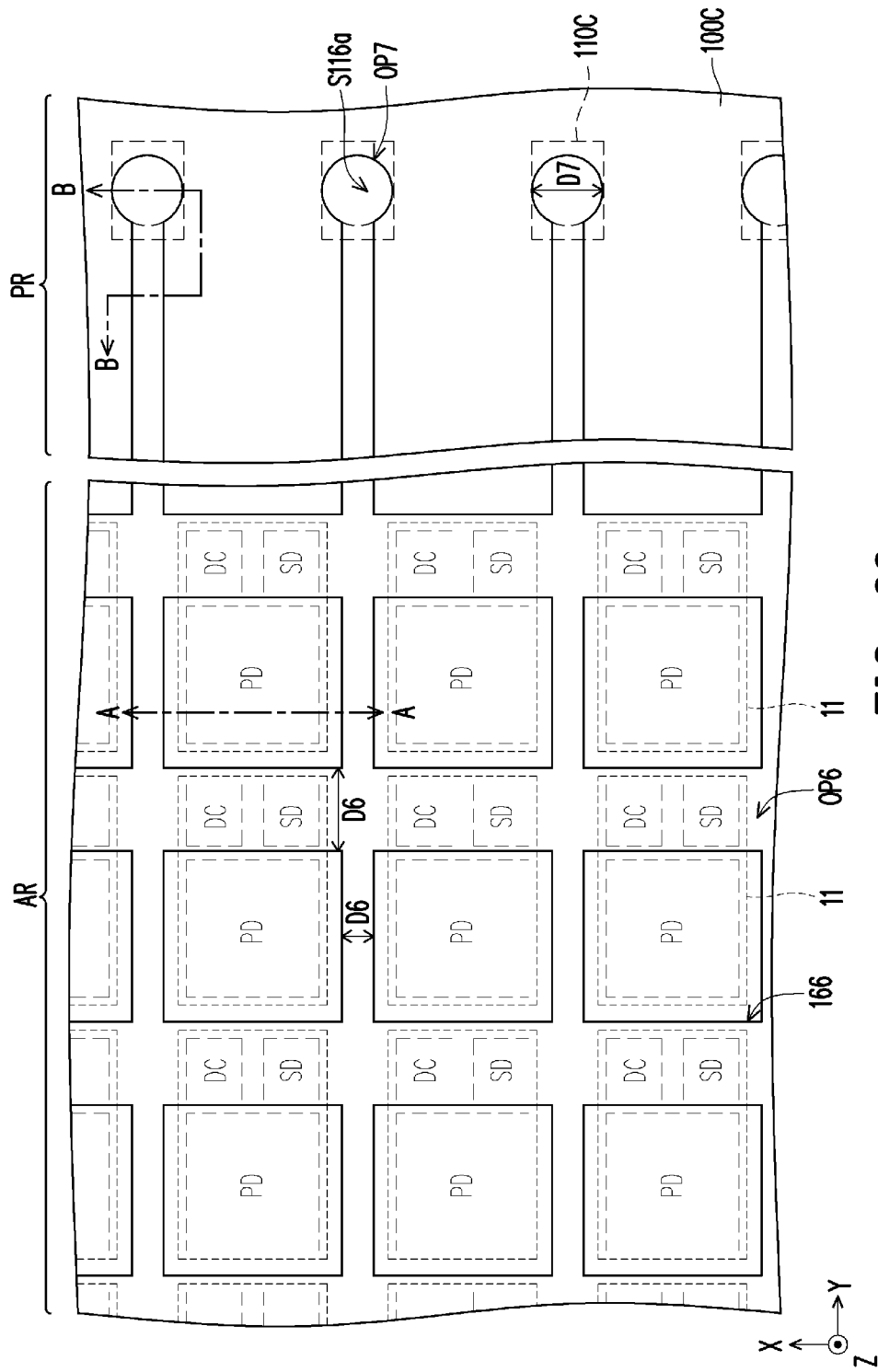

Referring to FIG. 65 and FIG. 66, in some embodiments, a patterning process PE6 is performed to form a plurality of trenches OP6 and a plurality of openings OP7. The patterning process PE6 may be the same or identical to the patterning process PE1 as described in FIG. 7 and FIG. 8 but using a different patterned mask layer, and thus is not repeated herein for brevity. As shown in FIG. 65 and FIG. 66, the trenches OP6 are formed in the active region AR and further extended to the peripherical region PR to be spatially communicated to the openings OP7 formed only in the peripherical region PR. For example, the trenches OP6 may be continuous trenches and may be configured as a grid shape (e.g. a form of grid mesh) within the active region AR. That is, the trenches OP6 may together be referred to as a grid (mesh) cavity formed in the semiconductor substrate 100C within the active region AR. As shown in FIG. 65 and FIG. 66, for example, the photosensitive devices PD are positioned in a plurality of regions 166 confined by the trenches OP6. In some embodiments, top surfaces S116a of the doped isolation structures 110C are exposed (e.g. accessibly revealed) by the openings OP7.

For example, a height T6 of the trenches OP6 is approximately ranging from 0.1 µm to 20 µm. In one embodiment, the height T6 of the trenches OP6 is less than the thickness T100 of the semiconductor substrate 100C. In alternative embodiment, the height T6 of the trenches OP6 is substantially equal to the thickness T100 of the semiconductor substrate 100C. For example, a width D6 of the trenches OP6 is approximately ranging from 0.01 µm to 5 µm, where the width D6 is measured along a direction perpendicular to an extending direction of the trenches OP6, as shown in FIG. 65 and FIG. 66. For example, a height T7 of the openings OP7 is approximately ranging from 0.1 µm to 20.9 µm. In one embodiment, the height T7 of the openings OP7 is less than the thickness T100 of the semiconductor substrate 100C. In alternative embodiment, the height T7 of the openings OP7 is substantially equal to the thickness T100 of the semiconductor substrate 100C. For example, a width D7 of the openings OP7 is approximately ranging from 0.013 µm to 25 µm, where the width D7 is measured along a direction perpendicular to an extending direction of the openings OP7, as shown in FIG. 65. In some embodiments, the width D6 of the trenches OP6 is less than the width D7 of the openings OP7. For example, a ratio of the width D6 of the trenches OP6 to the width D7 of the openings OP7 is approximately ranging from 1:1.3 to 1:5.

Figure 67:
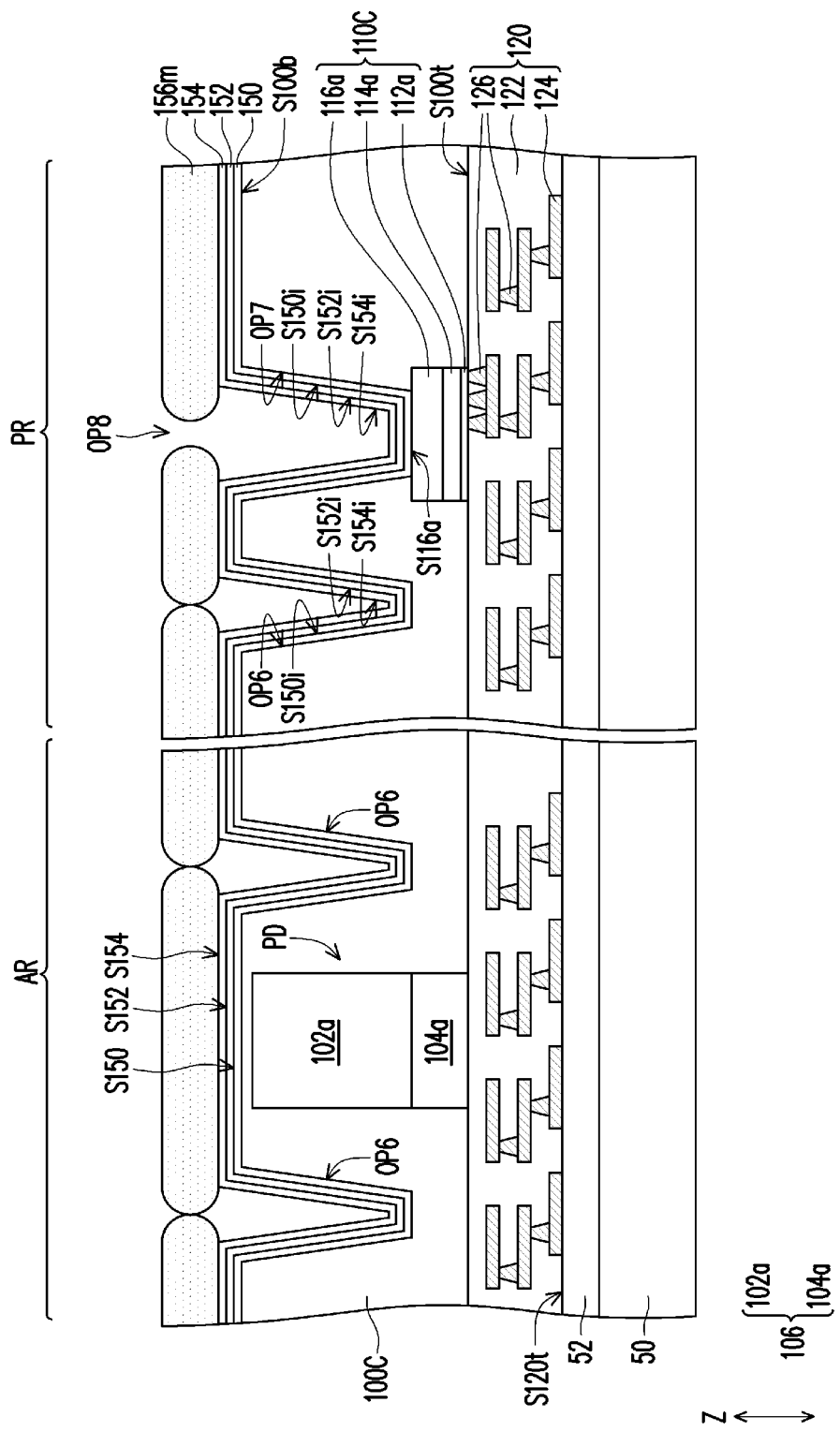
Figure 68A:
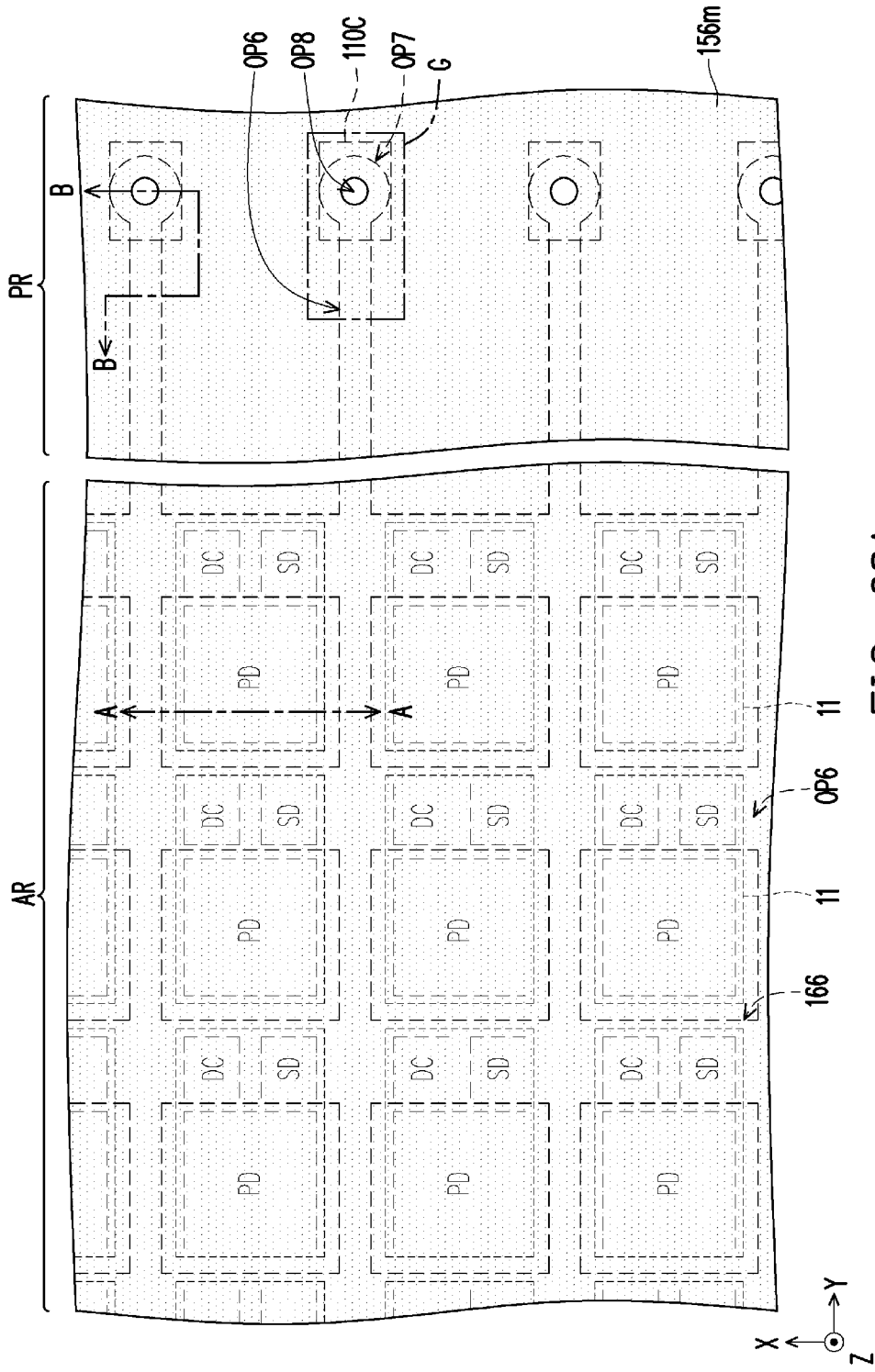
Figure 68B:
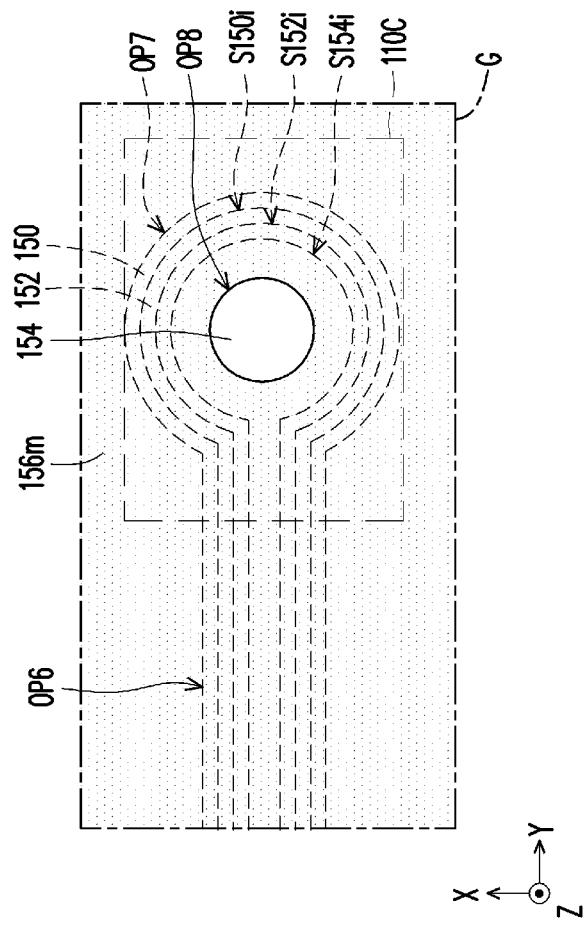

Referring to FIG. 67, FIG. 68A and FIG. 68B, in some embodiments, a dielectric layer 150, a dielectric layer 152, a dielectric layer 154, and a dielectric layer 156m and a dielectric layer 158 are sequentially formed over the semiconductor substrate 100C along the bottom surface S100B. For example, the dielectric layer 150 are conformally formed on the bottom surface S100b of the semiconductor substrate 100C and further extends into sidewalls (not labeled) and bottom surfaces (not labeled) of the trenches OP6 and the openings OP7, the dielectric layer 152 are conformally formed on a top surface S150 of the dielectric layer 150 and further extends into the trenches OP6 and the openings OP7 to cover the dielectric layer 150, and the dielectric layer 154 are conformally formed on a top surface S152 of the dielectric layer 152 and further extends into the trenches OP6 and the openings OP7 to cover the dielectric layer 152. The dielectric layers 150, 152 and 154 individually may also be referred to as a dielectric liner (of the trenches OP6 and the openings OP7). In some embodiments, the dielectric layers 150, 152 and 154 each may be formed using a suitable process having good gap-filling ability or slow depositing ratio, such as atomic layer deposition ALD. The materials of the dielectric layers 150, 152 and 154 has been described in FIG. 9 and FIG. 10, and thus are not repeated herein for simplicity. In an alternative embodiment, the dielectric layer 152 may be omitted.

After the formation of the dielectric layer 154, the dielectric layer 156m is formed on the top surface S154 of the dielectric layer 154 without extending into the trenches OP6 and the openings OP7. In some embodiments, the dielectric layer 156m is formed by a deposition process having poor gap-filling ability or fast depositing ratio, such as PECVD process. As such, the dielectric layer 156m may be formed as a non-conformal layer. In some embodiments, the thickness of the dielectric layer 156m over the bottom surface S100b of the semiconductor substrate 100C is much thicker than the thickness of the dielectric layer 156m over the trenches OP6 and the openings OP7. In some embodiments, the dielectric layer 156m is substantially not filled in the trenches OP6 and the openings OP7. Owing to the ratio between the width D6 of the trenches OP6 and the width D7 of the openings OP7, the tops of the trenches OP6 are covered by the dielectric layer 156m while the tops of the openings OP7 are not completely covered by the dielectric layer 156m, in some embodiments, as shown in FIG. 67. As shown in FIG. 67, FIG. 68A and FIG. 68B, for example, a plurality of openings OP8 formed in the dielectric layer 156m expose the openings OP7, respectively. That is, positioning locations of the openings OP8 are overlapped with positioning locations of the openings OP7 in the vertical projection on the semiconductor substrate 100C along the direction Z, as shown in FIG. 68A and FIG. 68B. The materials of the dielectric layer 156m is the same or similar to the material of the dielectric layer 156 as described in FIG. 15 and FIG. 16, and thus are not repeated herein for brevity.

Figure 69:
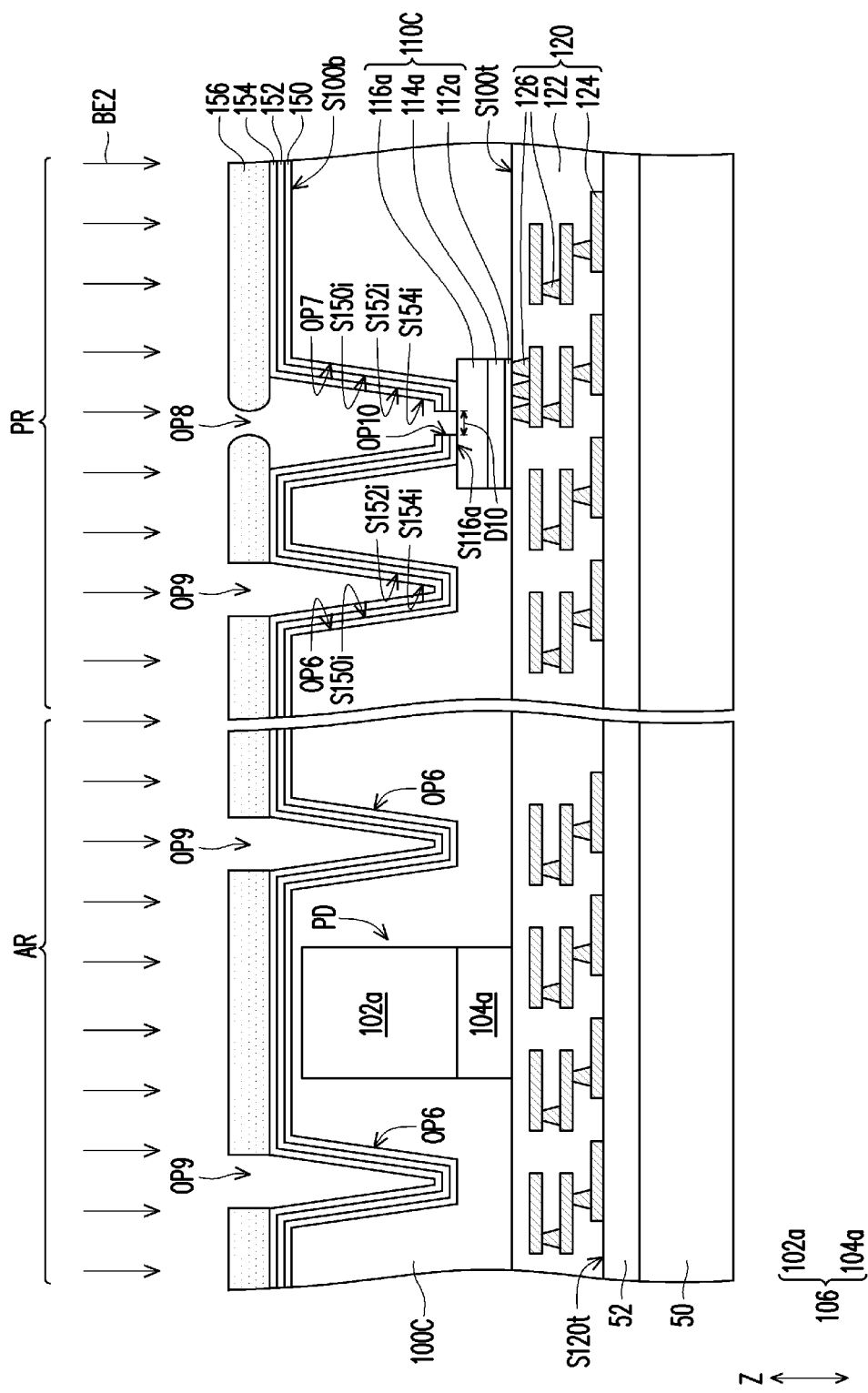
Figure 70A:
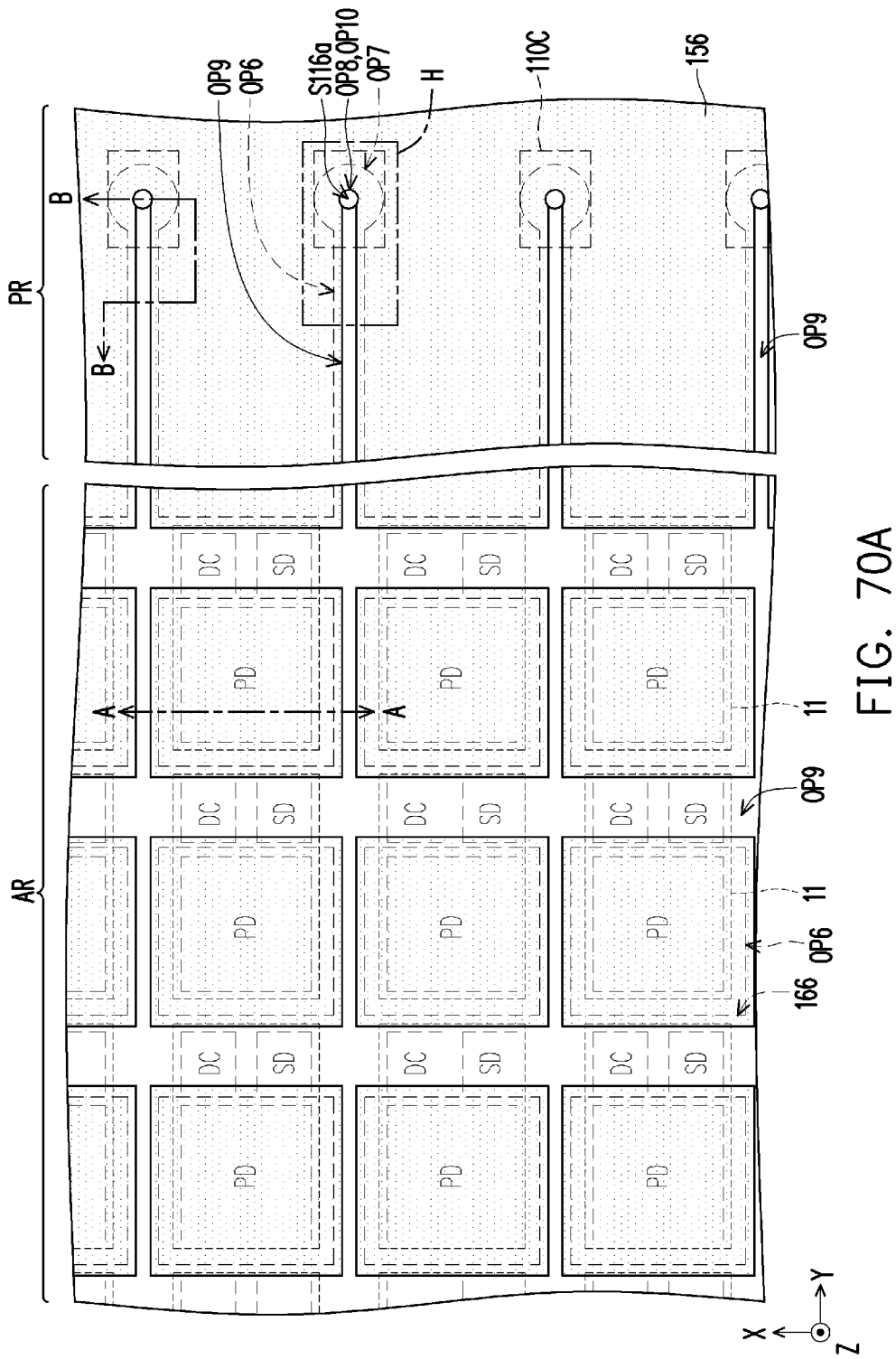
Figure 70B:
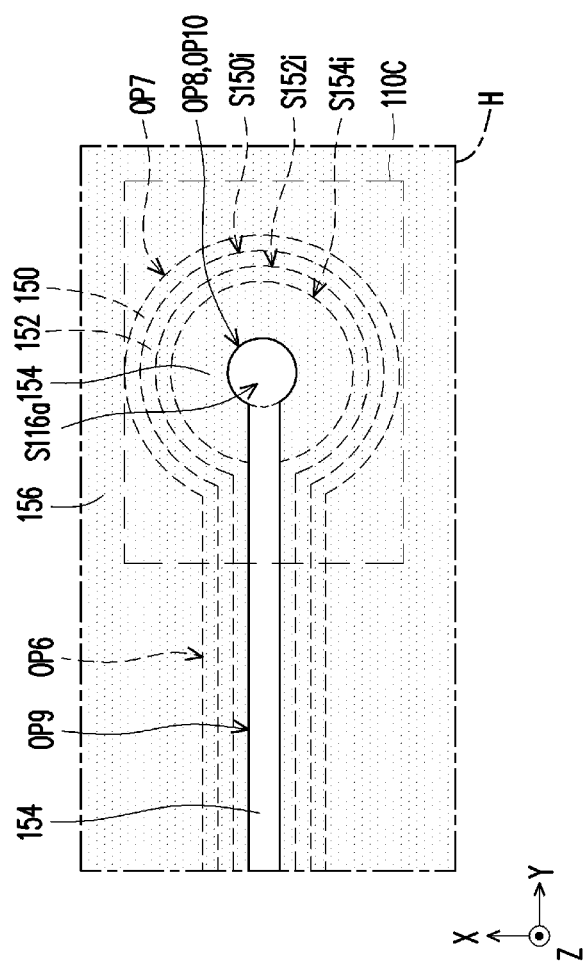

Referring to FIG. 69, FIG. 70A and FIG. 70B, in some embodiments, a patterning process BE2 is performed on the dielectric layer 156m to form a dielectric layer 156 having a plurality of trenches OP9 and the openings OP8 and further to form a plurality of openings OP10 penetrating through portions of the dielectric layers 150, 152 and 154 on the bottom surfaces of the openings OP7 and overlapped with the openings OP8. The patterning process BE2 may be the same or identical to the patterning process BE1 as described in FIG. 31 and FIG. 32, and thus is not repeated herein for brevity.

In some embodiments, the trenches OP9 are formed over and within the trenches OP6, where the trenches OP9 are formed in the active region AR and further extended to the peripherical region PR to be spatially communicated to the openings OP8 formed only in the peripherical region PR. For example, the trenches OP9 may be continuous trenches and may be configured as a grid shape (e.g. a form of grid mesh) within the active region AR. That is, the trenches OP9 may together also be referred to as a grid (mesh) cavity formed inside the trenches OP6, in the semiconductor substrate 100C within the active region AR.

In some embodiments, the openings OP10 are formed under and spatially communicated to the openings OP8 and the openings OP7, in the peripherical region PR. For example, as shown in FIG. 69, FIG. 70A and FIG. 70B, top surfaces S116a of the doped isolation structures 110C are exposed (e.g. accessibly revealed) by the openings OP10. In some embodiments, a size D10 of the openings OP10 is substantially equal to a size (not labeled) of the openings OP8.

If considering a plane view (e.g. the X-Y plane) of the openings OP7, OP8, and/or OP10, the shapes of the openings OP7, OP8, and/or OP10 may independently include a circular shape. However, the disclosure is not limited thereto; in an alternative embodiment, the shapes of the openings OP7, OP8, and/or OP10 on the plane view are, for example, rectangular, elliptical, oval, tetragonal, octagonal or any suitable polygonal shape.

Figure 71:
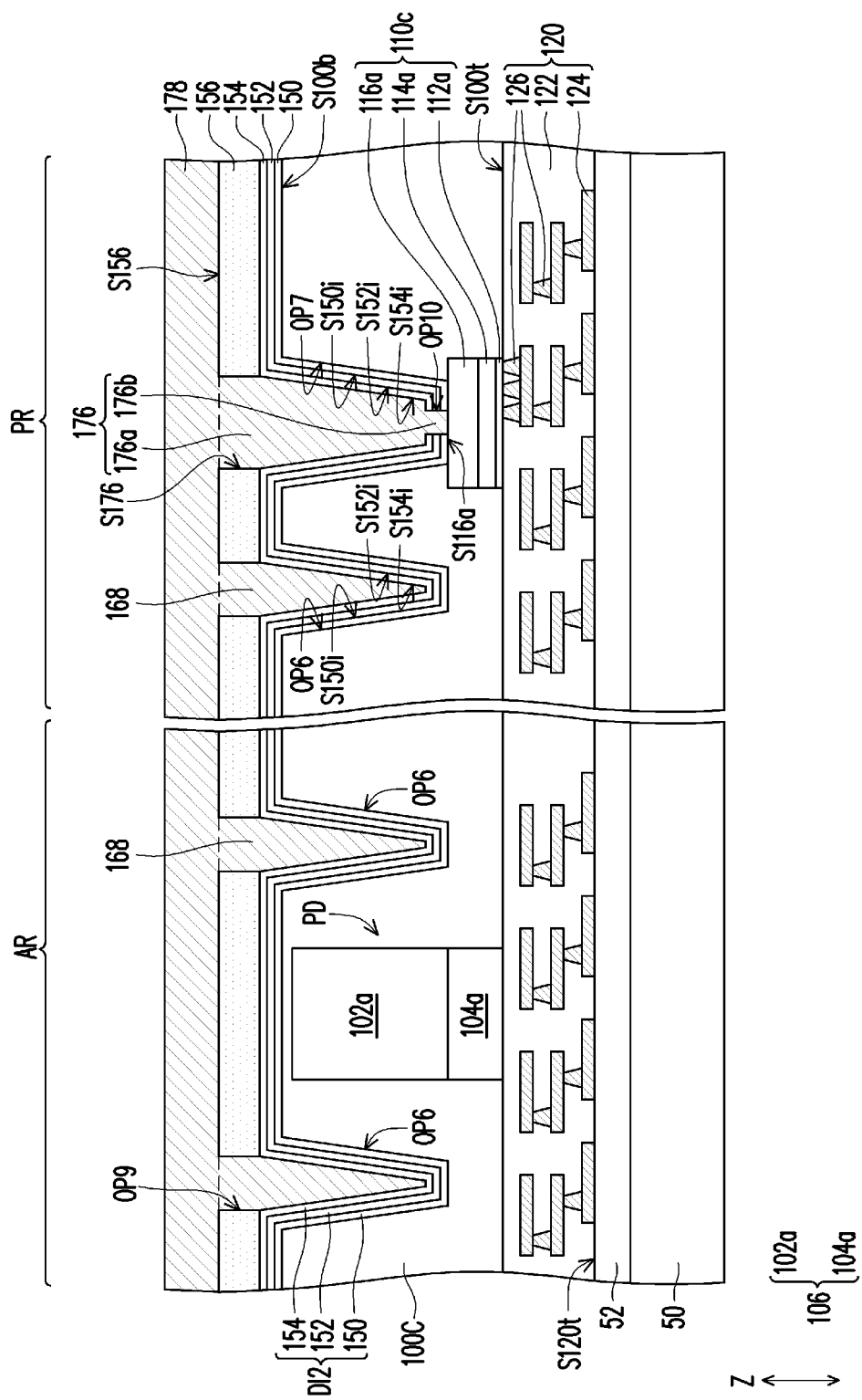
Figure 72A:
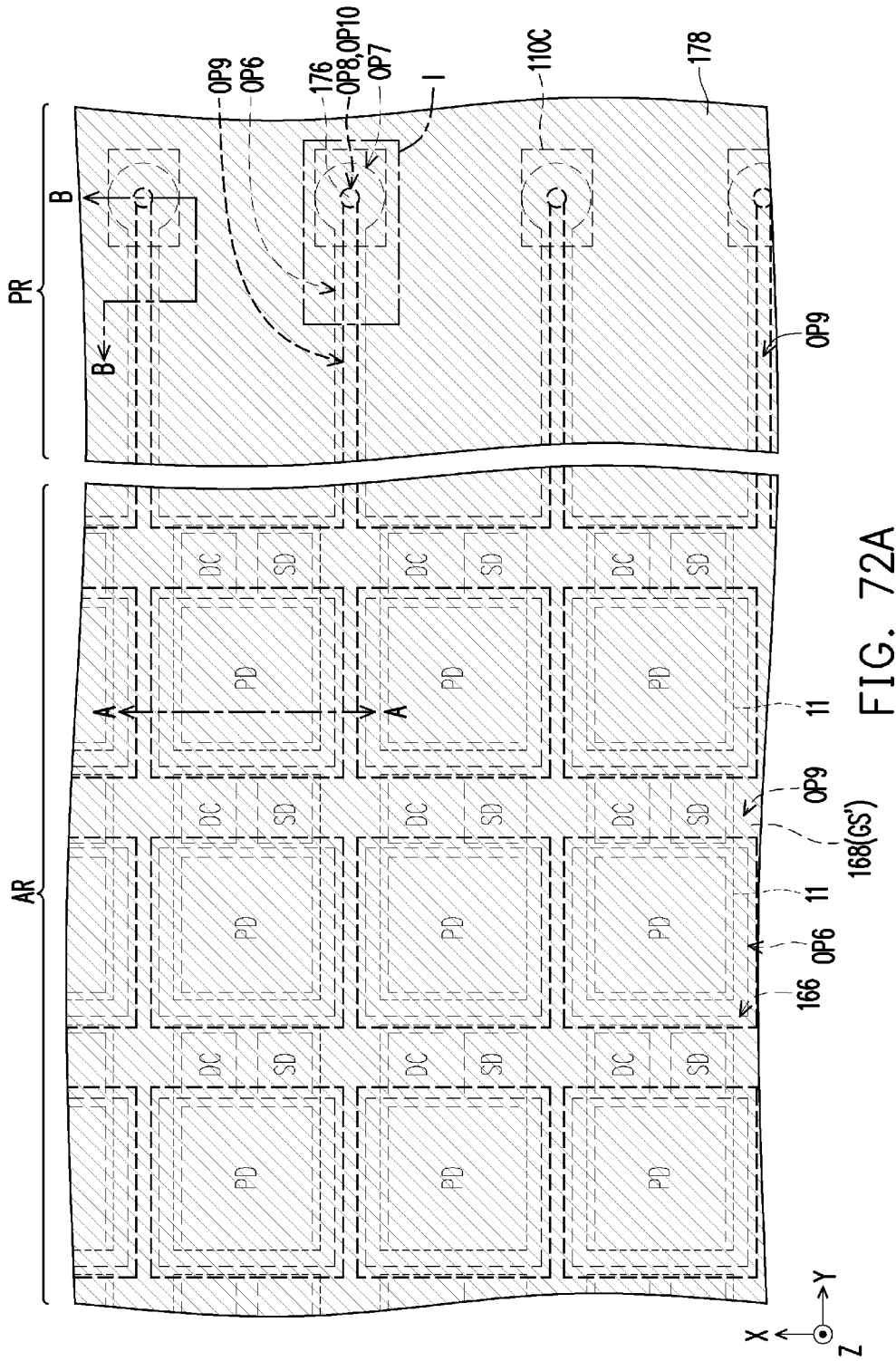
Figure 72B:
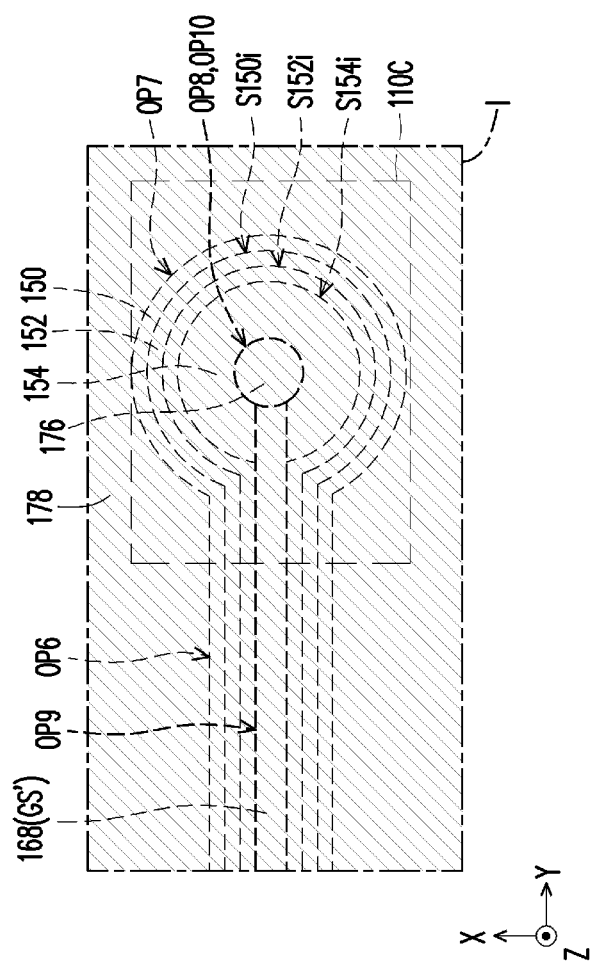

Referring to FIG. 71, FIG. 72A and FIG. 72B, in some embodiments, a conductive feature including a plurality of conductive features 168, a conductive feature 178 and a plurality of conductive features 176 is formed on the dielectric layer 156. In some embodiments, the conductive features 168 are electrically connected to the conductive features 176 through conductive feature 178, where the conductive features 168, 176 and 178 are formed integrally.

In some embodiments, the conductive features 168 are formed in the trenches OP6 and OP9. For example, the conductive features 168 fill the trenches OP6 and the trenches OP9. For example, as shown in FIG. 71, top surfaces (not labeled) of the conductive features 168 are considered as surfaces being substantially coplanar to a top surface S156 of the dielectric layer 156. The conductive features 168 may together to be referred to as a conductive grid 168. For example, the conductive grid 168 in the trenches OP6 and OP9 and the dielectric layers 150, 152, and 154 (serving as the dielectric liners) in the trenches OP6 are referred to as an isolation structure GS' of a grid mesh form, in the disclosure. In some embodiments, a portion of the dielectric layer 150, a portion of the dielectric layer 152 and a portion of the dielectric layer 154 located within the trenches OP6 are together referred to as a dielectric structure DI2 of the isolation structure GS'. One advantageous feature of having such isolation structure GS' is that, a bias (e.g. a negative bias Nb in FIG. 75) is applied to the conductive grid 168, which would generate hole accumulations along sidewalls of the isolation structure GS' and prevent electrons from being trapped near the isolation structure GS' so as to reduce leakage current as well as cross talk between neighboring pixels 11 in the image sensor 10. And thus, the performance of the image sensor 10 is improved. As shown in FIG. 71, FIG. 72A and FIG. 72B, the isolation structure GS' within the active region AR covers the driving circuits DC and storage devices SD of the pixels 11 and aside of the photosensitive device PD positioned in the regions 166. The regions 166 may be referred to as openings 166 of the isolation structure GS' surrounding and exposing the photosensitive device PD. In the alternative embodiment of which the trenches OP6 are FDT, the isolation structure GS' within the active region AR aside of the driving circuits DC, the storage devices SD and the photosensitive device PD.

In some embodiments, the conductive features 176 are formed in the openings OP10, the openings OP7 and openings OP8 to be in contact with the surface S116a of the doped isolation structure 110C, so that the conductive features 176 are electrically connected to the interconnect 120 through the doped isolation structure 110C. For example, the conductive features 176 fill the openings OP10, the openings OP7 and openings OP8. For example, as shown in FIG. 71, top surfaces (not labeled) of the conductive features 176 are considered as surfaces being substantially coplanar to the top surface S156 of the dielectric layer 156. In some embodiments, the conductive features 176 each includes a first portion 176a in the openings OP8 and OP7 and a second portion 176b in the opening OP10. For example, as shown in FIG. 71, the conductive features 176 are electrically connected to the interconnect 120 by physically and electrically connecting the second portions 176b with the doped isolation structures 110C being electrically connected to the interconnect 120, and the conductive features 176 are electrically connected to the conductive feature 178 by physically and electrically connecting the first portions 176a and the conductive feature 178. The conductive features 176 may be referred to as conductive structures 176, where each first portion 176a may be referred to as a conductive body and each second portion 176b may be referred to a conductive via of the conductive body. As shown in FIG. 71, the conductive structures 176 each have a step-form contour (or profile), where the sidewalls S176 of the conductive structure 176 in the cross-sectional view each are a curved line (e.g. not a straight line, with bends), for example. Alternatively, the conductive structures 176 may have a non-stepform contour (or profile), where the sidewalls S176 of the conductive structure 176 in the cross-sectional view each are a straight line (e.g. without bends).

In some embodiments, the conductive feature 178 is formed on the top surface S156 of the dielectric layer 156 to be in contact with the conductive grid 168 and the conductive structures 176, so that the conductive feature 178 is electrically connected to the conductive grid 168 and the conductive structures 176. In other words, the conductive feature 178 is a continuous conductive layer on the dielectric layer 156 extending between the conductive grid 168 and the conductive structures 176 to provide a proper electrical connection therebetween. For example, a bottom surface (not labeled) of the conductive feature 178 is considered as a surface being substantially coplanar to the top surface S156 of the dielectric layer 156. The conductive feature 178 may be referred to as a conductive pattern 178.

The formation of the conductive feature including the conductive features 168, 176 and 178 may be formed by, but not limited to, forming a conductive material layer (not shown) over the semiconductor substrate 100C along the bottom surface S100b to cover the structure depicted in FIG. 69 and FIG. 70A, where the conductive material layer extends into the trenches OP6 and OP9 and the openings OP7, OP8 and OP10 to simultaneously form the conductive features 168, the conductive features 176 and the conductive feature 178. The conductive material layer may be the same as or similar to the material of the conductive material 160m as described in FIG. 9 and FIG. 10, and thus is not repeated herein for brevity. For an example, the conductive material layer is made of Al. As shown in FIG. 71, the conductive grid 168 is electrically connected to the interconnect 120 through the conductive structures 176 and the conductive pattern 178, for example. In some embodiments, the formation of the conductive feature including the conductive features 168, 176 and 178 may further include a planarization process, such as a CMP process, such that the conductive feature 178 is formed to have a substantially planar top surface. After planarizing, a cleaning process may be optionally performed, for example to clean and remove the residue generated from the planarizing process. However, the disclosure is not limited thereto, and the planarizing process may be performed through any other suitable method.

In the disclosure, although the conductive feature including the conductive features 168, 176 and 178 is formed as a non-conformal layer as shown in FIG. 71, the conductive feature including the conductive features 168, 176 and 178 may be formed in a form of conformal layer, as long as the electrical connection between the doped isolation structures 110C and the conductive feature including the conductive features 168, 176 and 178 is properly established. The disclosure is not limited thereto.

Figure 73:
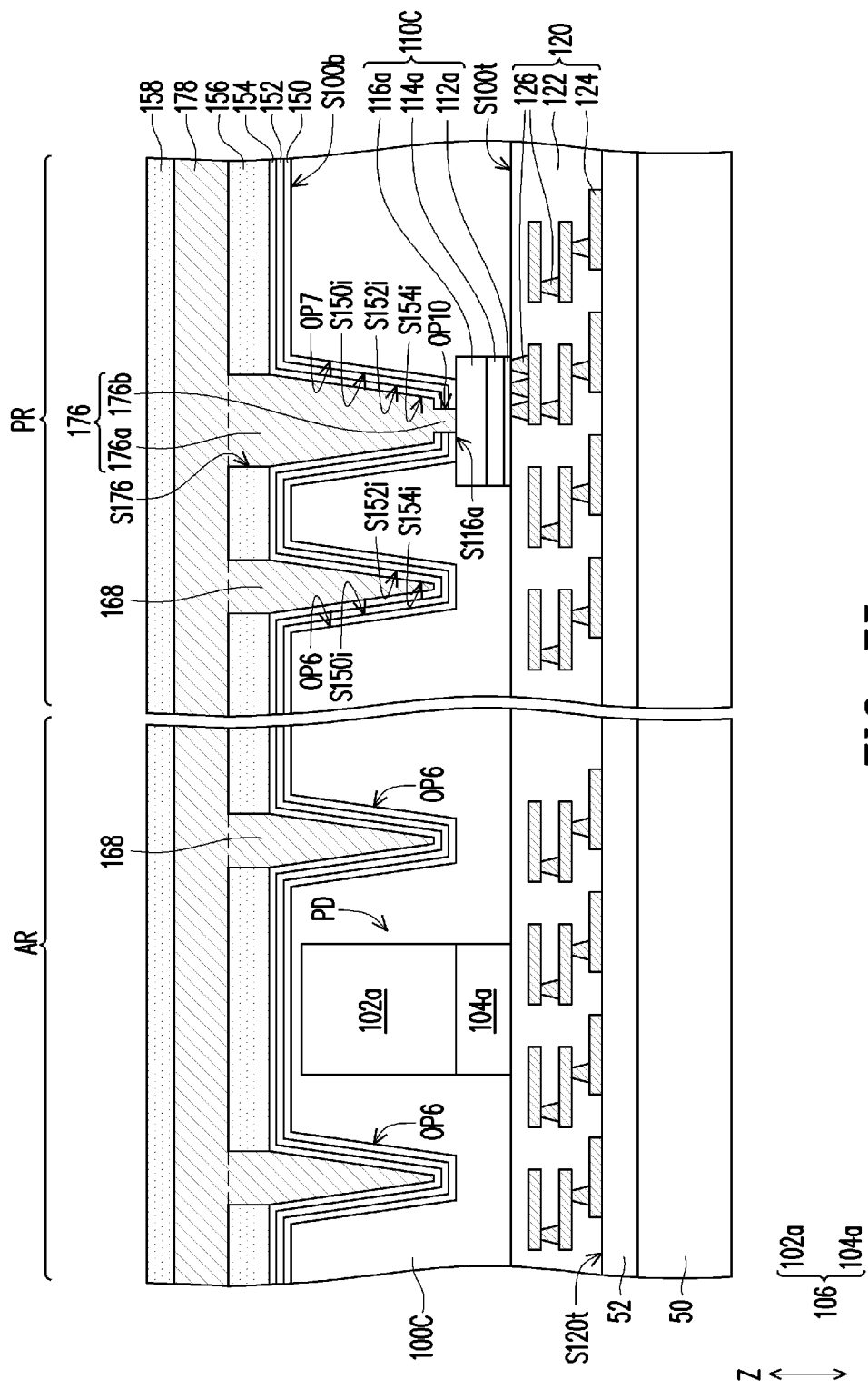
Figure 74:
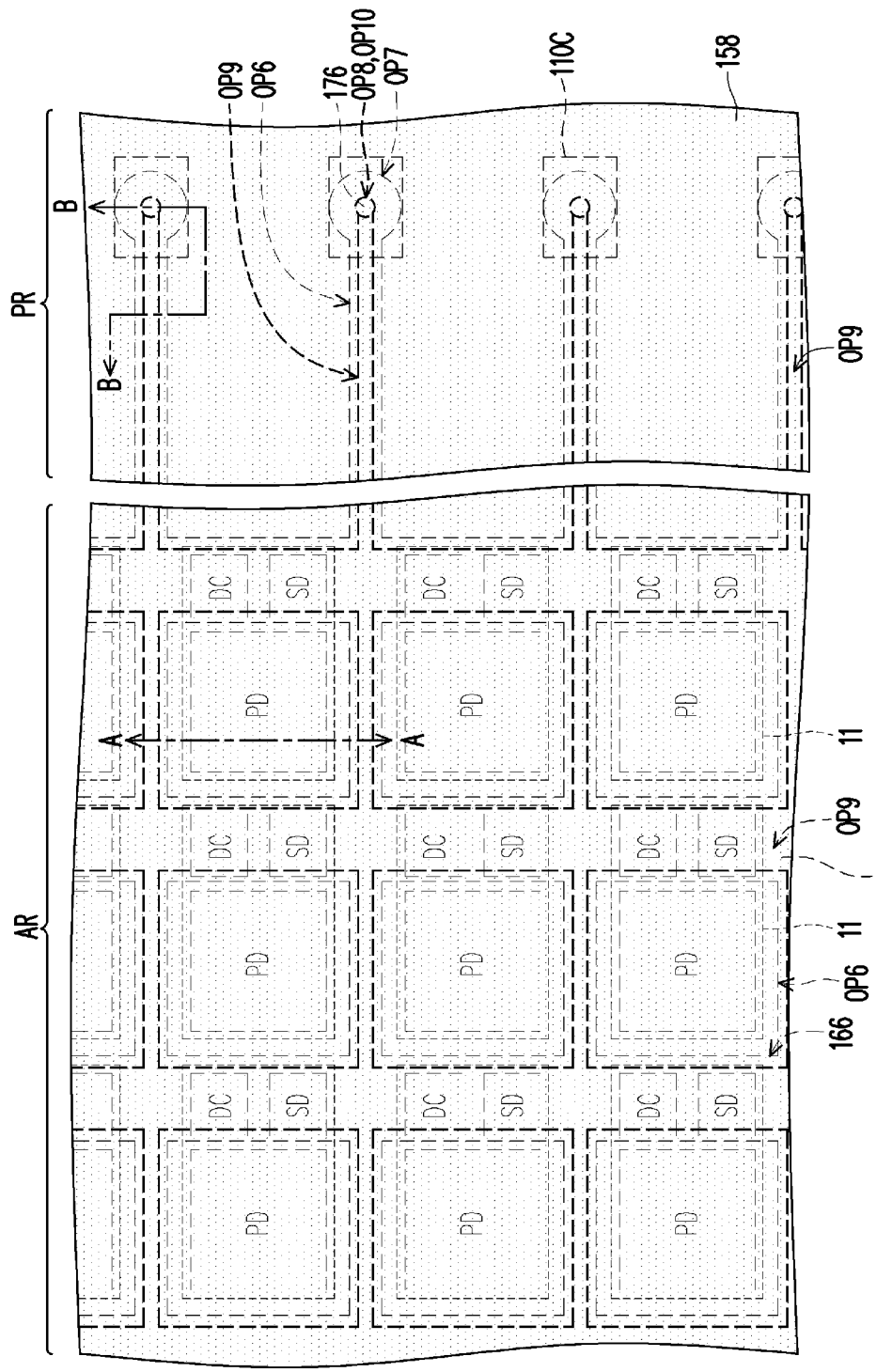

Referring to FIG. 73 and FIG. 74, in some embodiments, a dielectric layer 158 is formed on the structure depicted in FIG. 71 and FIG. 72A to cover the conductive pattern 178. The dielectric layer 158 may referred to as a passivation layer having a high degree of planarity and flatness, which is beneficial for the later-formed layers/elements (e.g. color filters, micro lenses, and/or the like). The detail of the dielectric layer 158 has been described in FIG. 21 and FIG. 22, and thus are not repeated herein for simplicity. Referring to FIG. 75, in some embodiments, a light filter layer 180 (including a plurality of color filters 182, 184 and 186) and micro-lenses 190 are disposed on the dielectric layer 158 and over the isolation structure GS' within the active region AR. The detail of the light filter layer 180 and the micro-lenses 190 have been described in FIG. 23, and thus are not repeated herein for simplicity. In some embodiments, the previously described manufacturing process as described in FIG. 24 above can be performed to obtain a (semiconductor) image sensor device 5000a depicted in FIG. 75. With the isolation structure GS', a better isolation for the photosensitive devices PD is provided, and thus improving the performance of the image sensor 10. In addition, an overall thickness (in direction Z) of the image sensor device 5000a is further reduced.

In some alternative embodiments, the conductive pattern 178 may be omitted, see a (semiconductor) image sensor device 5000b of FIG. 76. Owing to the trenches OP6, OP9 and the openings OP7, OP8 are spatially communicated to each other, the conductive grid 168 and the conductive structures 176 are connected in electrical connection and physical connection. With such configuration, without reducing the isolation ability of the isolation structure GS', an overall thickness of the image sensor device (e.g. 5000b) is further reduced.

In the cross-section views of the above embodiments, although the trenches OP1 and/or the openings OP2, OP3, OP4, OP5, OP8, OP10 are shown to have vertical and planar sidewalls, the trenches OP1 and/or the openings OP2, OP3, OP4, OP5, OP8, OP10 independently can have slant and planar sidewalls. On the other hand, in the cross-section views of the above embodiments, although the trenches OP6, OP9 and/or the openings OP7 are shown to have slant and planar sidewalls, the trenches OP6, OP9 and/or the openings OP7 independently can have vertical and planar sidewalls. The disclosure is not limited thereto.

Figure 77:
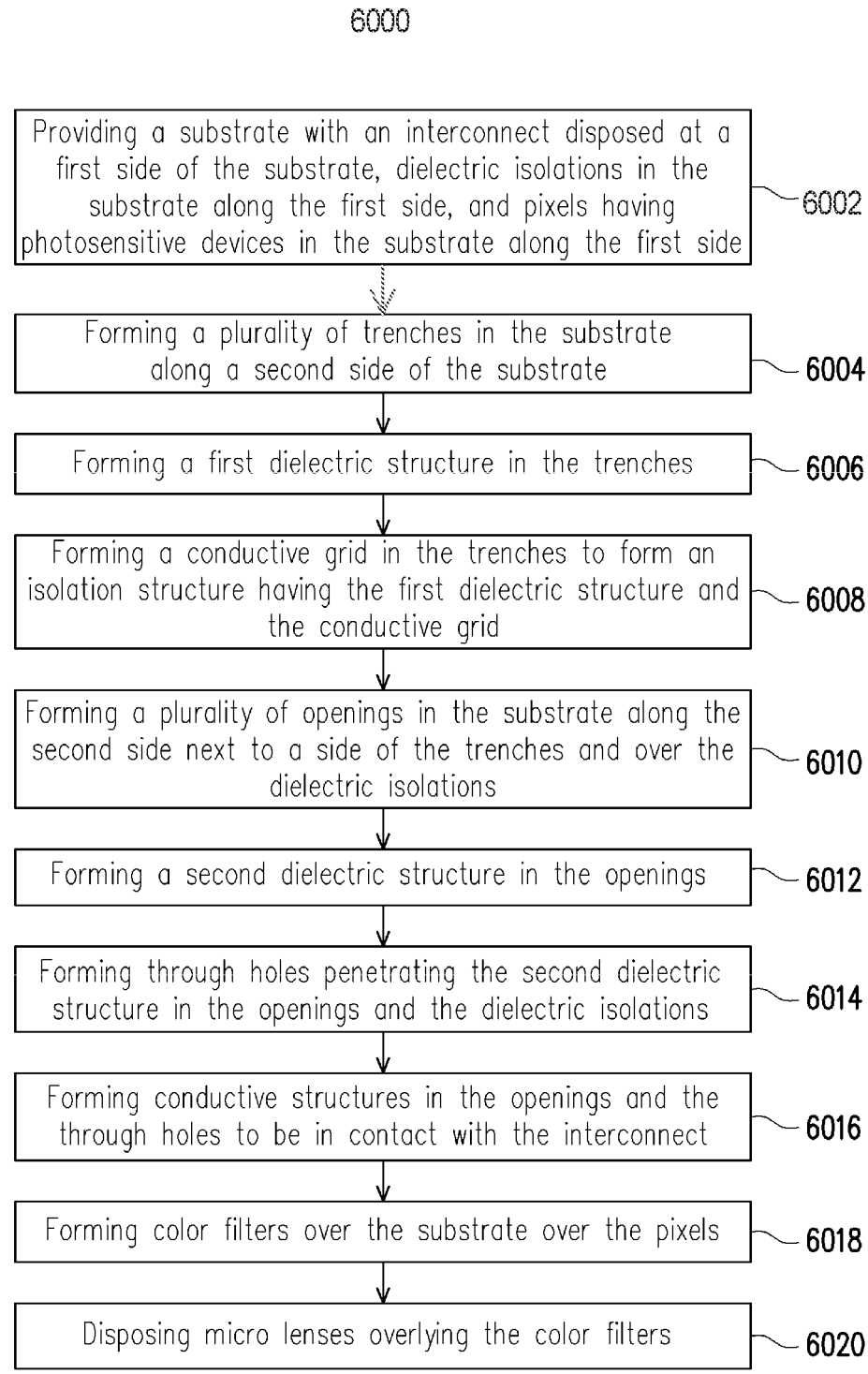
FIG. 77 through FIG. 79 provide flow charts illustrating various manufacturing methods of an image sensor, in a (semiconductor) image sensor die in accordance with some embodiments of the disclosure.

FIG. 77 presents a flow chart for a method 6000 which may be used to form an image sensor included in a semiconductor image sensor device according to the disclosure. The method 6000 begins with act 6002, providing a substrate with an interconnect disposed at a first side of the substrate, dielectric isolations in the substrate along the first side, and pixels having photosensitive devices in the substrate along the first side. The cross-sectional view of FIG. 6 provides an example.

Act 6004 is forming a plurality of trenches in the substrate along a second side of the substrate. The cross-sectional view of FIG. 7 provides an example.

Act 6006 is forming a first dielectric structure in the trenches. The cross-sectional view of FIG. 9 provides an example.

Act 6008 is forming a conductive grid in the trenches to form an isolation structure having the first dielectric structure and the conductive grid. The cross-sectional view of FIG. 11 provides an example.

Act 6010 is forming a plurality of openings in the substrate along the second side next to a side of the trenches and over the dielectric isolations. The cross-sectional view of FIG. 13 provides an example.

Act 6012 is forming a second dielectric structure in the openings. The cross-sectional view of FIG. 15 and the cross-sectional view of FIG. 29 provide various examples.

Act 6014 is forming through holes penetrating the second dielectric structure in the openings and the dielectric isolations. The cross-sectional view of FIG. 17 and the cross-sectional view of FIG. 31 provide various examples.

Act 6016 is forming conductive structures in the openings and the through holes to be in contact with the interconnect. The cross-sectional view of FIG. 19 and the cross-sectional view of FIG. 33 provide various examples.

Act 6018 is forming color filters over the substrate over the pixels. The cross-sectional view of FIG. 23 and the cross-sectional view of FIG. 38 provide various examples.

Act 6020 is disposing micro lenses overlying the color filters. The cross-sectional view of FIG. 23 and the cross-sectional view of FIG. 38 provide various examples.

Figure 78:
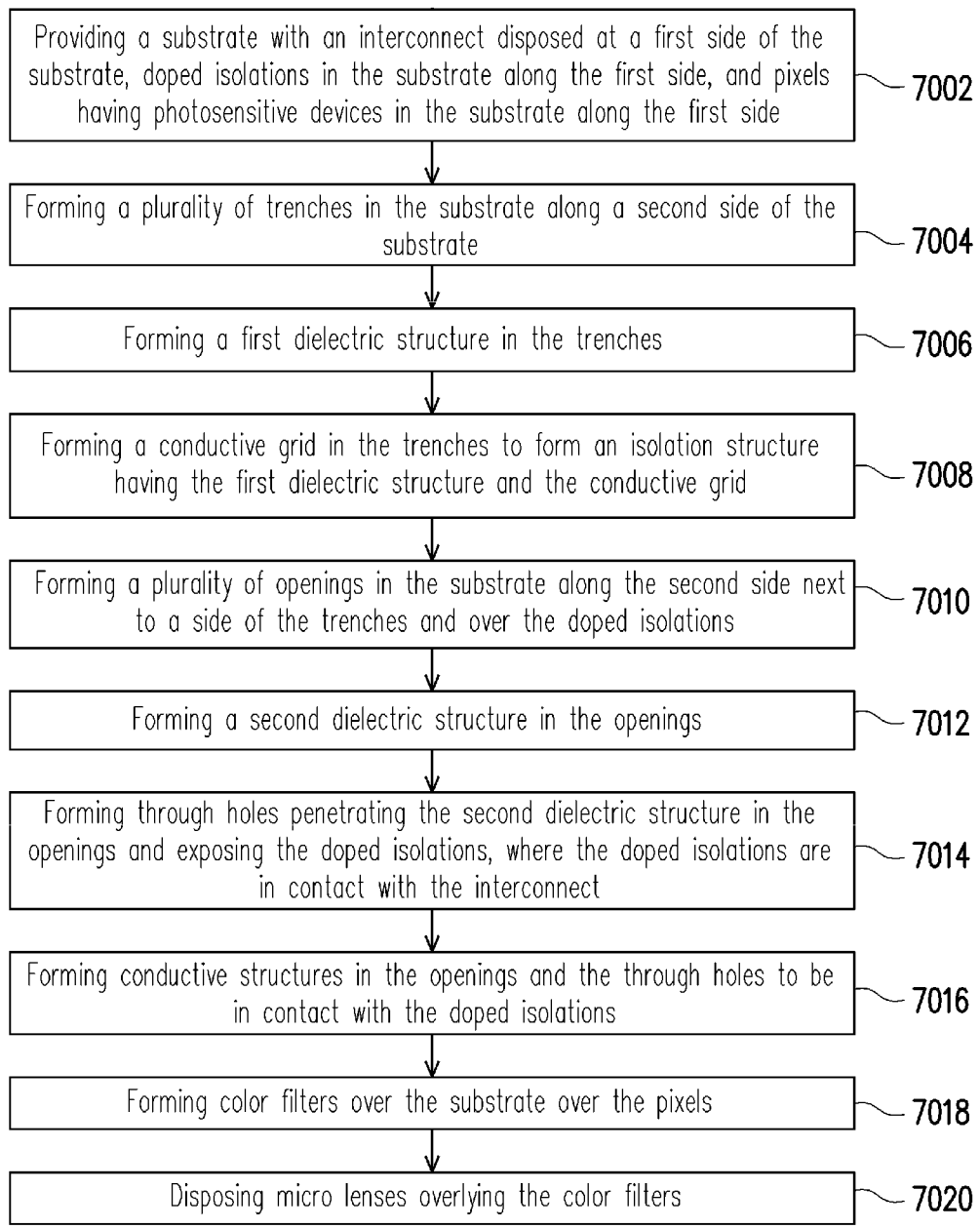

FIG. 78 presents a flow chart for a method 7000 which may be used to form an image sensor included in a semiconductor image sensor device according to the disclosure. The method 7000 begins with act 7002, providing a substrate with an interconnect disposed at a first side of the substrate, doped isolations in the substrate along the first side, and pixels having photosensitive devices in the substrate along the first side. The cross-sectional view of FIG. 43 provides an example.

Act 7004 is forming a plurality of trenches in the substrate along a second side of the substrate. The cross-sectional view of FIG. 45 provides an example.

Act 7006 is forming a first dielectric structure in the trenches. The cross-sectional view of FIG. 45 provides an example.

Act 7008 is forming a conductive grid in the trenches to form an isolation structure having the first dielectric structure and the conductive grid. The cross-sectional view of FIG. 45 provides an example.

Act 7010 is forming a plurality of openings in the substrate along the second side next to a side of the trenches and over the doped isolations. The cross-sectional view of FIG. 47 provides an example.

Act 7012 is forming a second dielectric structure in the openings. The cross-sectional view of FIG. 49 provides an example.

Act 7014 is forming through holes penetrating the second dielectric structure in the openings and exposing the doped isolations, where the doped isolations are in contact with the interconnect. The cross-sectional view of FIG. 49 provides an example.

Act 7016 is forming conductive structures in the openings and the through holes to be in contact with the doped isolations. The cross-sectional view of FIG. 49 provides an example.

Act 7018 is forming color filters over the substrate over the pixels. The cross-sectional view of FIG. 49 provides an example.

Act 7020 is disposing micro lenses overlying the color filters. The cross-sectional view of FIG. 49 provides an example.

Figure 79:
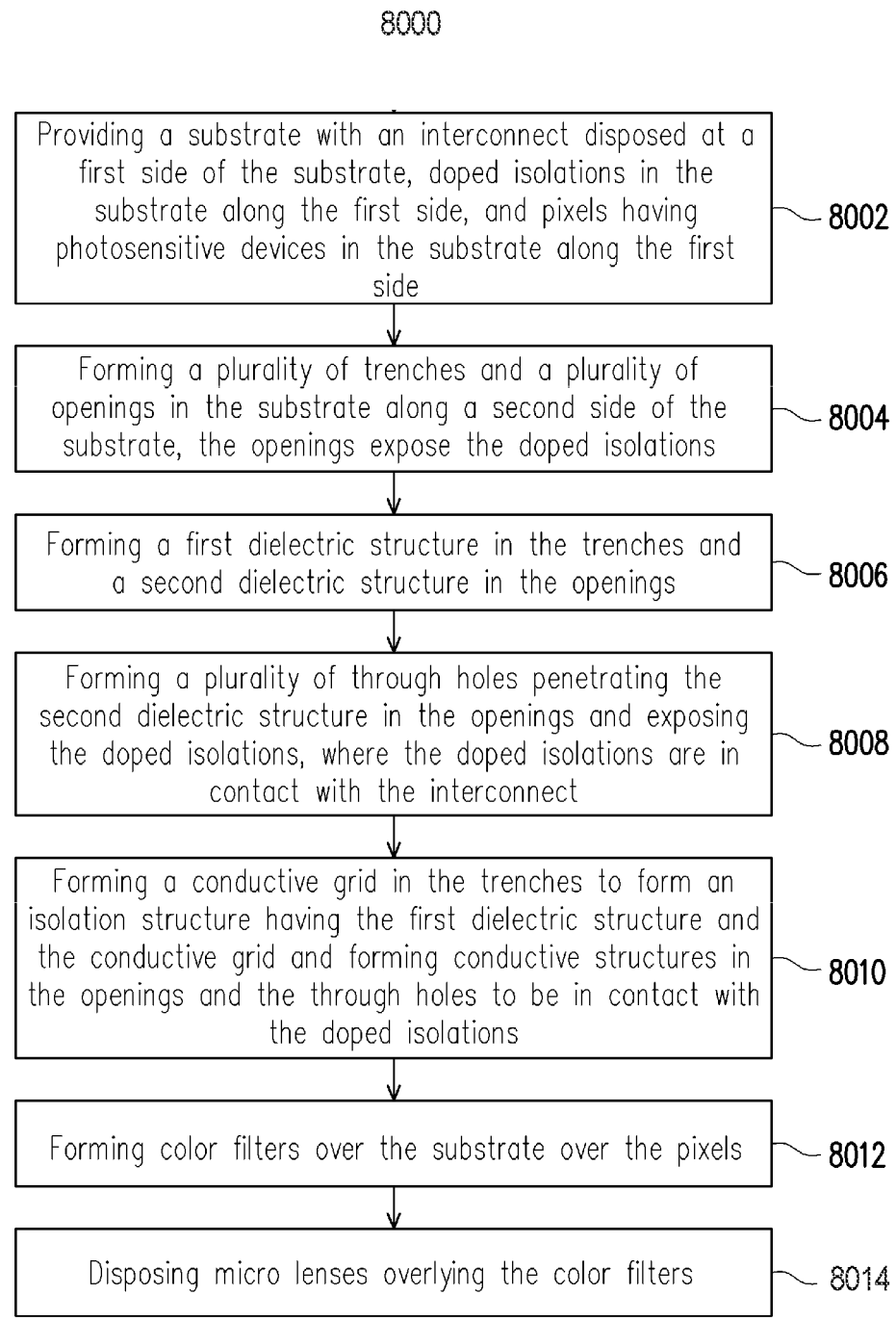

FIG. 79 presents a flow chart for a method 8000 which may be used to form an image sensor included in a semiconductor image sensor device according to the disclosure. The method 8000 begins with act 8002, providing a substrate with an interconnect disposed at a first side of the substrate, doped isolations in the substrate along the first side, and pixels having photosensitive devices in the substrate along the first side. The cross-sectional view of FIG. 63 provides an example.

Act 8004 is forming a plurality of trenches and a plurality of openings in the substrate along a second side of the substrate, the openings expose the doped isolations. The cross-sectional view of FIG. 65 provides an example.

Act 8006 is forming a first dielectric structure in the trenches and a second dielectric structure in the openings. The cross-sectional view of FIG. 67 provides an example.

Act 8008 is forming a plurality of through holes penetrating the second dielectric structure in the openings and exposing the doped isolations, where the doped isolations are in contact with the interconnect. The cross-sectional view of FIG. 69 provides an example.

Act 8010 is forming a conductive grid in the trenches to form an isolation structure having the first dielectric structure and the conductive grid and forming conductive structures in the openings and the through holes to be in contact with the doped isolations. The cross-sectional view of FIG. 71 provides an example.

Act 8012 is forming color filters over the substrate over the pixels. The cross-sectional view of FIG. 75 provides an example.

Act 8014 is disposing micro lenses overlying the color filters. The cross-sectional view of FIG. 75 provides an example.

While the methods 6000, 7000, and 8000 of FIG. 77 to FIG. 79 are illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In accordance with some embodiments, an image sensor includes a pixel and an isolation structure. The pixel includes a photosensitive region and a circuitry region next to the photosensitive region. The isolation structure is located over the pixel, where the isolation structure includes a conductive grid and a dielectric structure covering a sidewall of the conductive grid, and the isolation structure surrounds a peripheral region of the photosensitive region.

In accordance with some embodiments, a semiconductor device includes a substrate, an interconnect, a photodiode array, an isolation structure, and a plurality of conductive structures. The substrate has a first side and a second side opposite to the first side. The interconnect is located on the first side. The photodiode array is disposed in the substrate within an active region of the substrate and electrically connected to the interconnect. The isolation structure extends from the second side of the substrate to a position in the substrate within the active region, where the photodiode array is surrounded by and spaced apart from the isolation structure, and the isolation structure includes a conductive grid. The plurality of conductive structures are disposed in the substrate within a peripherical region of the substrate and electrically connected to the interconnect, where the conductive grid is electrically connected to the interconnect through the plurality of conductive structures and is electrically isolated from the photodiode array.

In accordance with some embodiments, a method of manufacturing an image sensor includes the following steps: forming a pixel in a substrate at a first side of the substrate, the pixel comprising a photosensitive region and a circuitry region next to the photosensitive region; recessing the substrate, at a second side of the substrate opposite to the first side, to form a grid mesh cavity over the circuitry region and surrounding the photosensitive region; disposing a first dielectric structure in the grid mesh cavity; forming a conductive grid on the first dielectric structure in grid mesh cavity to form an isolation structure comprising the first dielectric structure and the conductive grid; recessing the substrate, at the second side of the substrate, to form a plurality of openings next to a side of grid mesh cavity; disposing a second dielectric structure in the plurality of openings; forming a plurality of conductive structures on the second dielectric structure in the plurality of openings, wherein the plurality of conductive structures electrically connected to the conductive grid of the isolation structure, and the isolation structure is electrically isolated from the pixel.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. An image sensor, comprising:
   a substrate, having an active region and a peripheral region next to the active region;
   a pixel arranged in the active region and comprising a photosensitive region and a circuitry region next to the photosensitive region;
   an isolation structure disposed in the substrate at a first side of the substrate surrounding the photosensitive region, wherein the isolation structure comprises a conductive grid and a dielectric structure covering a sidewall of the conductive grid;
   a conductive structure disposed in the substrate within the peripheral region, wherein the conductive grid is electrically connected to the conductive structure; and
   an isolation disposed in the substrate under the conductive structure at a second side opposite to the first side of the substrate,
   wherein the conductive structure is in contact with the isolation and electrically connecting the conductive grid and a conductive component at the first side of the substrate through the isolations.

2. The image sensor of claim 1, wherein the isolation structure is overlapped with the circuitry region, and the isolation structure is electrically isolated from the pixel.

3. The image sensor of claim 1, wherein the dielectric structure further covers a bottom surface of the conductive grid.

4. The image sensor of claim 1, wherein a material of the conductive grid comprises a metal or a metal alloy.

5. The image sensor of claim 1, further comprising:
   an interconnect disposed along the second side of the substrate,
   wherein the conductive structure is disposed through the isolation and electrically connected to a metal line of the interconnect the as conductive component.

6. The image sensor of claim 5, wherein the conductive grid is separated from the substrate through the dielectric structure.

7. The image sensor of claim 5, wherein a material of the conductive grid and a material of the conductive structure are identical.

8. The image sensor of claim 5, wherein the isolation is a shallow trench isolation of dielectric material.

9. The image sensor of claim 1, further comprising:
   a conductive pattern, located on the substrate within the peripheral region, electrically connecting the conductive grid and the conductive structure, wherein the conductive pattern has a lateral surface covering a portion of a top surface of the conductive grid closer to the conductive structure and a top surface of the conductive structure.

10. The image sensor of claim 9, wherein a material of the conductive structure and a material of the conductive pattern are identical.

11. The image sensor of claim 10, wherein a material of the conductive grid and the material of the conductive structure are identical.

12. The image sensor of claim 1, wherein the isolation comprises a doped region spatially and electrically connecting the conductive structure and the conductive component.

13. The image sensor of claim 1,
   wherein the conductive grid is in a form of solid bulk; and
   wherein the conductive structure is in a form of a conformal layer with which a dielectric material is disposed between opposing sidewalls of the conductive structure.

14. A semiconductor device, comprising:
   a substrate having a first side and a second side opposite to the first side;
   an interconnect, located on the first side;
   a plurality of first isolations located in the substrate at the first side and electrically isolated from the interconnect;
   a photodiode array, disposed in the substrate within an active region of the substrate and electrically connected to the interconnect;
   an isolation structure, extending from the second side of the substrate to a position in the substrate within the active region, wherein the photodiode array is surrounded by and spaced apart from the isolation structure, and the isolation structure comprises a conductive grid; and
   a plurality of conductive structures, disposed in the substrate within a peripheral region of the substrate and electrically connected to the interconnect, wherein the conductive grid is electrically connected to the interconnect through the conductive structures and is electrically isolated from the photodiode array,
   wherein the conductive structures penetrate through the first isolations for electrically connecting to the interconnect.

15. The semiconductor device of claim 14, wherein a portion of the isolation structure is located between two adjacent photodiodes of the photodiode array in the substrate within the active region along a direction perpendicular to a stacking direction of the substrate and the interconnect.

16. The semiconductor device of claim 14, further comprising:
   a plurality of second isolations, located in the substrate at the first side and electrically connected to the interconnect, wherein the conductive structures are in contact with the second isolations for electrically connecting to the interconnect, wherein the second isolations comprise doped regions.

17. An image sensor, comprising:
   a pixel in a substrate, the pixel comprising a photosensitive region and a circuitry region next to the photosensitive region;
   a plurality of doped isolations disposed in the substrate at a first side and an interconnect disposed over the first side of the substrate;
   an isolation structure disposed at a second side of the substrate opposite to the first side, the isolation structure comprising a first dielectric structure and a conductive grid on the first dielectric structure filling in a grid mesh cavity over the circuitry region and surrounding the photosensitive region; and a plurality of conductive structures disposed next to the isolation structure in a plurality of openings at the second side of the substrate, wherein the conductive structures are electrically connected to the conductive grid of the isolation structure, and the isolation structure is electrically isolated from the pixel, wherein the conductive structures are in contact with the doped isolations for electrically connecting the interconnect and the conductive grid through the doped isolations.

18. The image sensor of claim 17, further comprising a second dielectric structure disposed in the plurality of openings under the plurality of conductive structures.

19. The image sensor of claim 17, wherein the plurality of conductive structures extends for electrically connecting the interconnect and the conductive grid.

20. The image sensor of claim 17, wherein the doped isolations comprise stacks of doping regions of the same doping type and different doping concentrations.

\* \* \* \* \*